(12) United States Patent  
Kaneko et al.

(10) Patent No.: US 7,521,309 B2  
(45) Date of Patent: Apr. 21, 2009

(54) METHOD OF MANUFACTURING SEMICONDUCTOR DEVICE

(75) Inventors: Akio Kaneko, Yokohama (JP); Motoyuki Sato, Tsukuba (JP); Katsuyuki Sekine, Yokohama (JP); Tomohiro Saito, Yokohama (JP); Kazuaki Nakajima, Tokyo (JP); Tomonori Aoyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/948,344

(22) Filed: Nov. 30, 2007

(65) Prior Publication Data

US 2008/0138969 A1    Jun. 12, 2008

(30) Foreign Application Priority Data

Dec. 1, 2006    (JP)    .............................. 2006-326091

(51) Int. Cl.  
H01L 21/336    (2006.01)

(52) U.S. Cl. ...................................... 438/199

(58) Field of Classification Search .................. 438/199  
See application file for complete search history.

(56) References Cited

U.S. PATENT DOCUMENTS

| 6,927,117 | B2 | | 8/2005 | Cabral, Jr. et al. | |
|---|---|---|---|---|---|
| 7,465,624 | B2 | * | 12/2008 | Nakajima et al. | ........... 438/233 |
| 2004/0113209 | A1 | * | 6/2004 | Izuha et al. | ................. 257/388 |
| 2005/0167767 | A1 | * | 8/2005 | Akasaka | ..................... 257/410 |
| 2005/0282325 | A1 | | 12/2005 | Belyansky et al. | |

FOREIGN PATENT DOCUMENTS

JP    2005-167251    6/2005

* cited by examiner

Primary Examiner—W. David Coleman  
(74) Attorney, Agent, or Firm—Finnegan, Henderson, Farabow, Garrett & Dunner, L.L.P.

(57) ABSTRACT

A method of manufacturing a semiconductor device having a MOSFET of a first conductivity type and a MOSFET of a second conductivity type different from the first conductivity type formed on a semiconductor substrate, the method has: forming a gate insulating film; forming a first gate electrode layer, and forming a second gate electrode layer; forming a first metal containing layer on said first gate electrode layer and said second gate electrode layer; forming a second metal containing layer for preventing diffusion of a metal on said first metal containing layer; forming a third metal containing layer on said second gate electrode layer from which said first metal containing layer and said second metal containing layer are selectively removed, the third metal containing layer having a thickness different from the thickness of said first metal containing layer in a case where the third metal containing layer contains the same metal or alloy as the metal or alloy contained in said first metal containing layer; and performing a thermal processing, thereby causing reaction between the metal contained in said first metal containing layer and said first gate electrode layer to convert said first gate electrode layer into an alloy and causing reaction between the metal contained in said third metal containing layer and said second gate electrode layer to convert said second gate electrode layer into an alloy, thereby forming gate electrodes of different compositions.

10 Claims, 60 Drawing Sheets

○ CMP

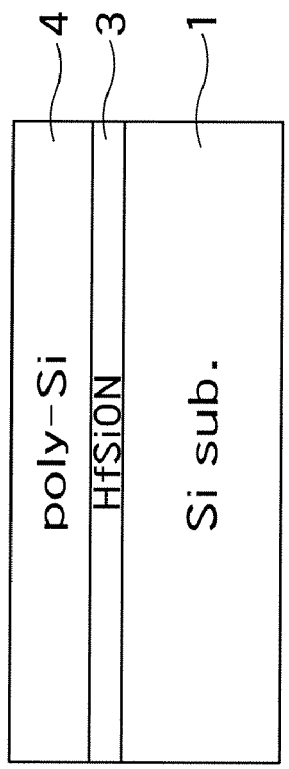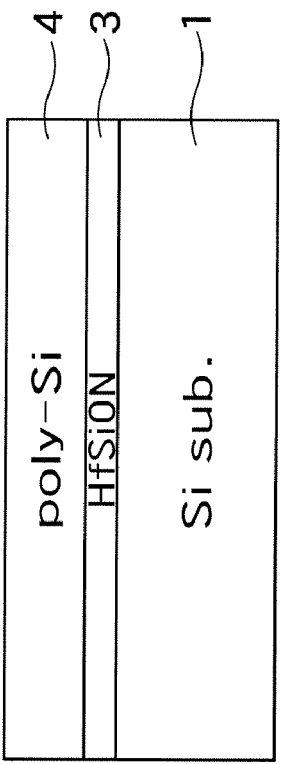
○ poly-Si/HfSiON DEPOSITION
FIG. 2A

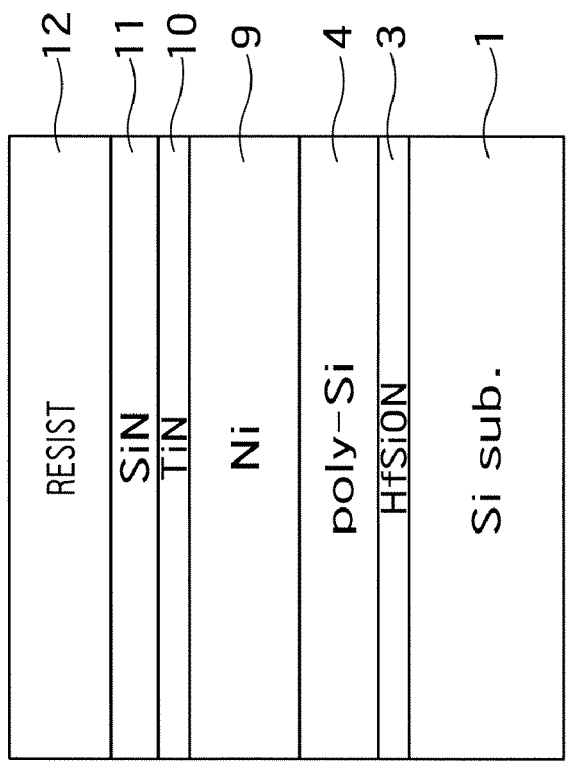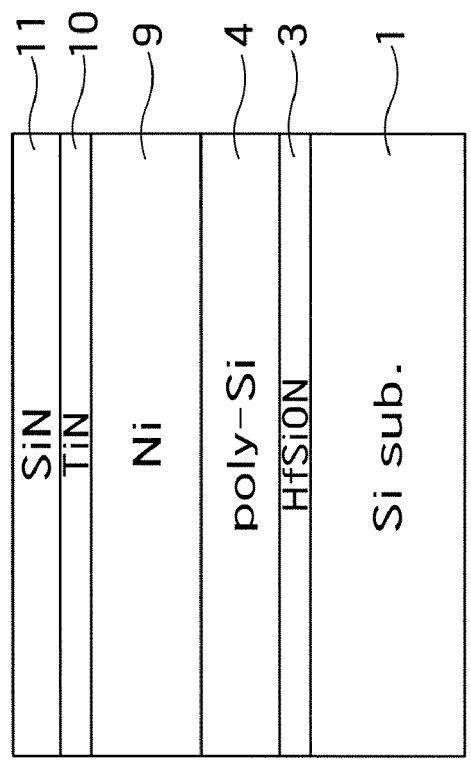
FIG. 2B
○ TiN/Ni SPUTTERING
○ SiN DEPOSITION
○ n-type MOS EXPOSURE ○ SiN RIE

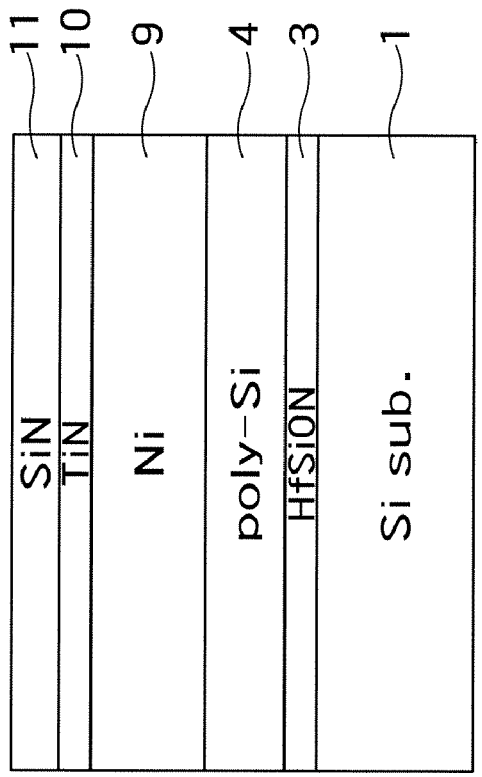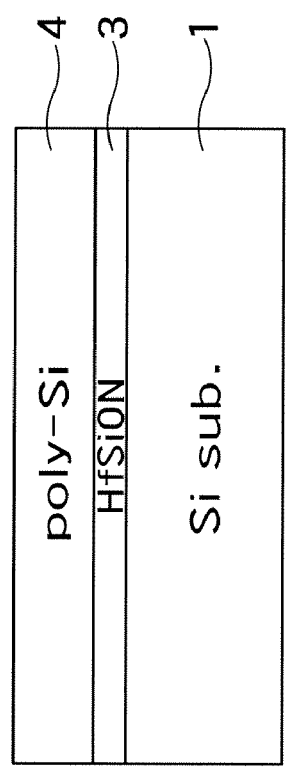
FIG. 2D

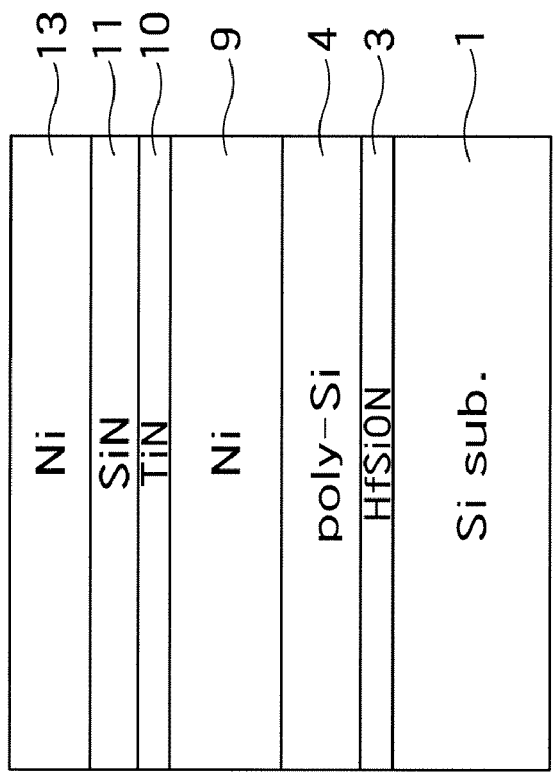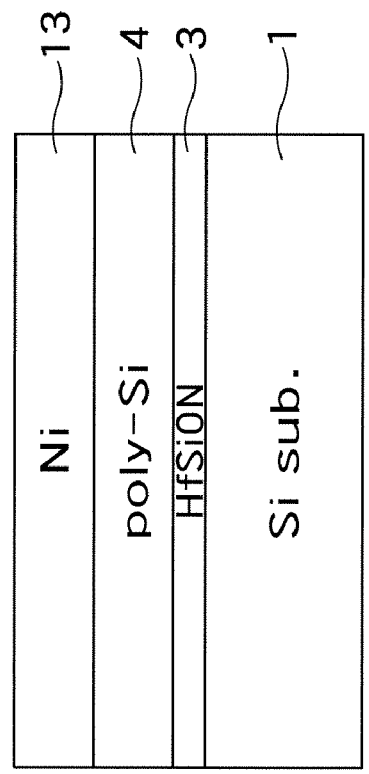
FIG. 2E

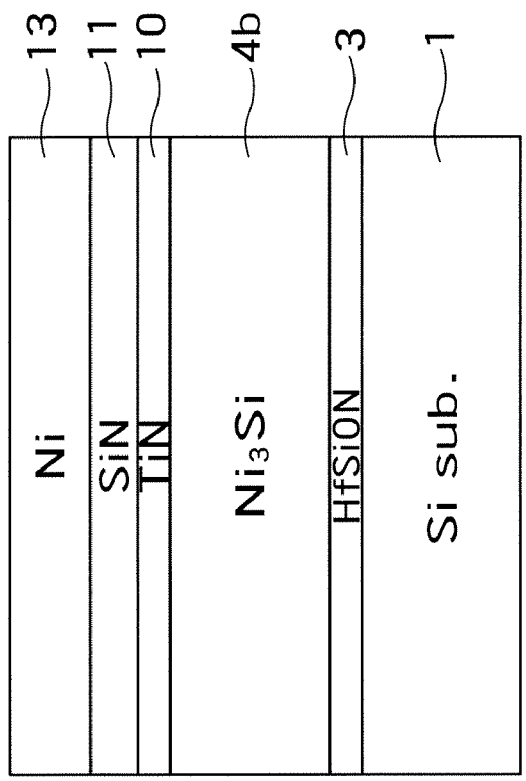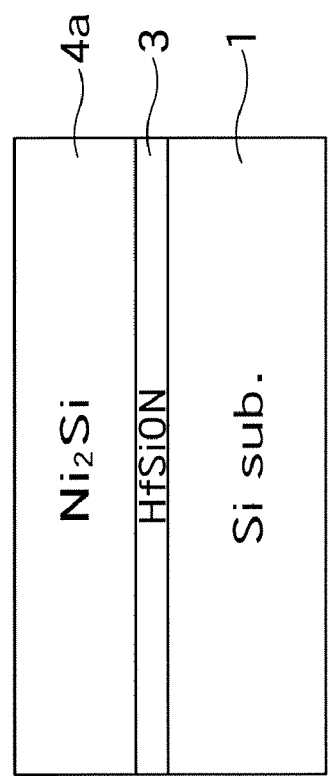
FIG. 2F

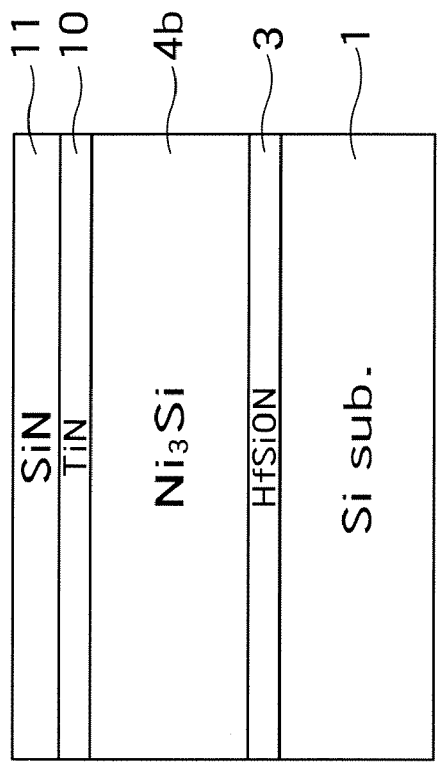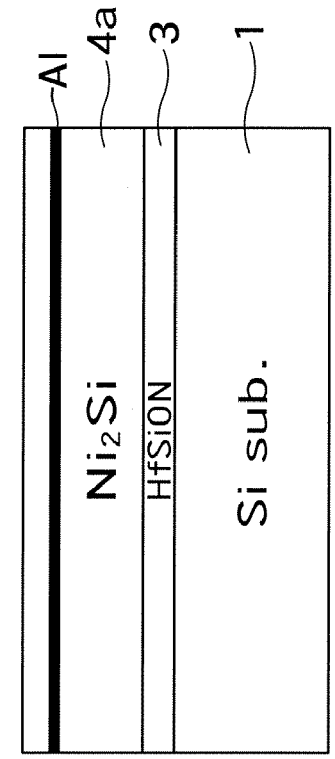
FIG. 2H

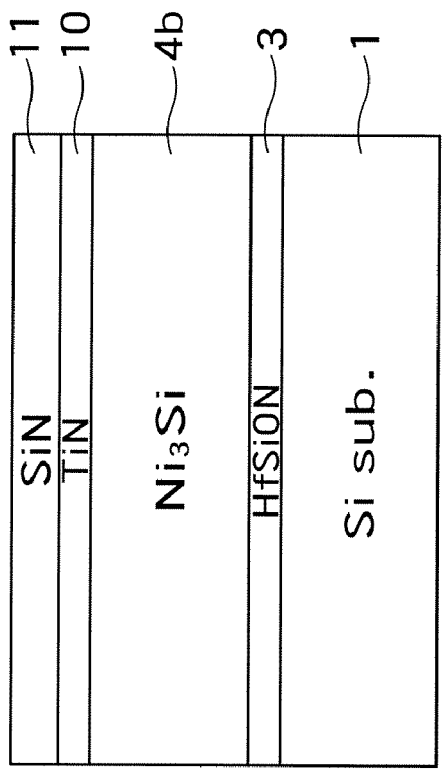
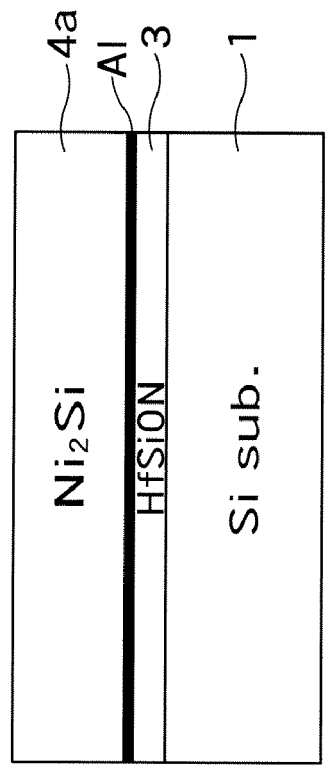
FIG. 21

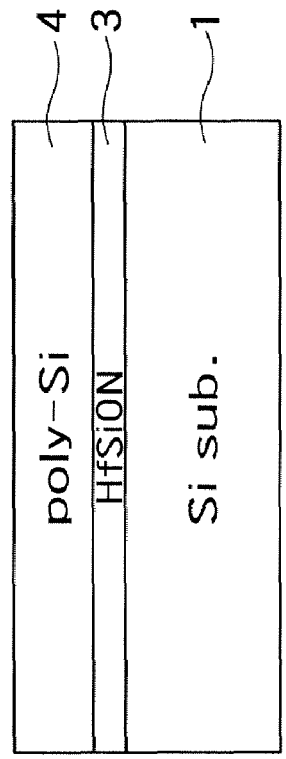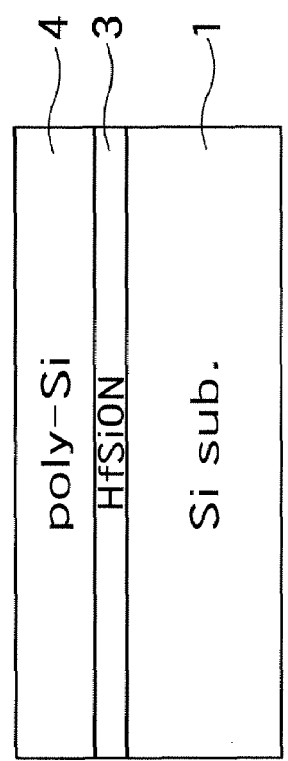
FIG. 4A
○ poly-Si/HfSiON DEPOSITION

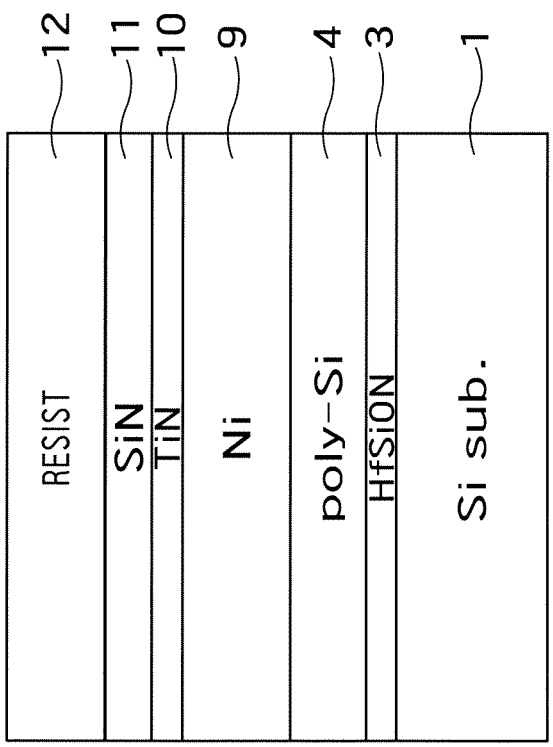
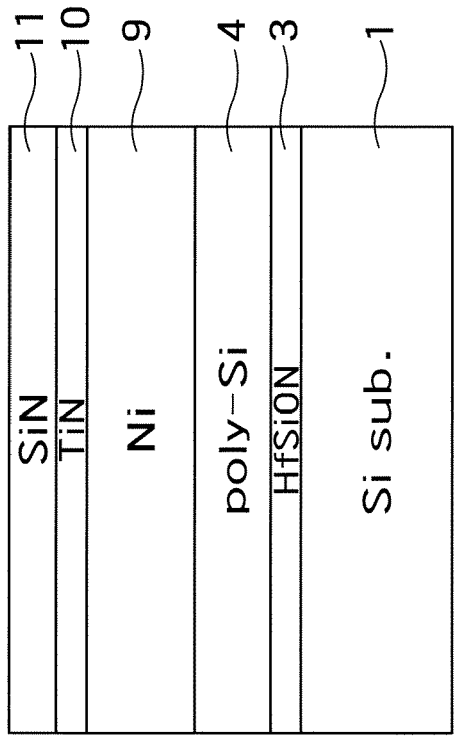
FIG. 4B

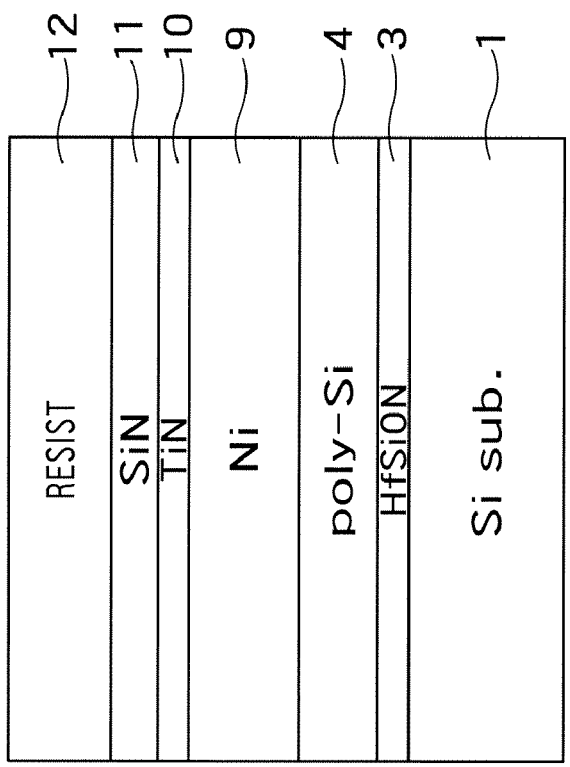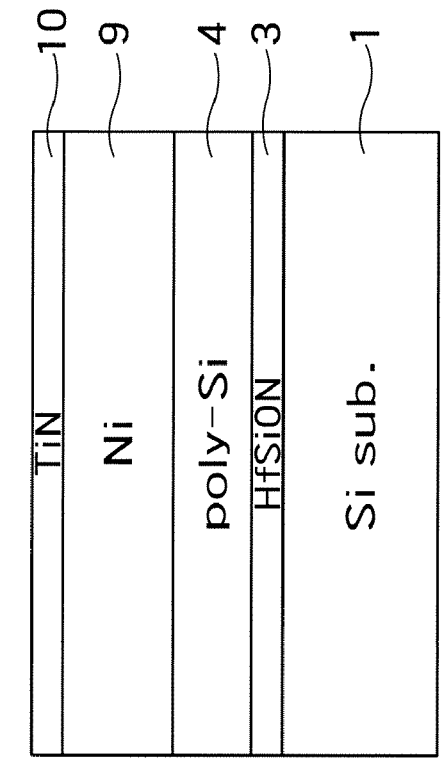
FIG. 4C
○ SiN RIE

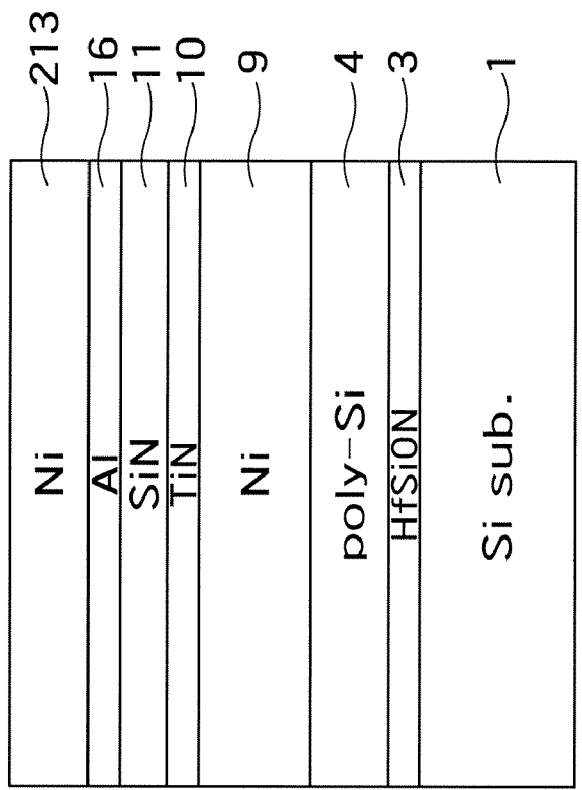
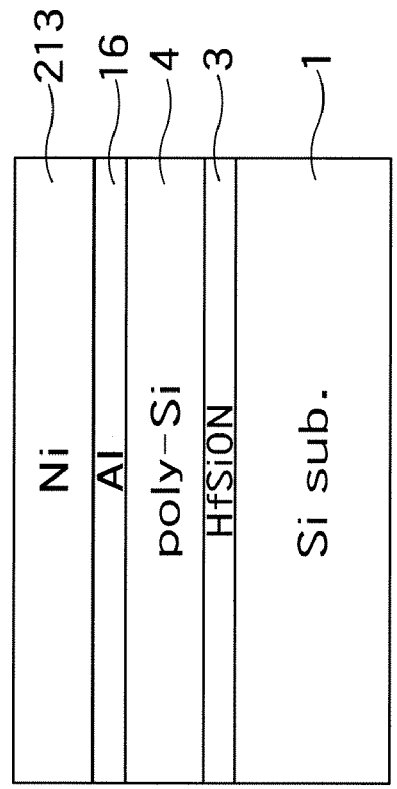
FIG. 4E
○ Ni/Al SPUTTERING

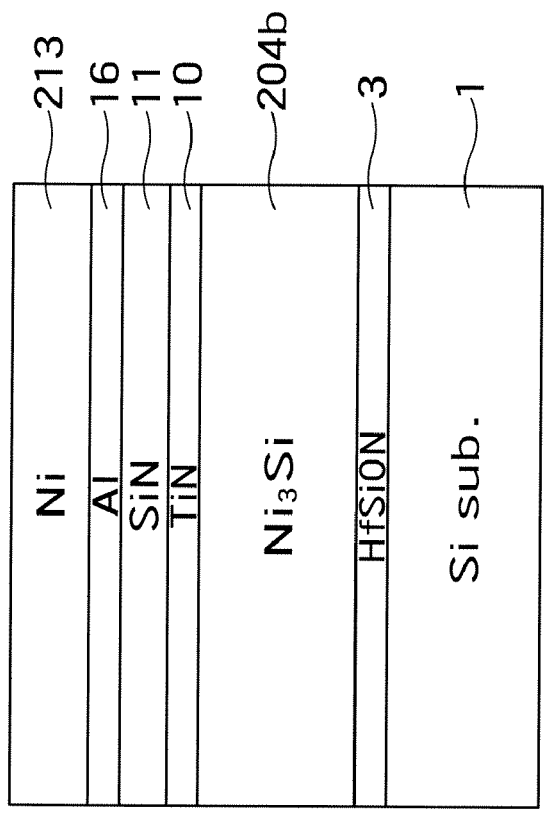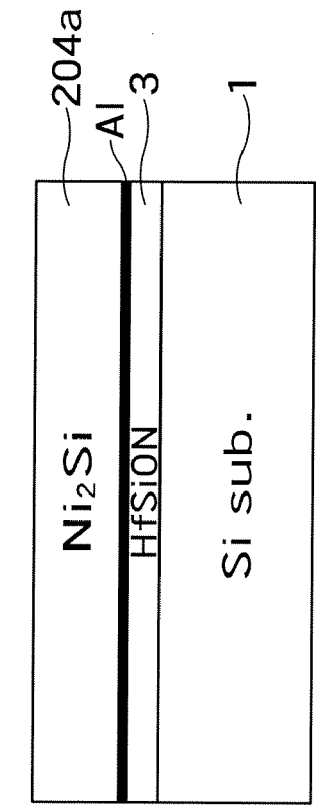
FIG. 4F

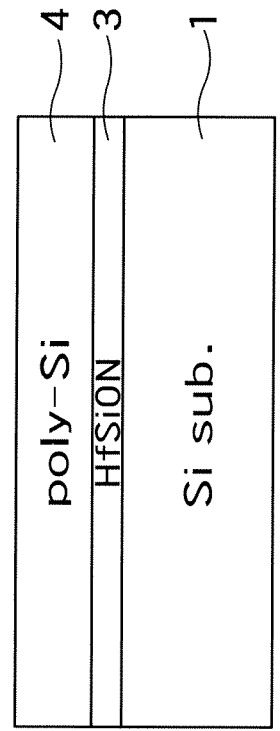
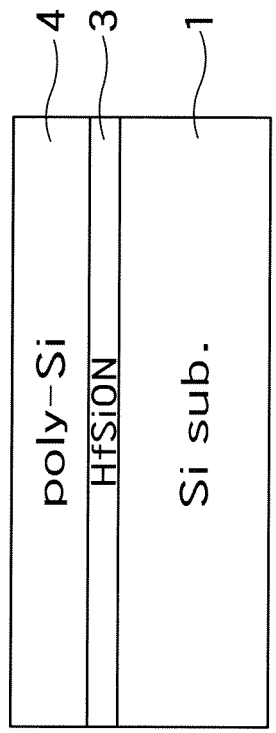
○ poly-Si/HfSiON DEPOSITION
FIG. 5A

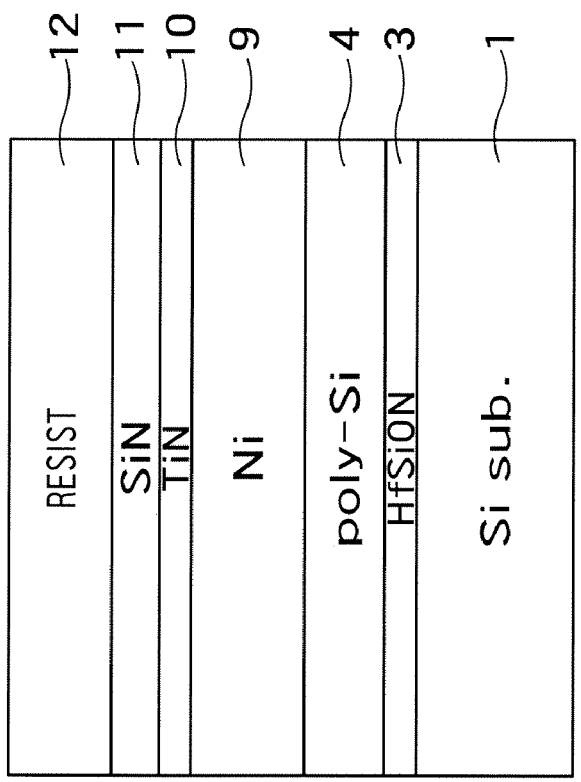
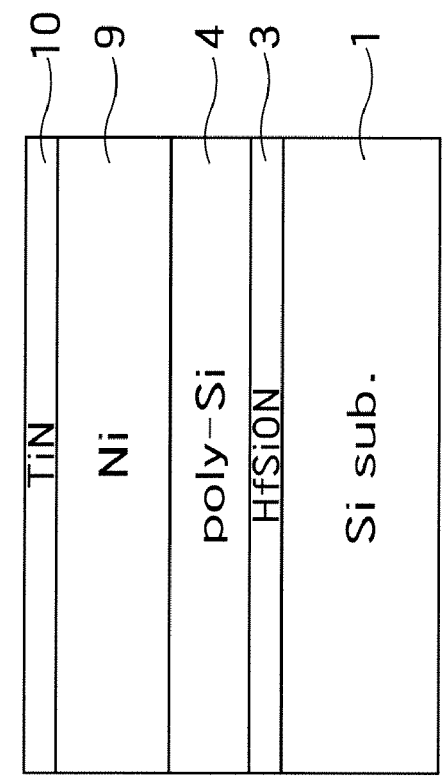
FIG. 5C
○ SiN RIE

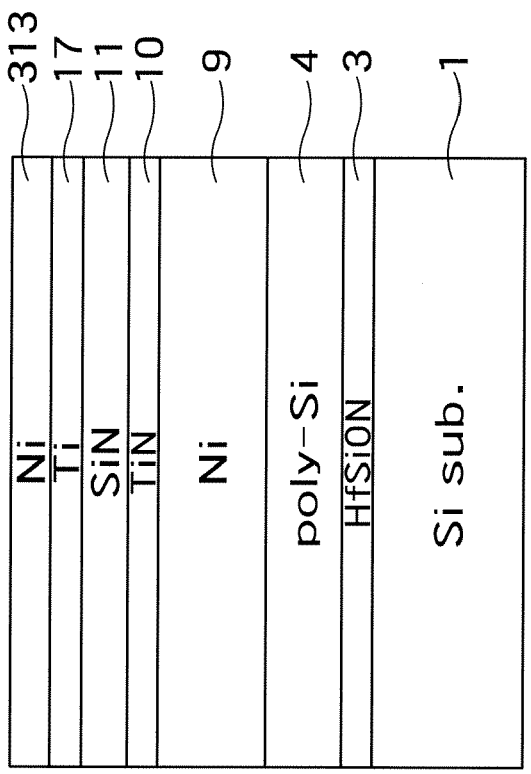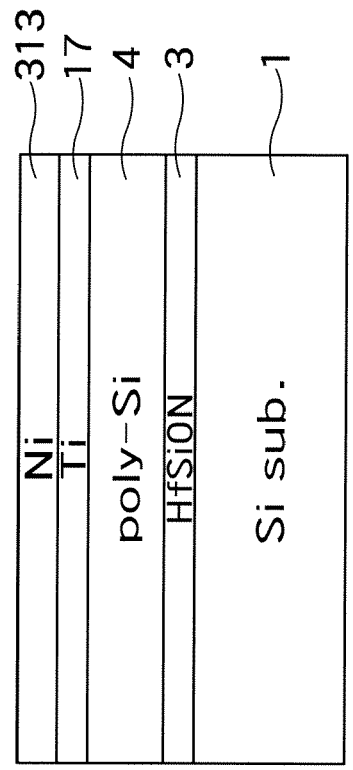
FIG. 5E

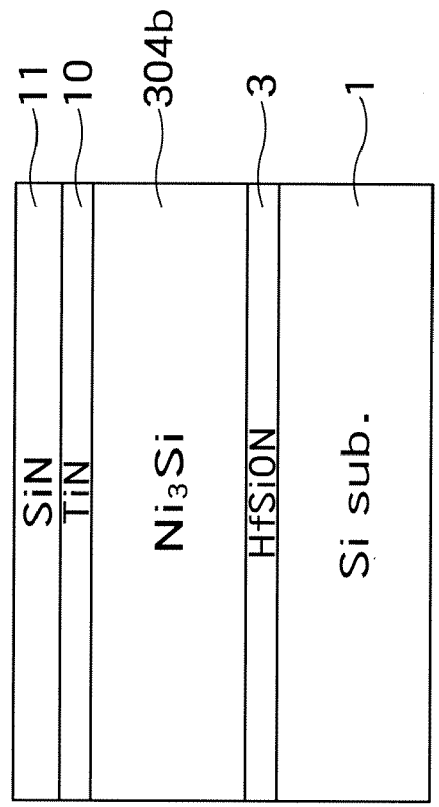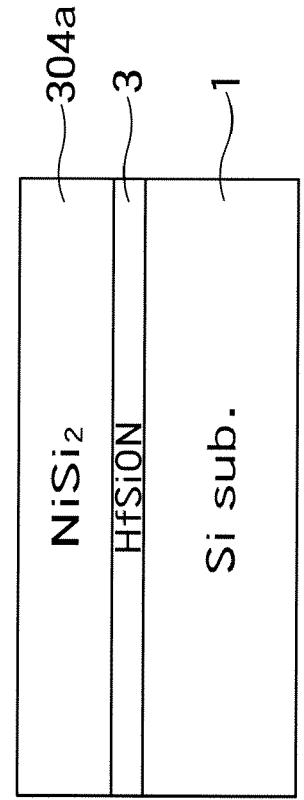
FIG. 5G

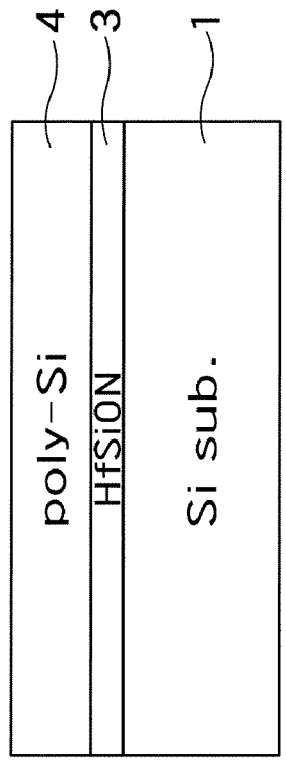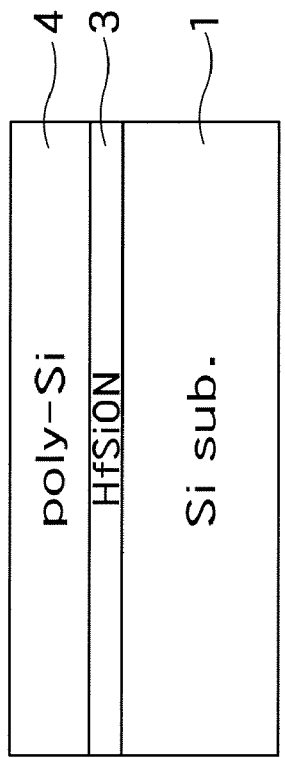
FIG. 6A
○ poly-Si/HfSiON DEPOSITION

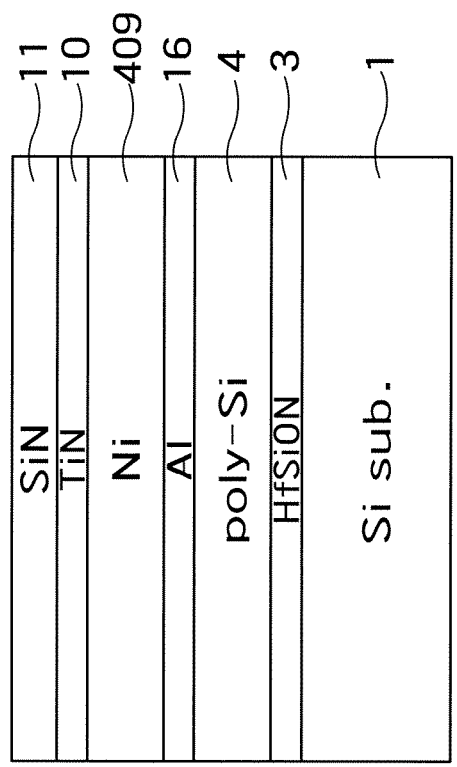
p-type MOS
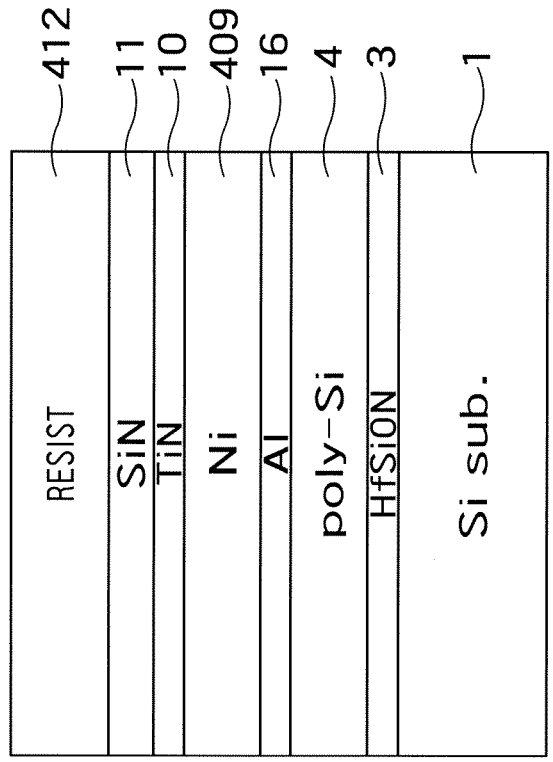
n-type MOS
○ TiN/Ni/Al SPUTTERING
○ SiN DEPOSITION
○ n-type MOS EXPOSURE
FIG. 6B

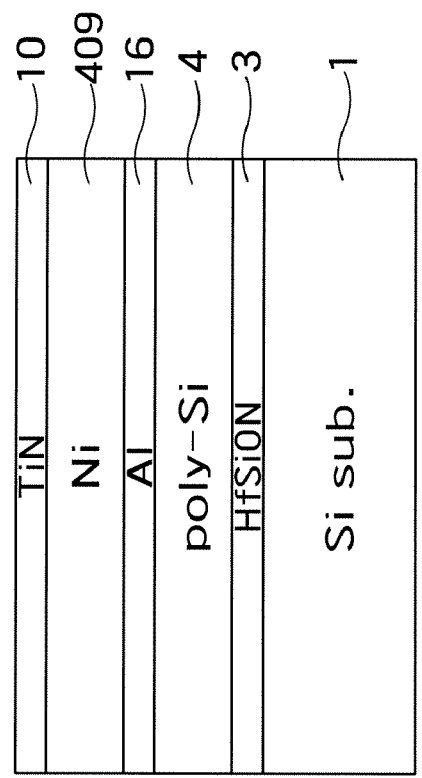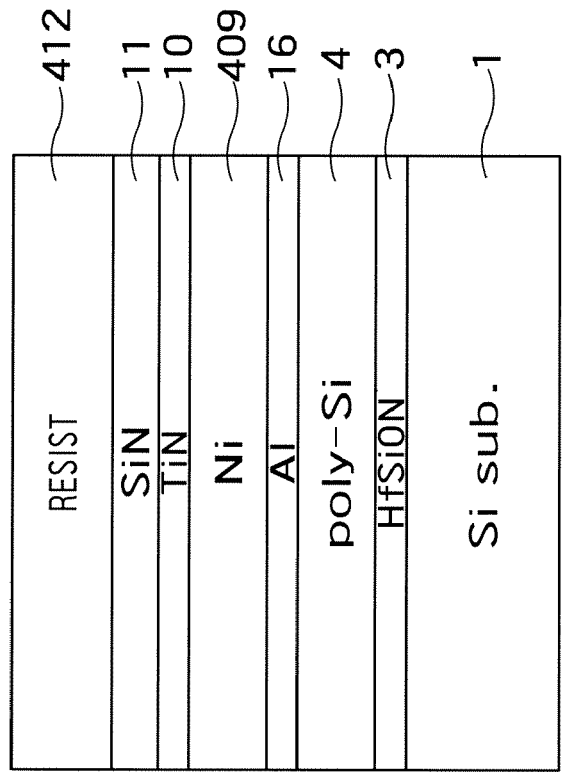
FIG. 6C
○ SiN RIE

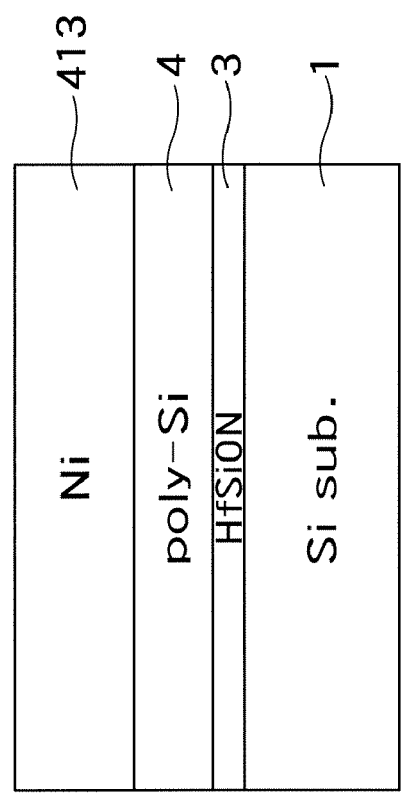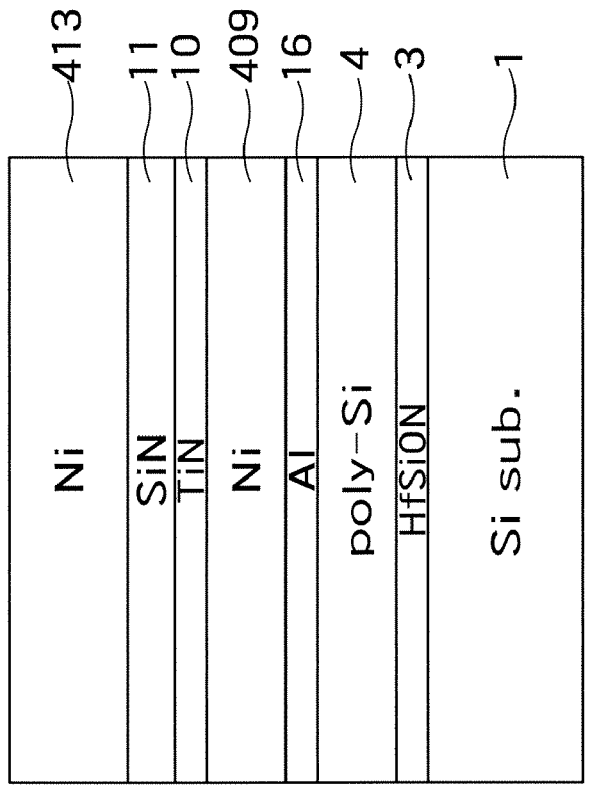
FIG. 6E
○ Ni SPUTTERING

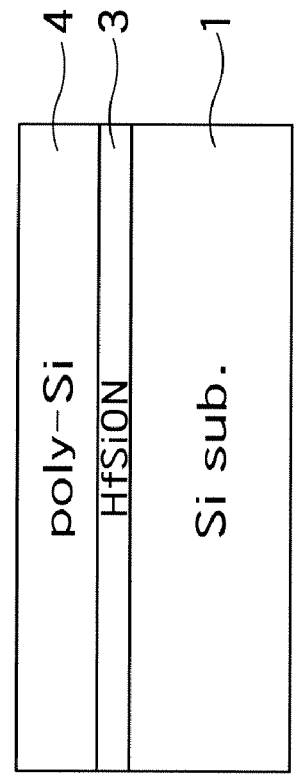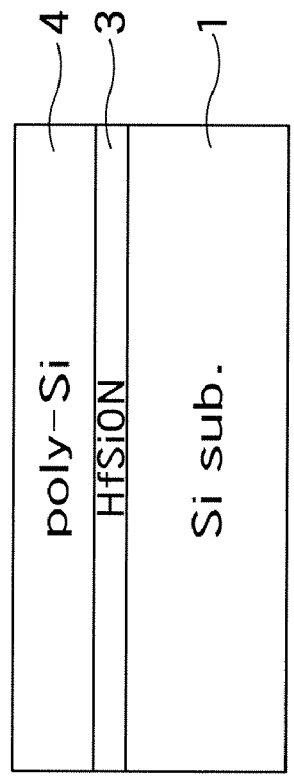
○ poly-Si/HfSiON DEPOSITION
FIG. 7A

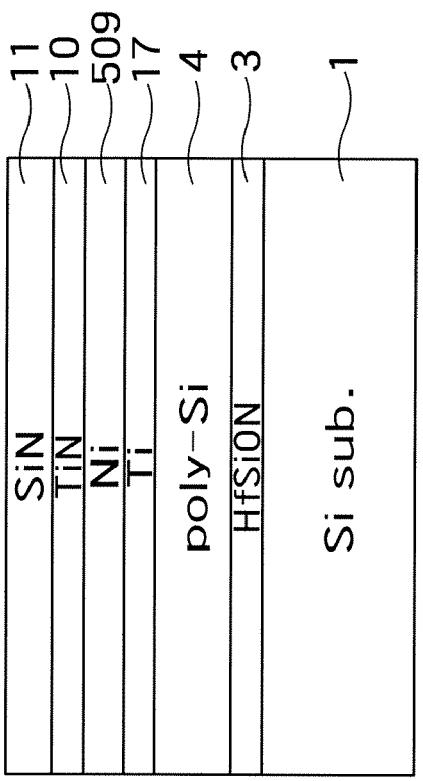
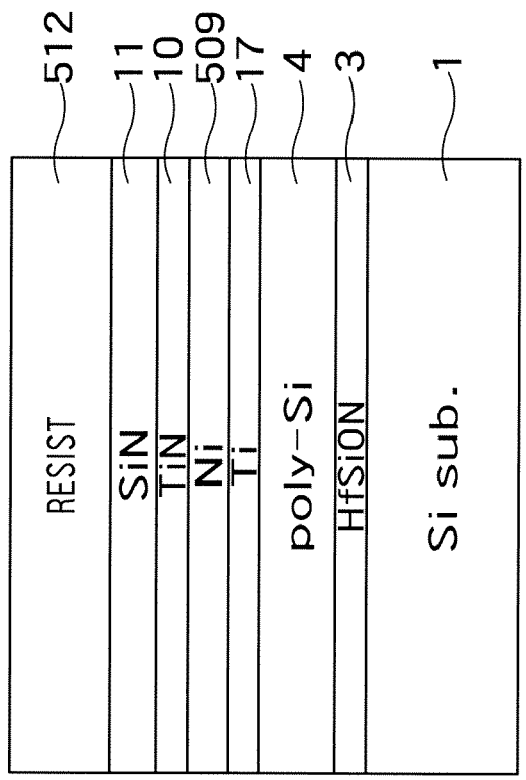
FIG. 7B
○ TiN/Ni/Ti SPUTTERING
○ SiN DEPOSITION
○ n-type MOS EXPOSURE

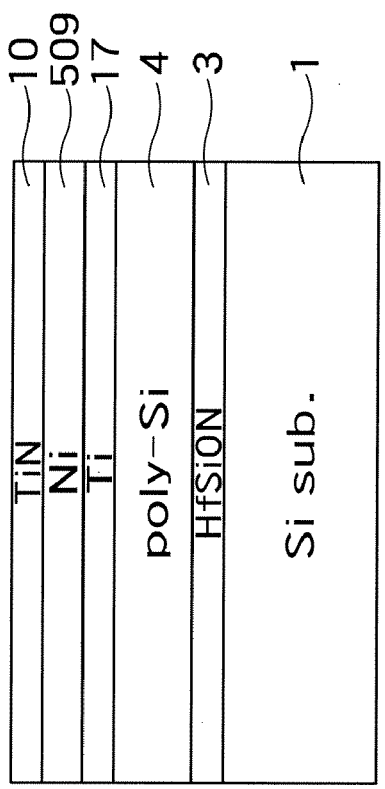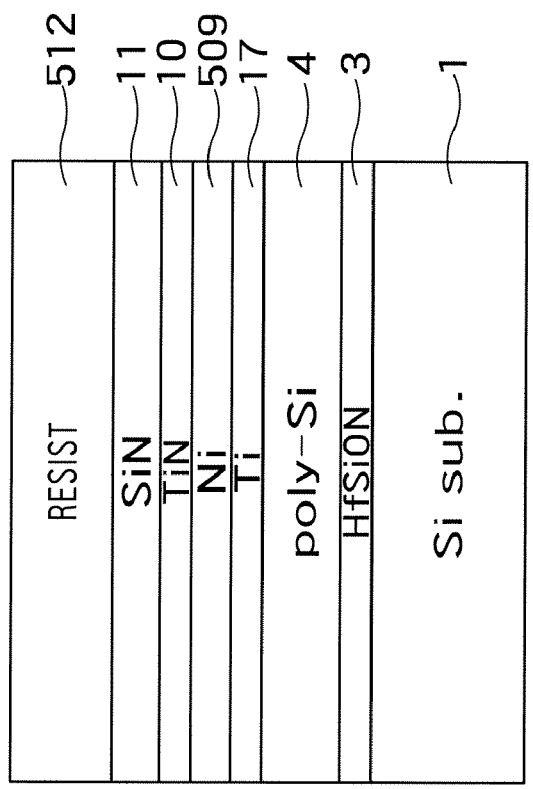
FIG. 7C

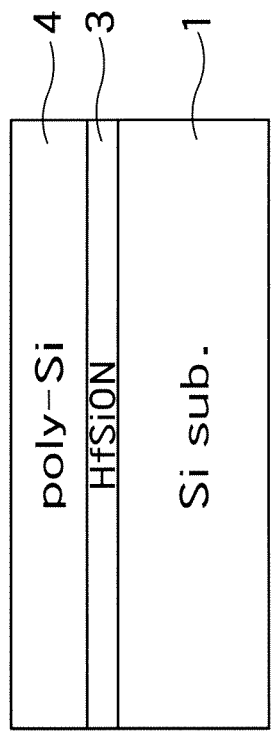
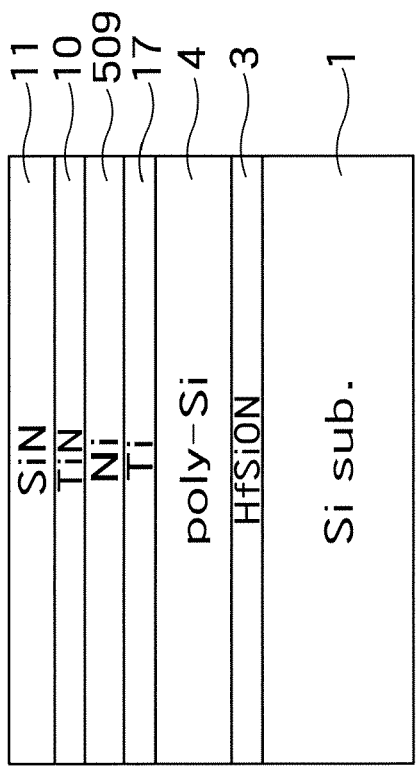
FIG. 7D

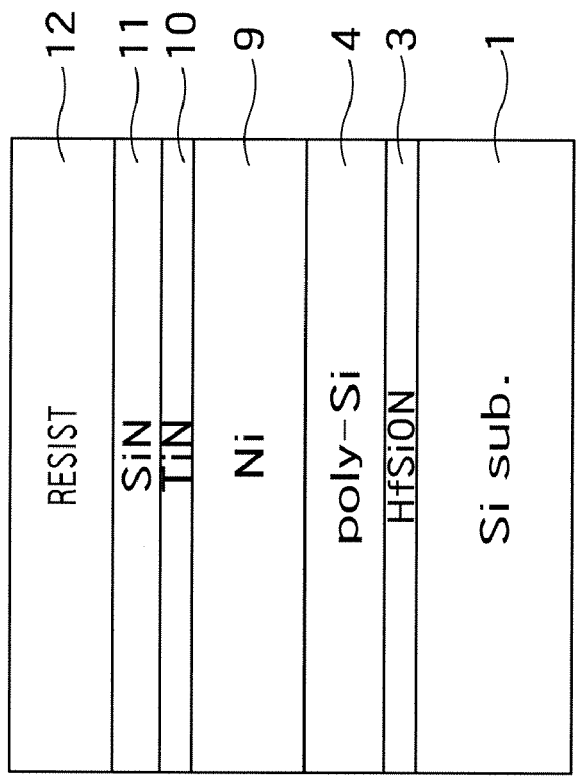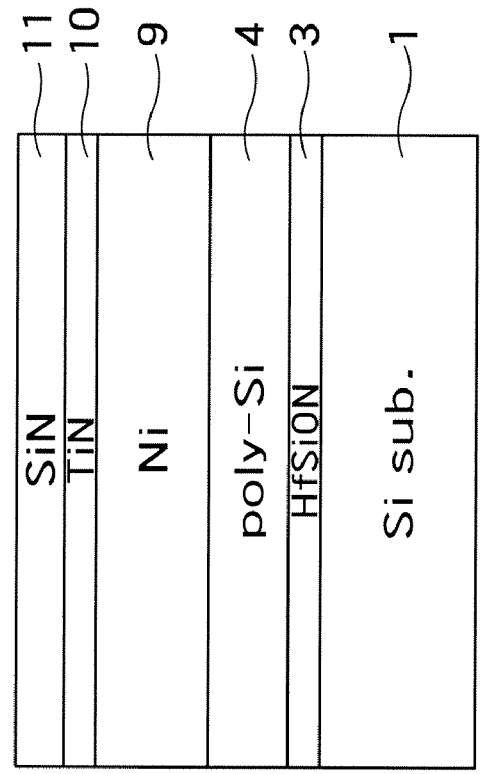
FIG. 8B

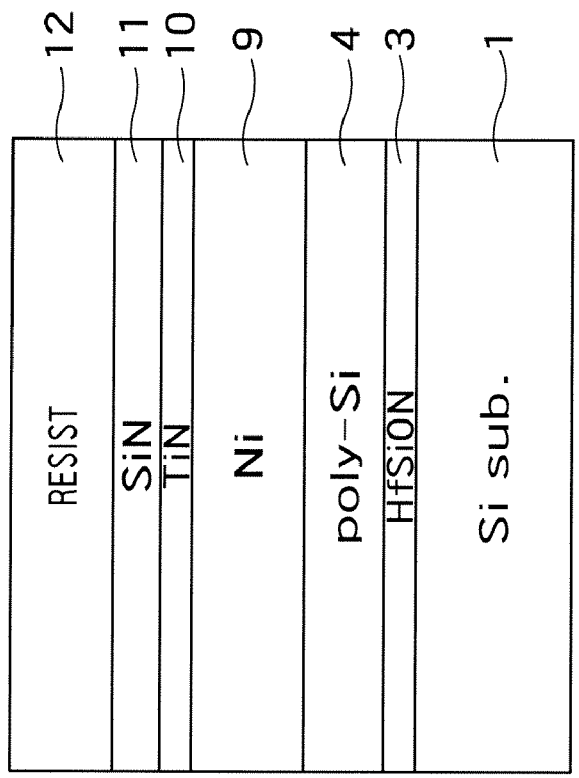
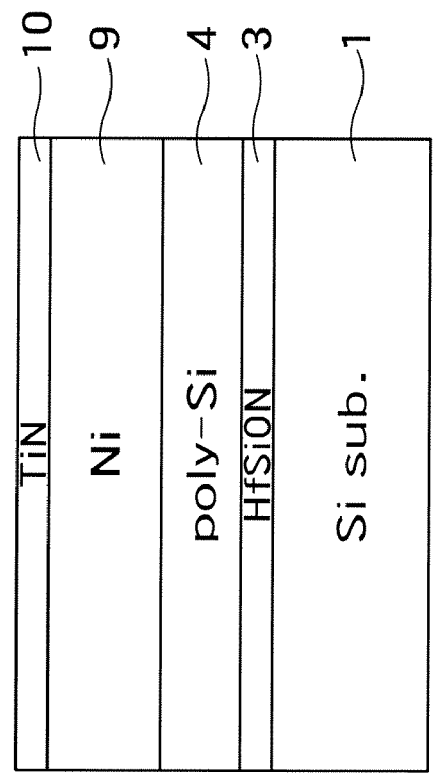
FIG. 8C
○ SiN RIE

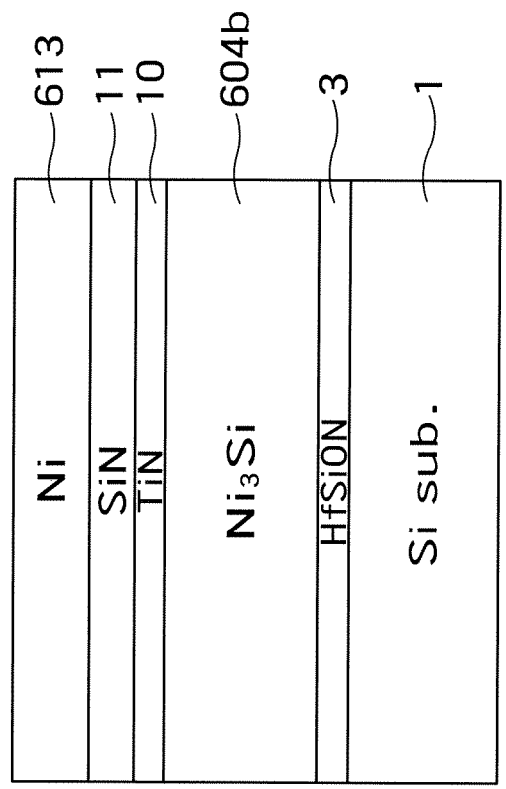
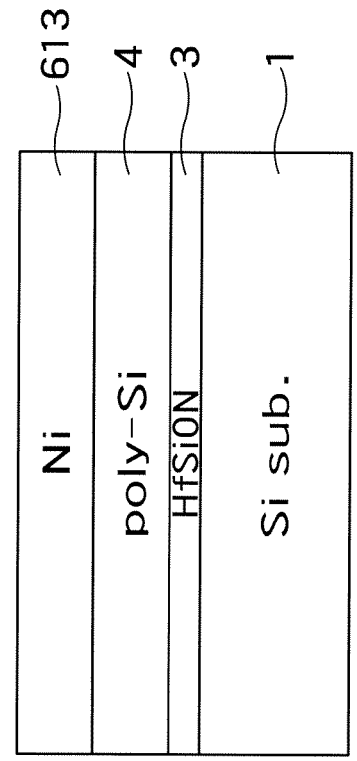
FIG. 8F
○ Ni SPUTTERING

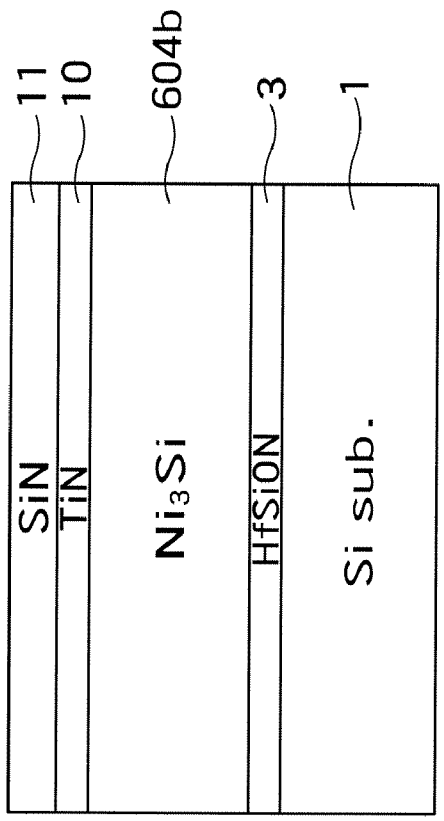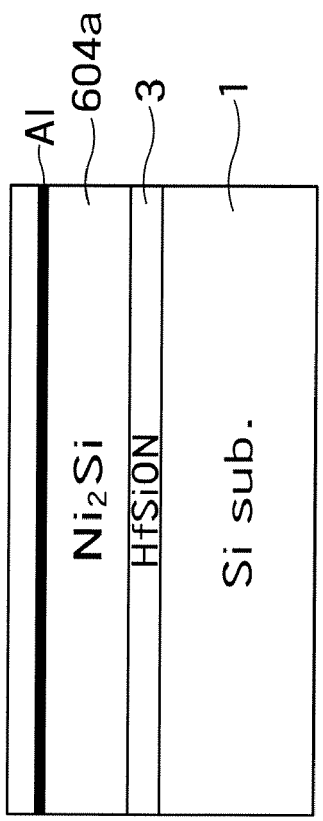
FIG. 81

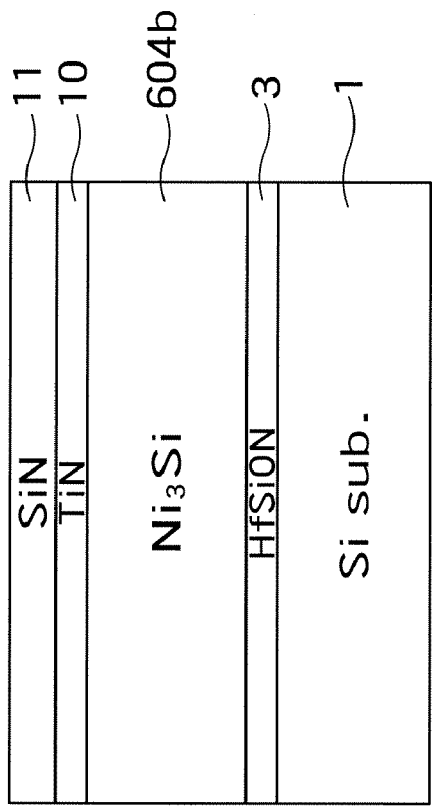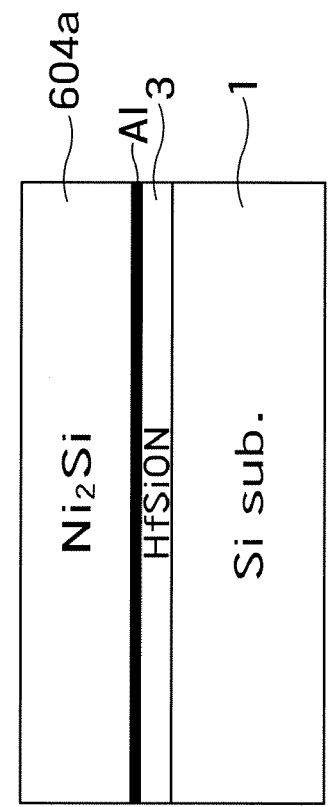
FIG. 8J

METHOD OF MANUFACTURING SEMICONDUCTOR DEVICE

CROSS-REFERENCE TO RELATED APPLICATION

This application is based upon and claims the benefit of priority from the prior Japanese Patent Application No. 2006-326091, filed on Dec. 1, 2006, the entire contents of which are incorporated herein by reference.

BACKGROUND OF THE INVENTION

1. Field of the Invention

The present invention relates to a metal gate electrode, for example. In particular, it relates to a method of manufacturing a semiconductor device that has an n-type metal oxide semiconductor field-effect transistor (MOSFET) and a p-type MOSFET having metal gate electrodes of different compositions.

2. Background Art

According to prior art, a metal gate electrode is used to suppress the gate depletion layer of a MOS transistor. A fully silicided (FUSI) gate is preferably used because it is suitable for currently available manufacturing methods for a semiconductor device.

However, the FUSI gate is difficult to control the work function. The work function of the FUSI gate (threshold voltage of MOSFET with the FUSI gate) can be changed by implanting As, P or B in the gate insulating film made of $SiO_2$. However, this approach has a problem that the work function (threshold voltage) cannot be controlled to a desired value.

In addition, a high dielectric insulating film, rather than the $SiO_2$ film, can be used as the gate insulating film in order to suppress the leak current at the gate.

The high dielectric insulating film may be a hafnium silicate nitride (HfSiON) film. However, compared with the case of changing the composition of the gate electrode ($Ni_xSi_y$, for example), the variable range of the threshold voltage is narrow.

Thus, according to a conventional method of manufacturing a semiconductor device, a FUSI gate having a threshold closer to a desired value is formed by changing the composition of the FUSI gate or combining other materials to form the FUSI gate (Japanese Patent Laid-Open Publication No. 2005-167251).

In the conventional method, Ni is deposited on the gate made of polysilicon to cause silicidation of the polysilicon gate. Then, using a TiN protective film, the Ni is selectively removed with a mixture of hydrochloric acid and hydrogen peroxide depending on the structures of the p-type MOS and the n-type MOS. Then, a thermal processing is performed to cause selective silicidation of polysilicon of the gate.

However, the conventional method has a disadvantage that the Ni on the polysilicon cannot be adequately removed with the mixture of hydrochloric acid and hydrogen peroxide, and therefore, a desired threshold cannot be provided.

SUMMARY OF THE INVENTION

According to one aspect of the present invention, there is provided: a method of manufacturing a semiconductor device having a MOSFET of a first conductivity type and a MOSFET of a second conductivity type different from the first conductivity type formed on a semiconductor substrate, the method comprising:

forming a gate insulating film composed of a high dielectric insulating film on said semiconductor substrate;

forming a first gate electrode layer containing at least one of Si and Ge on said gate insulating film in a gate electrode region, in which a gate electrode of said MOSFET of said first conductivity type is to be formed, and forming a second gate electrode layer having the same composition as said first gate electrode layer on said gate insulating film in a gate electrode region, in which a gate electrode of said MOSFET of said second conductivity type is to be formed;

forming a first metal containing layer on said first gate electrode layer and said second gate electrode layer;

forming a second metal containing layer for preventing diffusion of a metal on said first metal containing layer;

forming a protective film on said second metal containing layer;

selectively removing the protective film disposed above said second gate electrode layer of said MOSFET of said second conductivity type;

selectively removing said first metal containing layer and said second metal containing layer in the region from which said protective film is selectively removed using the remaining protective film as a mask;

forming a third metal containing layer on said second gate electrode layer from which said first metal containing layer and said second metal containing layer are selectively removed, the third metal containing layer having a thickness different from the thickness of said first metal containing layer in a case where the third metal containing layer contains the same metal or alloy as the metal or alloy contained in said first metal containing layer; and performing a thermal processing, thereby causing reaction between the metal contained in said first metal containing layer and said first gate electrode layer to convert said first gate electrode layer into an alloy and causing reaction between the metal contained in said third metal containing layer and said second gate electrode layer to convert said second gate electrode layer into an alloy, thereby forming gate electrodes of different compositions.

BRIEF DESCRIPTION OF THE DRAWINGS

FIG. 2A is a cross-sectional view of essential parts (gate electrode regions) of the p-type MOSFET and the n-type MOSFET in a step of the method of manufacturing a semiconductor device according to the First embodiment of the present invention;

FIG. 2B is a cross-sectional view of essential parts (gate electrode regions) of the p-type MOSFET and the n-type MOSFET in a step of the method of manufacturing a semiconductor device according to the First embodiment of the present invention;

FIG. 2D is a cross-sectional view of essential parts (gate electrode regions) of the p-type MOSFET and the n-type MOSFET in a step of the method of manufacturing a semiconductor device according to the First embodiment of the present invention;

FIG. 2E is a cross-sectional view of essential parts (gate electrode regions) of the p-type MOSFET and the n-type MOSFET in a step of the method of manufacturing a semiconductor device according to the First embodiment of the present invention;

FIG. 2F is a cross-sectional view of essential parts (gate electrode regions) of the p-type MOSFET and the n-type MOSFET in a step of the method of manufacturing a semiconductor device according to the First embodiment of the present invention;

FIG. 2H is a cross-sectional view of essential parts (gate electrode regions) of the p-type MOSFET and the n-type MOSFET in a step of the method of manufacturing a semiconductor device according to the First embodiment of the present invention;

FIG. 2I is a cross-sectional view of essential parts (gate electrode regions) of the p-type MOSFET and the n-type MOSFET in a step of the method of manufacturing a semiconductor device according to the First embodiment of the present invention;

FIG. 4A is a cross-sectional view of essential parts of a p-type MOSFET region and an n-type MOSFET region (gate electrode regions) in a step of the method of manufacturing a semiconductor device according to a second embodiment of the present invention;

FIG. 4B is a cross-sectional view of essential parts of a p-type MOSFET region and an n-type MOSFET region (gate electrode regions) in a step of the method of manufacturing a semiconductor device according to the second embodiment of the present invention;

FIG. 4C is a cross-sectional view of essential parts of a p-type MOSFET region and an n-type MOSFET region (gate electrode regions) in a step of the method of manufacturing a semiconductor device according to the second embodiment of the present invention;

FIG. 4E is a cross-sectional view of essential parts of a p-type MOSFET region and an n-type MOSFET region (gate electrode regions) in a step of the method of manufacturing a semiconductor device according to the second embodiment of the present invention;

FIG. 4F is a cross-sectional view of essential parts of a p-type MOSFET region and an n-type MOSFET region (gate electrode regions) in a step of the method of manufacturing a semiconductor device according to the second embodiment of the present invention;

FIG. 5A is a cross-sectional view of essential parts of a p-type MOSFET region and an n-type MOSFET region (gate electrode regions) in a step of the method of manufacturing a semiconductor device according to a third embodiment of the present invention;

FIG. 5C is a cross-sectional view of essential parts of a p-type MOSFET region and an n-type MOSFET region (gate electrode regions) in a step of the method of manufacturing a semiconductor device according to a third embodiment of the present invention;

FIG. 5E is a cross-sectional view of essential parts of a p-type MOSFET region and an n-type MOSFET region (gate electrode regions) in a step of the method of manufacturing a semiconductor device according to a third embodiment of the present invention;

FIG. 5G is a cross-sectional view of essential parts of a p-type MOSFET region and an n-type MOSFET region (gate electrode regions) in a step of the method of manufacturing a semiconductor device according to a third embodiment of the present invention;

FIG. 6A is a cross-sectional view of essential parts of a p-type MOSFET region and an n-type MOSFET region (gate electrode regions) in a step of the method of manufacturing a semiconductor device according to a fourth embodiment of the present invention;

FIG. 6B is a cross-sectional view of essential parts of a p-type MOSFET region and an n-type MOSFET region (gate electrode regions) in a step of the method of manufacturing a semiconductor device according to the fourth embodiment of the present invention;

FIG. 6C is a cross-sectional view of essential parts of a p-type MOSFET region and an n-type MOSFET region (gate electrode regions) in a step of the method of manufacturing a semiconductor device according to the fourth embodiment of the present invention;

FIG. 6E is a cross-sectional view of essential parts of a p-type MOSFET region and an n-type MOSFET region (gate electrode regions) in a step of the method of manufacturing a semiconductor device according to the fourth embodiment of the present invention;

FIG. 7A is a cross-sectional view of essential parts of a p-type MOSFET region and an n-type MOSFET region (gate electrode regions) in a step of the method of manufacturing a semiconductor device according to a fifth embodiment of the present invention;

FIG. 7B is a cross-sectional view of essential parts of a p-type MOSFET region and an n-type MOSFET region (gate electrode regions) in a step of the method of manufacturing a semiconductor device according to the fifth embodiment of the present invention;

FIG. 7C is a cross-sectional view of essential parts of a p-type MOSFET region and an n-type MOSFET region (gate electrode regions) in a step of the method of manufacturing a semiconductor device according to the fifth embodiment of the present invention;

FIG. 7D is a cross-sectional view of essential parts of a p-type MOSFET region and an n-type MOSFET region (gate electrode regions) in a step of the method of manufacturing a semiconductor device according to the fifth embodiment of the present invention;

FIG. 8B is a cross-sectional view of essential parts of a p-type MOSFET region and an n-type MOSFET region (gate electrode regions) in a step of the method of manufacturing a semiconductor device according to the sixth embodiment of the present invention;

FIG. 8C is a cross-sectional view of essential parts of a p-type MOSFET region and an n-type MOSFET region (gate electrode regions) in a step of the method of manufacturing a semiconductor device according to the sixth embodiment of the present invention;

FIG. 8F is a cross-sectional view of essential parts of a p-type MOSFET region and an n-type MOSFET region (gate electrode regions) in a step of the method of manufacturing a semiconductor device according to the sixth embodiment of the present invention;

FIG. 8I is a cross-sectional view of essential parts of a p-type MOSFET region and an n-type MOSFET region (gate electrode regions) in a step of the method of manufacturing a semiconductor device according to the sixth embodiment of the present invention; and FIG. 8J is a cross-sectional view of essential parts of a p-type MOSFET region and an n-type MOSFET region (gate electrode regions) in a step of the method of manufacturing a semiconductor device according to the sixth embodiment of the present invention.

DETAILED DESCRIPTION OF THE INVENTION

In the following, embodiments of the present invention will be described with reference to the drawings. For the sake of simplicity, in the embodiments described below, a pair of an n-type MOSFET and a p-type MOSFET in an LSI is shown side by side. However, the present invention is not limited to such an arrangement.

First Embodiment

There will be described a method of manufacturing a semiconductor device that has a MOSFET of a first conductivity type and a MOSFET of a second conductivity type, which differs from the first conductivity type, formed on a semiconductor substrate.

In a First embodiment described below, for example, the first conductivity type is p type, the second conductivity type is n type, and the semiconductor substrate is a silicon substrate. However, the present invention can be applied to a case where the first conductivity type is n type, and the second conductivity type is p type (the same holds true for the other embodiments).

FIGS. 1A to 1I are cross-sectional views of an n-type MOSFET region and a p-type MOSFET region in the steps of the method of manufacturing a semiconductor device according to the First embodiment of the present invention.

Figure 1A:
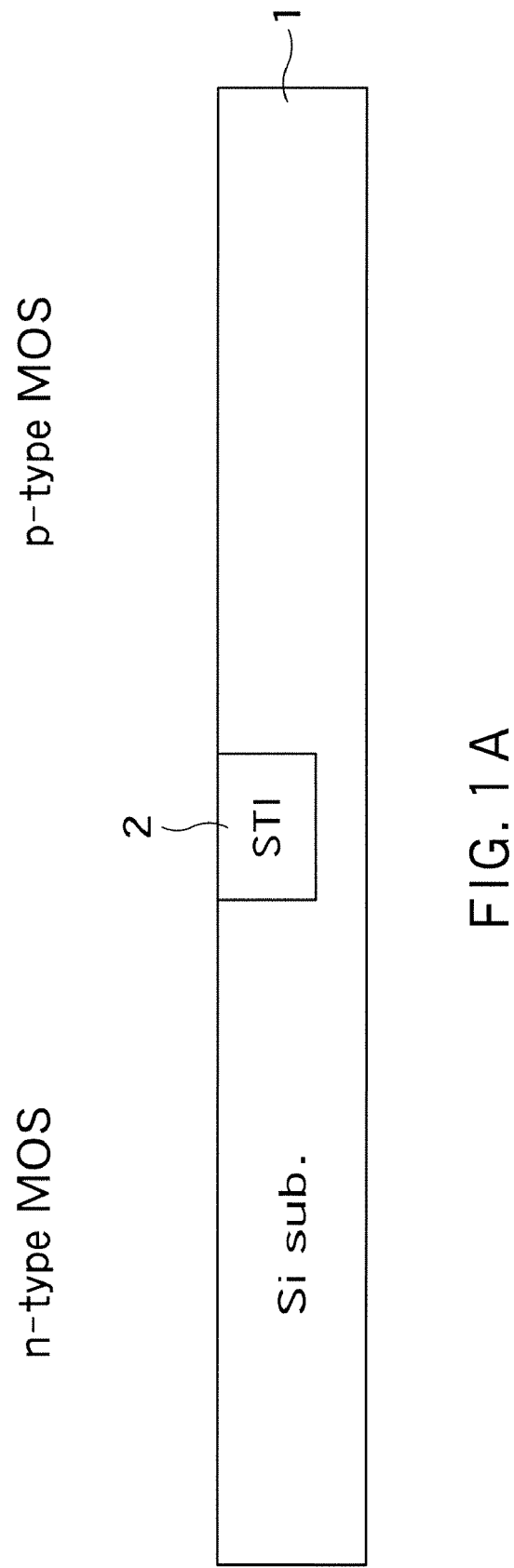
FIG. 1A is a cross-sectional view of an n-type MOSFET region and a p-type MOSFET region in a steps of the method of manufacturing a semiconductor device according to a First embodiment of the present invention.

First, as shown in FIG. 1A, a trench is formed in a silicon substrate 1, and a silicon oxide film is embedded in the trench, thereby forming a shallow trench isolation (STI) 2. Then, an impurity is implanted into the p-type MOSFET region of the silicon substrate 1 and thermally diffused to selectively form an n-type well, and an impurity is implanted into the n-type MOSFET region of the silicon substrate 1 and thermally diffused to selectively form a p-type well.

Then, a hafnium silicate film (HfSiO film) is formed on the silicon substrate 1, nitrogen is added into the HfSiO film, and then, a thermal processing is performed to modify the HfSiO film into a hafnium silicate nitride film (HfSiON film) 3 having a thickness of about 3 nm, for example, which is a high dielectric insulating film. The HfSiON film 3 serves as a gate insulating film (a high dielectric insulating film).

A polysilicon layer 4 containing Si, which serves as a gate electrode layer, is formed on the HfSiON film (gate insulating film) 3 in a gate electrode region, in which a gate electrode of the p-type MOSFET is to be formed. Similarly, a polysilicon layer 4, which serves as a gate electrode layer having the same composition as the gate electrode layer described above, is formed on the HfSiON film (gate insulating film) 3 in a gate electrode region, in which a gate electrode of the n-type MOSFET is to be formed. The gate electrode layer may be a layer containing poly-Ge. The polysilicon layer 4 has a thickness of about 100 nm, for example.

Figure 1B:
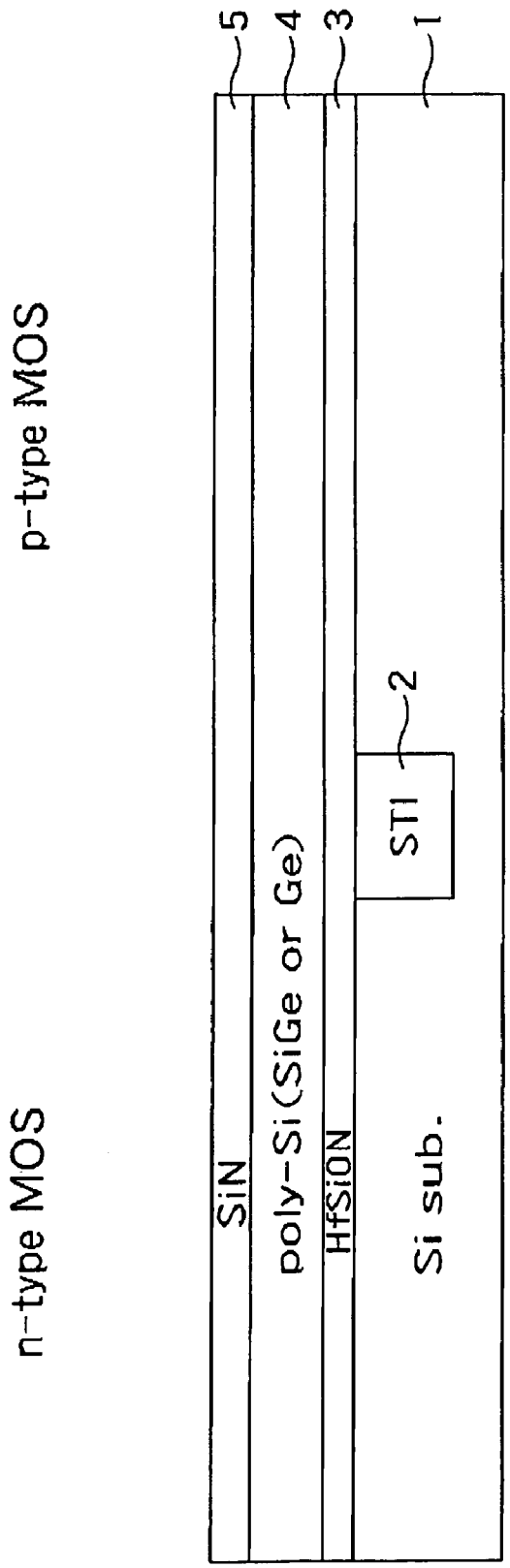
FIG. 1B is a cross-sectional view of an n-type MOSFET region and a p-type MOSFET region in a steps of the method of manufacturing a semiconductor device according to the First embodiment of the present invention.

The polysilicon layer 4, which is to constitute a gate electrode, is formed on the HfSiON film 3 by chemical vapor deposition (CVD). Then, a SiN film 5, which is a hard mask material, is formed on the polysilicon layer 4 (FIG. 1B).

Instead of the HfSiON film 3, the gate insulating film may be a film containing Si, O, N and at least one of Hf, Zr and Al.

Figure 1C:
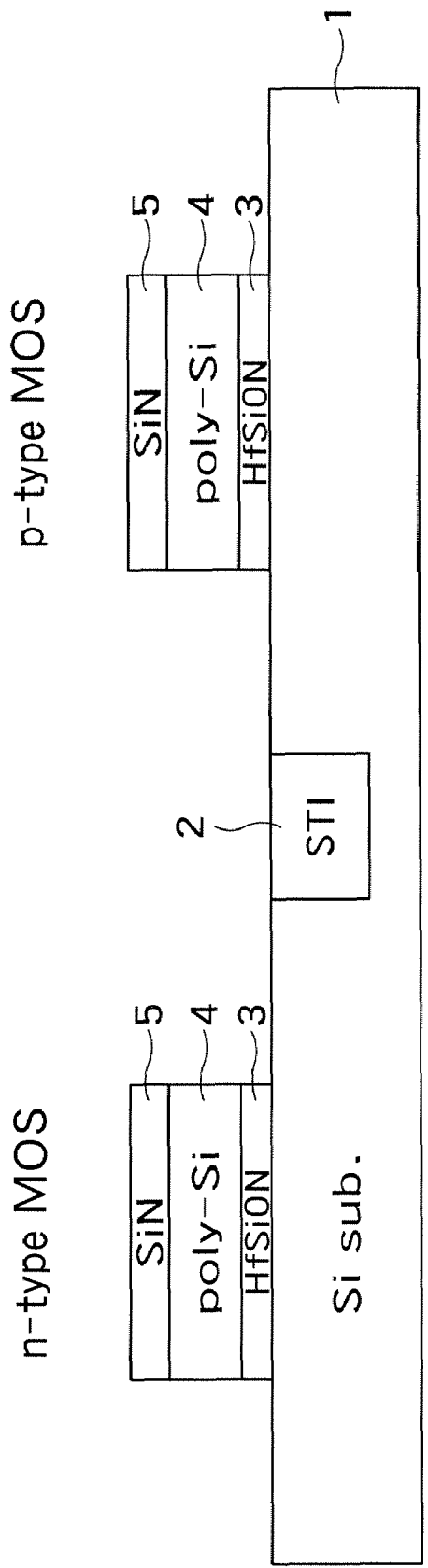
FIG. 1C is a cross-sectional view of an n-type MOSFET region and a p-type MOSFET region in a steps of the method of manufacturing a semiconductor device according to the First embodiment of the present invention.

Then, a poly-Si/HfSiON gate is formed using the SiN film 5 as the hard mask (FIG. 1C).

Figure 1D:
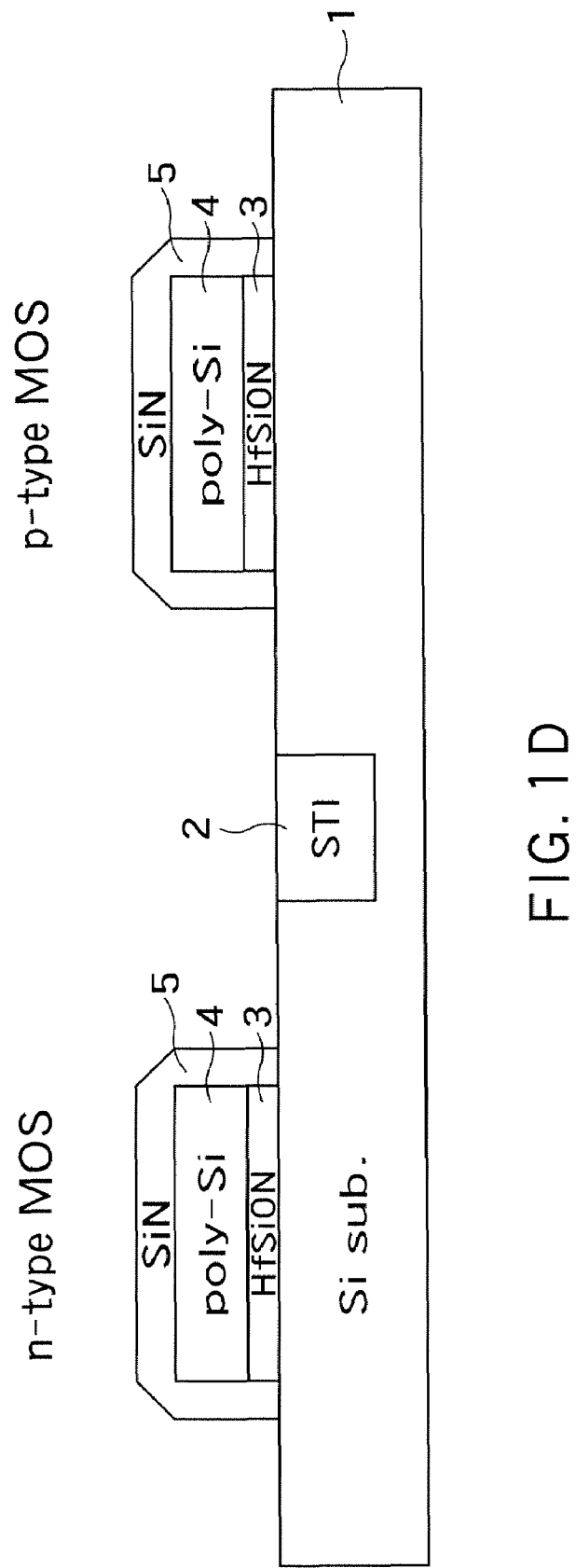
FIG. 1D is a cross-sectional view of an n-type MOSFET region and a p-type MOSFET region in a steps of the method of manufacturing a semiconductor device according to the First embodiment of the present invention.

Then, a SiN side wall is formed by CVD and reactive ion etching (RIE) (FIG. 1D).

Figure 1E:
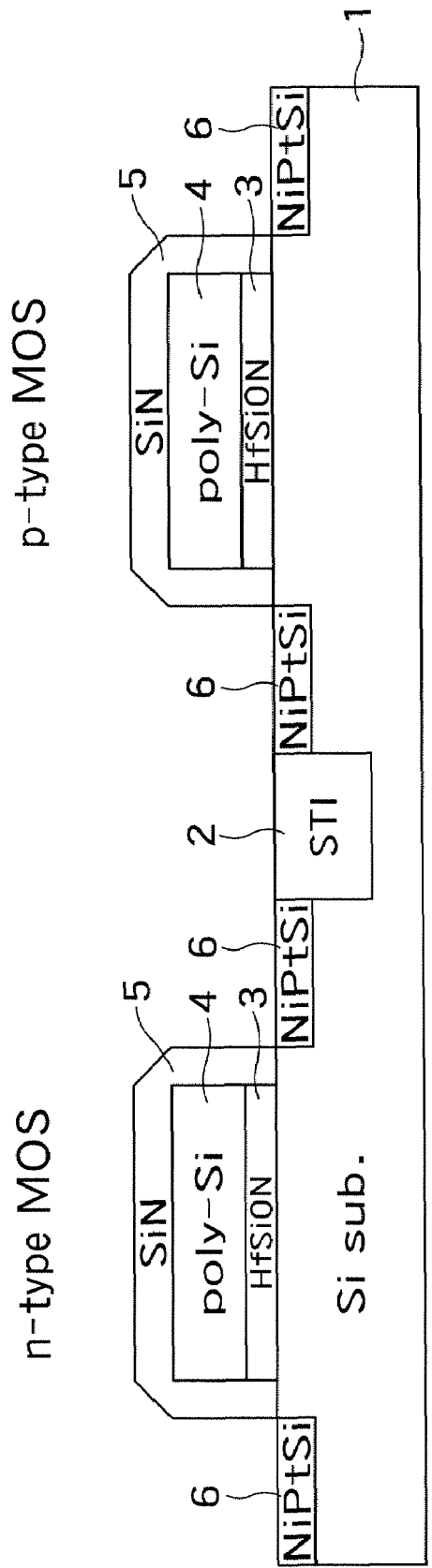
FIG. 1E is a cross-sectional view of an n-type MOSFET region and a p-type MOSFET region in a steps of the method of manufacturing a semiconductor device according to the First embodiment of the present invention.

Then, a source/drain diffusion layer is formed in the silicon substrate 1, and then a source/drain silicide contact (NiPtSi layer) 6 is formed by a salicide process (FIG. 1E).

Figure 1F:
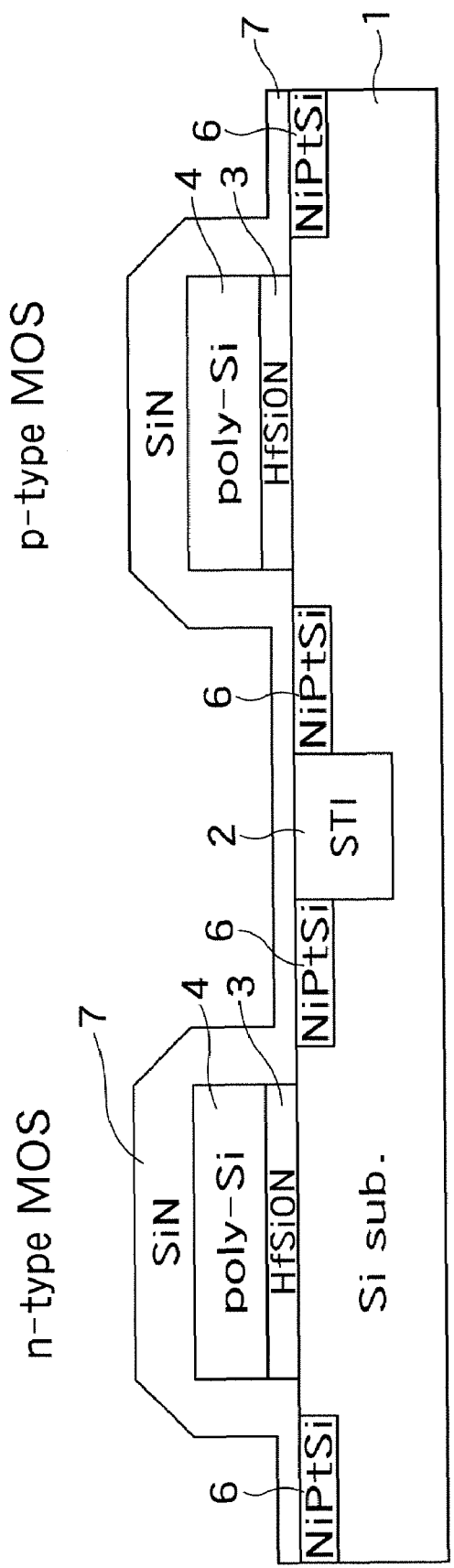
FIG. 1F is a cross-sectional view of an n-type MOSFET region and a p-type MOSFET region in a steps of the method of manufacturing a semiconductor device according to the First embodiment of the present invention.

Then, a SiN film 7 is formed in the p-type MOSFET region and the n-type MOSFET region by CVD, for example (FIG. 1F).

Figure 1G:
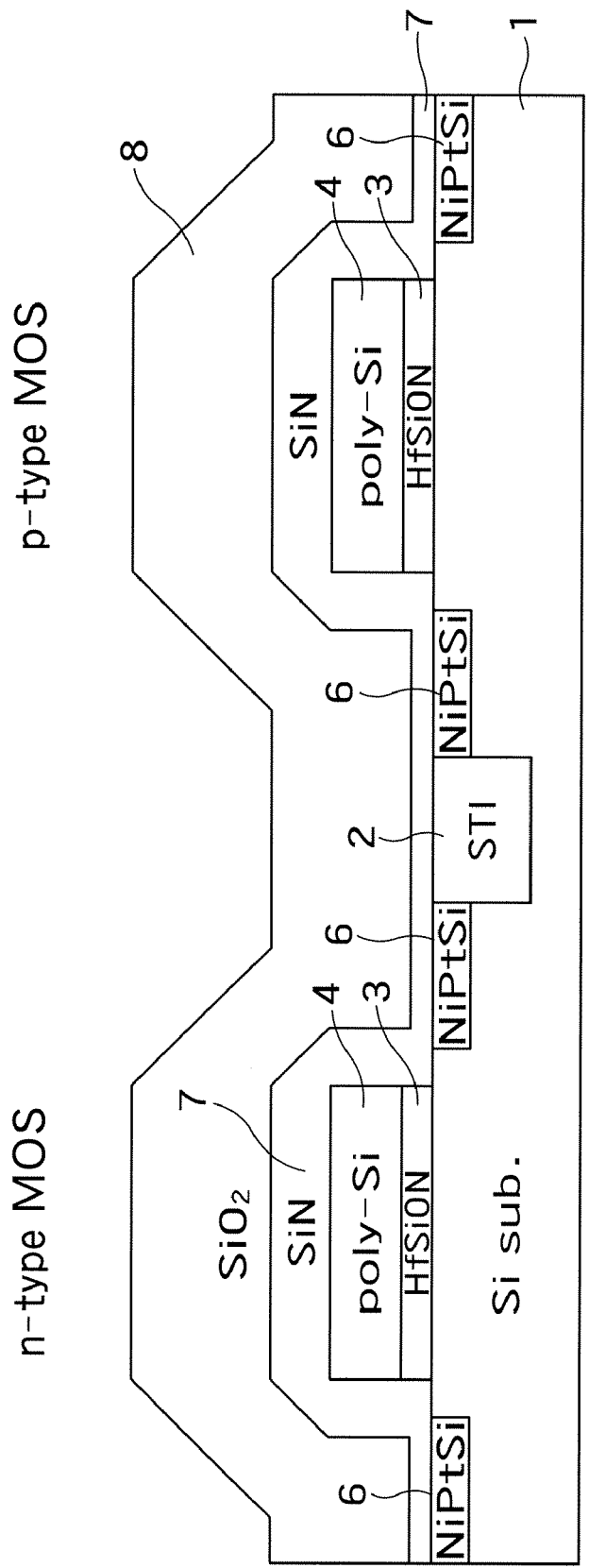
FIG. 1G is a cross-sectional view of an n-type MOSFET region and a p-type MOSFET region in a step of the method of manufacturing a semiconductor device according to the First embodiment of the present invention.

Then, a $SiO_2$ film 8 that is at least thicker than the polysilicon layer 4 is formed on the SiN film 7 by CVD, for example (FIG. 1G).

Figure 1H:
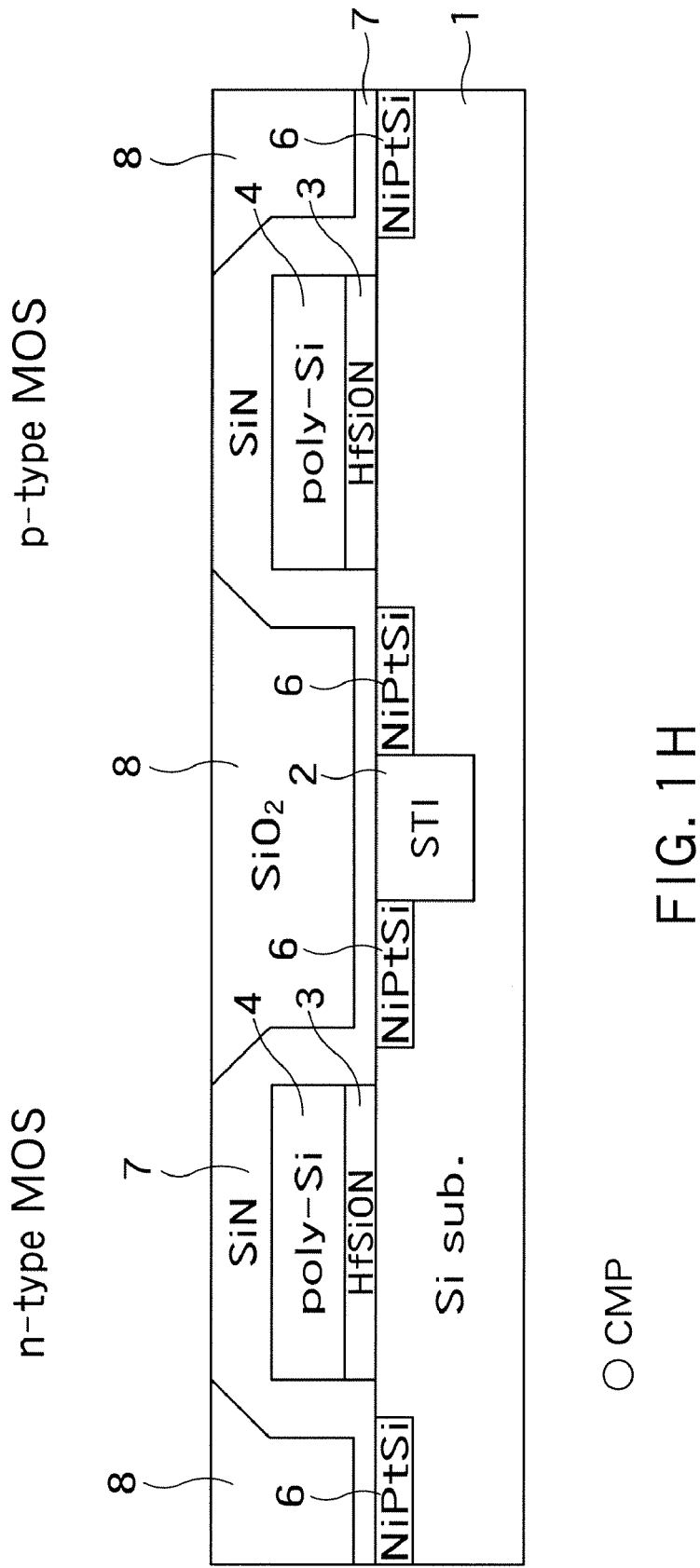
FIG. 1H is a cross-sectional view of an n-type MOSFET region and a p-type MOSFET region in a step of the method of manufacturing a semiconductor device according to the First embodiment of the present invention.

Then, the $SiO_2$ film 8 is planarized by chemical mechanical polishing (CMP) using the SiN film as an etching stopper (FIG. 1H).

Figure 1I:
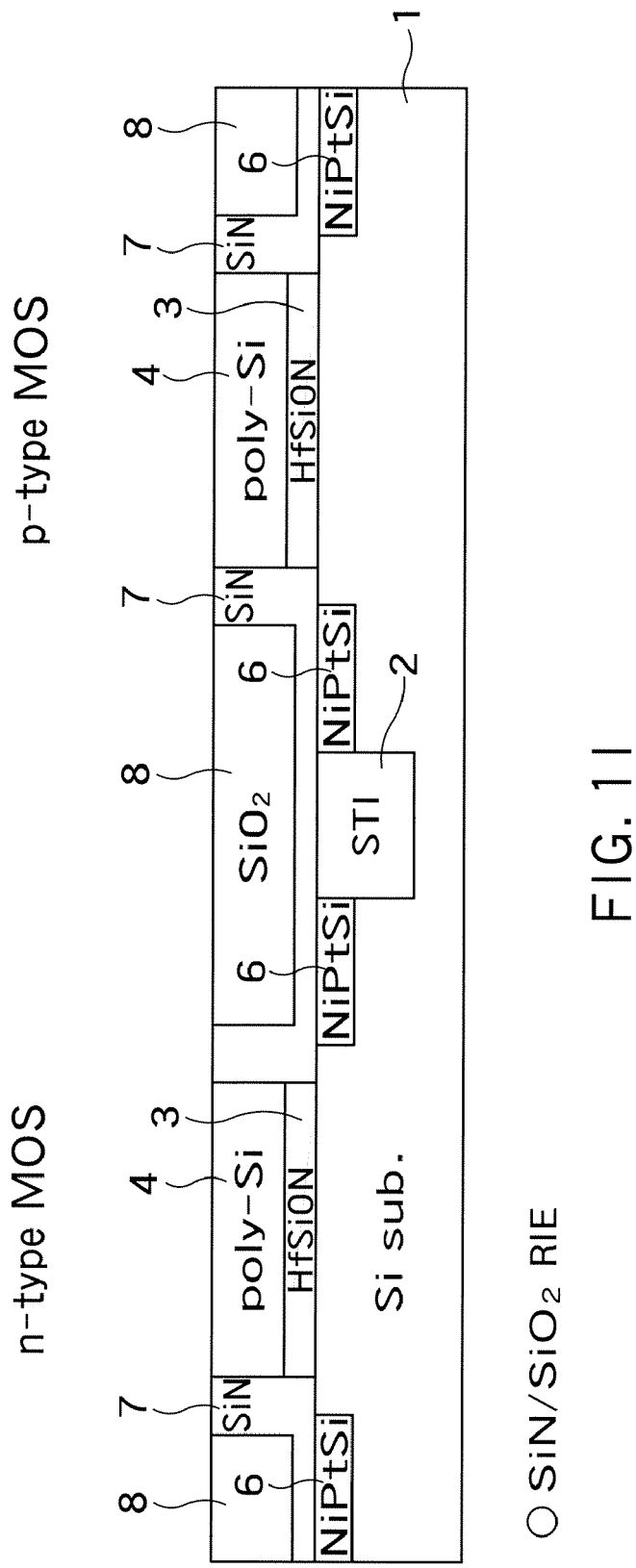
FIG. 1I is a cross-sectional view of an n-type MOSFET region and a p-type MOSFET region in a step of the method of manufacturing a semiconductor device according to the First embodiment of the present invention.

Then, the SiN film 7 and the $SiO_2$ film 8 on the polysilicon layer 4 are removed by RIE (FIG. 1I).

Now, there will be described structures of the gate electrode regions of the p-type MOSFET and the n-type MOSFET.

FIGS. 2A to 2I are cross-sectional views of essential parts (gate electrode regions) of the p-type MOSFET and the n-type MOSFET in the steps of the method of manufacturing a semiconductor device according to the First embodiment of the present invention. The step shown in FIG. 2A corresponds to the step shown in FIG. 1I.

After the HfSiON film 3 and the polysilicon layer 4 are formed through the steps shown in FIGS. 1A to 1I (FIG. 2A), a Ni film 9 and a TiN film 10 are successively formed on the polysilicon layer 4 by sputtering method. That is, the Ni film 9, which is a first metal containing layer, is formed on the gate electrode layers (polysilicon layers 4) of the p-type MOSFET region and the n-type MOSFET region, and the TiN film 10, which is a second metal containing layer for preventing diffusion of the metal (Ni) contained in the first metal containing layer, is formed on the first metal containing layer.

Instead of Ni, the first metal containing layer may contain any of Co, Pt, Ti, Hf, Zr, Al and La or an alloy containing any of Ni, Co, Pt, Ti, Hf, Zr, Al and La.

Instead of TiN, the second metal containing layer may contain any of W, WN, TaN, HfN, ZrN, TaC and MoN or an alloy containing any of TiN, W, WN, TaN, HfN, ZrN, TaC and MoN.

Then, a SiN film 11 is formed on the TiN film 10 by plasma enhanced chemical vapor deposition (PECVD), for example. That is, the SiN film 11, which serves as a protective film, is formed on the TiN film 10, which is the second metal containing layer.

Instead of SiN, which is resistant to a mixture of sulfuric acid and hydrogen peroxide, the protective film may be made of SiON, GeN, GeON, a mixture thereof, or any of HfSiON, ZrSiON, SiBN, TiSiON and AlSiON, which are also resistant to a mixture of sulfuric acid and hydrogen peroxide.

Then, the upper surface of the SiN film 11 in the p-type MOSFET region is covered with a resist 12 by photolithography, and the upper surface of the SiN film 11 in the n-type MOSFET region is exposed (FIG. 2B).

Figure 2C:
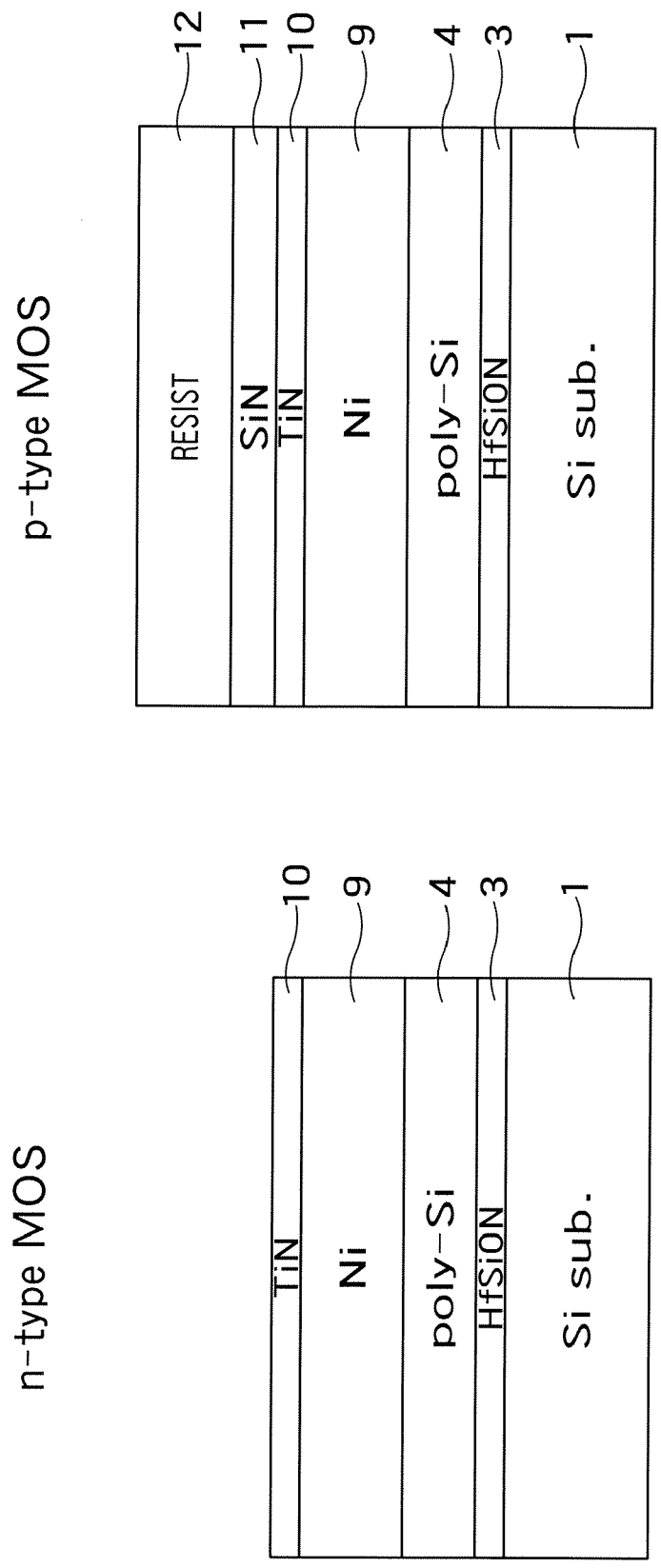
FIG. 2C is a cross-sectional view of essential parts (gate electrode regions) of the p-type MOSFET and the n-type MOSFET in a step of the method of manufacturing a semiconductor device according to the First embodiment of the present invention.

Then, the SiN film 11 in the n-type MOSFET region is selectively removed by RIE using the resist 12 as a mask (FIG. 2C).

That is, the protective film (SiN film 11) disposed above the gate electrode layer (polysilicon layer 4) in the n-type MOSFET region is selectively removed.

Then, the TiN film 10 and the Ni film 9 in the n-type MOSFET region and the resist 12 in the p-type MOSFET region are removed by a mixture of sulfuric acid and hydrogen peroxide (FIG. 2D). As a result, the upper surface of the polysilicon layer 4 in the n-type MOSFET region is exposed.

That is, using the remaining protective film (SiN film 11) as a mask, the first metal containing layer (Ni film 9) and the second metal containing layer (TiN film 10) in the region from which the protective film is selectively removed (n-type MOSFET region) are selectively removed with a mixture of sulfuric acid and hydrogen peroxide.

Since the protective film (SiN film 11) is resistant to the mixture of sulfuric acid and hydrogen peroxide, the mixture of sulfuric acid and hydrogen peroxide can be used as an etchant. Compared with a case of using a mixture of hydrochloric acid an hydrogen peroxide, for example, the first metal containing layer (Ni film 9) and the second metal containing layer (TiN film 10) can be removed easily.

Then, a Ni film 13 is formed by sputtering method on the SiN film 11 in the p-type MOSFET region and the polysilicon layer 4 in the n-type MOSFET region (FIG. 2E).

That is, on the gate electrode layer (polysilicon layer 4) in the n-type MOSFET region from which the first metal containing layer and the second metal containing layer are selectively removed, a third metal containing layer (Ni film 13) having a thickness differing from that of the first metal containing layer (Ni film 9) is formed.

In this embodiment, the third metal containing layer is formed in such a manner that the ratio of the thickness of the first metal containing layer (Ni film 9) to the thickness of the third metal containing layer (Ni film 13) is three to two (or in other words, the third metal containing layer (Ni film 13) is thinner than the first metal containing layer (Ni film 9)).

Instead of Ni, the third metal containing layer may contain any of Co, Pt, Ti, Hf, Zr, Al and La or an alloy containing any of Ni, Co, Pt, Ti, Hf, Zr, Al and La.

If the metal or alloy contained in the third metal containing layer is different from that contained in the first metal containing layer, the third metal containing layer can have a thickness equal to that of the first metal containing layer.

Then, rapid thermal annealing (RTA) is performed at a temperature of 500 degrees C. for 30 seconds, for example, thereby converting the polysilicon layer 4 into a silicide (alloy). As a result, a $Ni_2Si$ layer 4a is formed as a gate electrode of the n-type MOSFET region, and a $Ni_3Si$ layer 4b is formed as a gate electrode of the p-type MOSFET region (FIG. 2F).

Specifically, the thermal processing causes reaction between the metal (Ni) contained in the first metal containing layer (Ni film 9) and the gate electrode layer (polysilicon layer 4) in the p-type MOSFET region to convert the gate electrode layer into an alloy. In addition, the thermal processing causes reaction between the metal (Ni) contained in the third metal containing layer (Ni film 13) and the gate electrode layer (polysilicon layer 4) in the n-type MOSFET region to convert the gate electrode layer into an alloy and form a gate electrode of a different composition.

Since the Ni film 9 and the Ni film 13 have different thicknesses as described above (the Ni film 13 is thinner than the Ni film 9 in this embodiment), the resulting silicides have different compositions.

Specifically, supposing that the composition of one gate electrode layer (the gate electrode layer in the p-type MOSFET region in this embodiment) is expressed as $Ni_{X1}Si_{Y1}$, and the composition of the other gate electrode layer (the gate electrode layer in the n-type MOSFET region in this embodiment) is expressed as $Ni_{X2}Si_{Y2}$, the coefficients "X1", "X2", "Y1" and "Y2" are related according to X1/Y1>X2/Y2.

In this way, the gate electrode of the n-type MOSFET region and the gate electrode of the p-type MOSFET region have different compositions.

Thus, at this point, the n-type MOSFET and the p-type MOSFET have different thresholds.

Figure 2G:
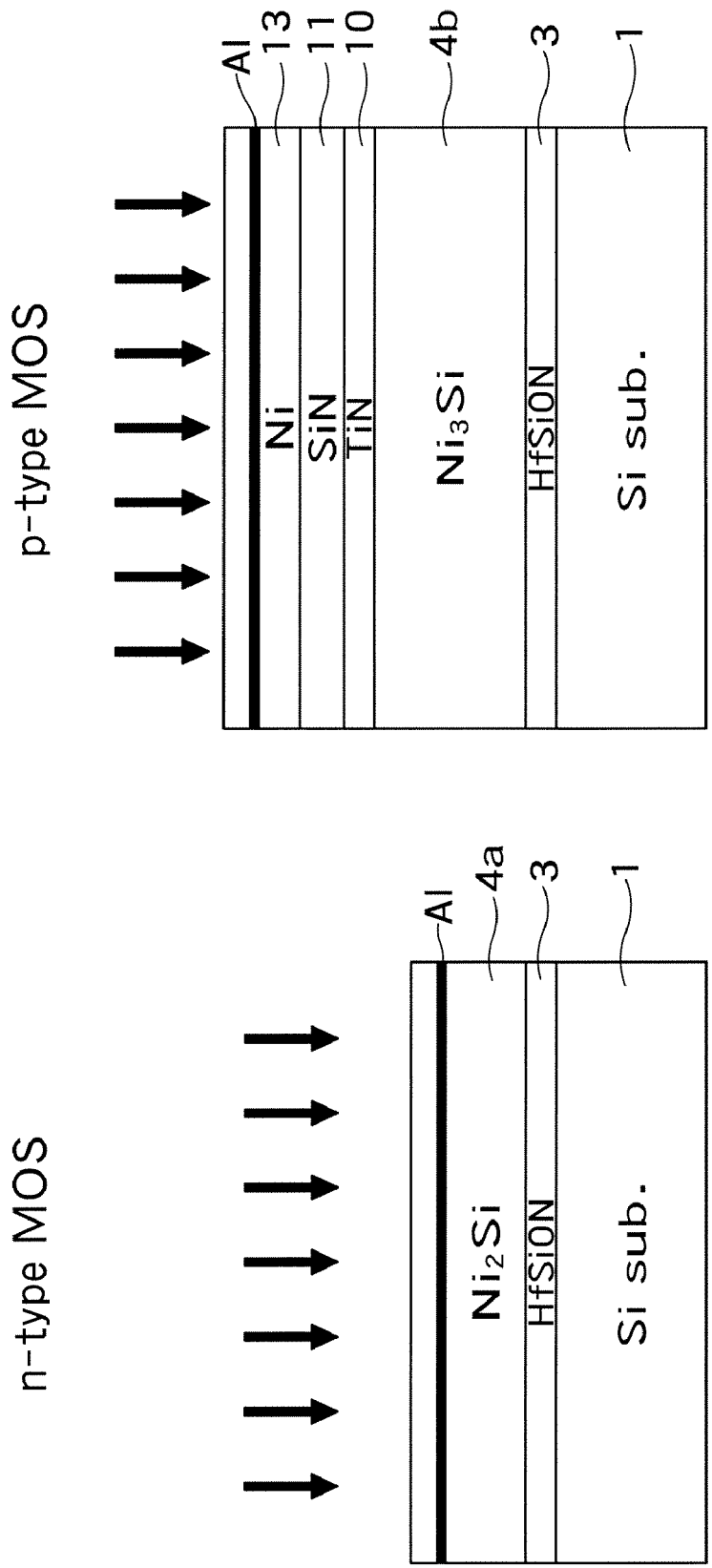
FIG. 2G is a cross-sectional view of essential parts (gate electrode regions) of the p-type MOSFET and the n-type MOSFET in a step of the method of manufacturing a semiconductor device according to the First embodiment of the present invention.

Then, Al is ion-implanted into the $Ni_2Si$ layer 4a, which is the gate electrode alloy layer of the n-type MOSFET region, with projection range of 10 to 20 nm (FIG. 2G). Instead of Al, a metal selected from among Ni, Co, Pt, Ti, Hf, Zr, Y, La, Ta, In, Ga, Tl and W may be ion-implanted.

Then, the Ni film 13 in the p-type MOSFET region is removed by a mixture of sulfuric acid and hydrogen peroxide (FIG. 2H).

Then, RTA is performed at a temperature of 500 degrees C. for 30 seconds, for example, thereby causing segregation to make Al diffuse to the interface between the HfSiON film 3 and the $Ni_2Si$ film 4a (in other words, the interface between the gate insulating film and the gate electrode) (FIG. 2I). As a result, the threshold of the gate electrode of the n-type MOSFET is significantly changed compared with a case where ion implantation of Al into the $Ni_2Si$ film 4a is not performed.

Now, there will be described a process of installing wiring of the n-type MOSFET and the p-type MOSFET having the gate electrodes formed as described above. FIGS. 3A to 3D are cross-sectional views of the n-type MOSFET and the p-type MOSFET in steps of the method of manufacturing a semiconductor device according to the First embodiment of the present invention. The step shown in FIG. 3A corresponds to the step shown in FIG. 2I.

Figure 3A:
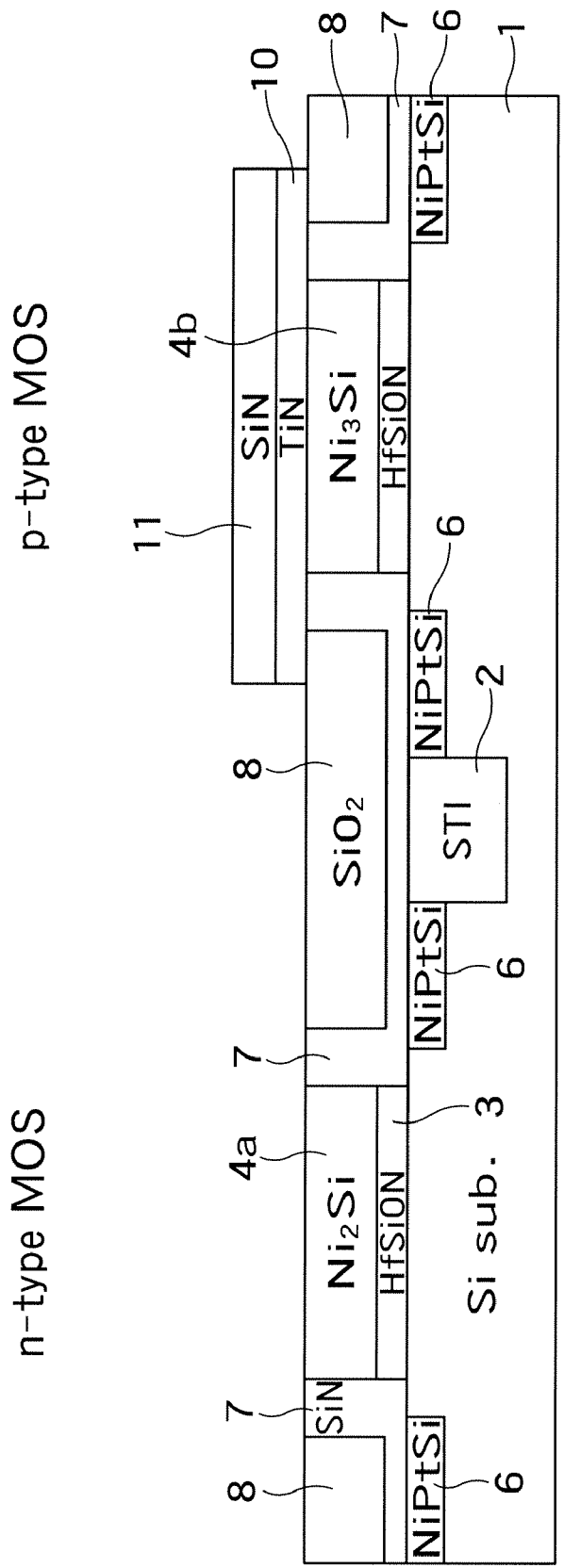
FIG. 3A is a cross-sectional view of the n-type MOSFET and the p-type MOSFET in a step of the method of manufacturing a semiconductor device according to the First embodiment of the present invention.
Figure 3B:
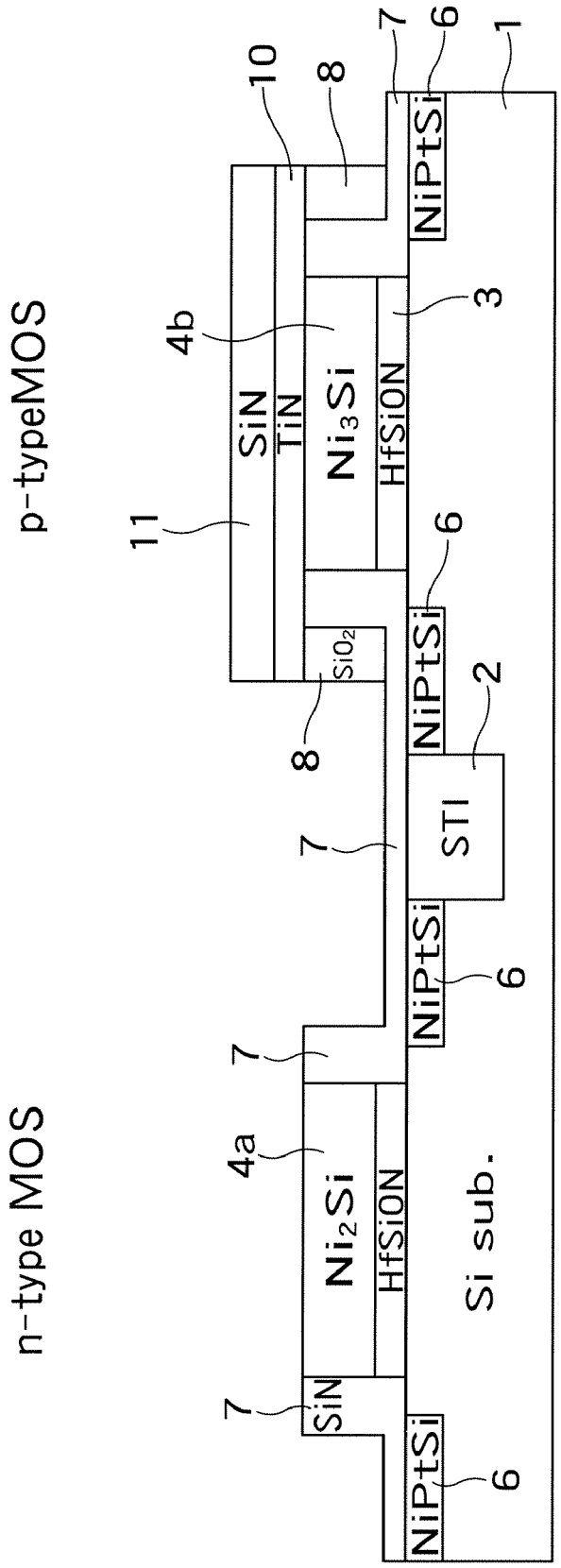
FIG. 3B is a cross-sectional view of the n-type MOSFET and the p-type MOSFET in a step of the method of manufacturing a semiconductor device according to the First embodiment of the present invention.

After the silicide gate electrodes ($Ni_2Si$ film 4a and $Ni_3Si$ layer 4b) are formed through the steps shown in FIGS. 2A to 2I (FIG. 3A), the $SiO_2$ film 8 is removed by RIE (FIG. 3B).

Figure 3C:
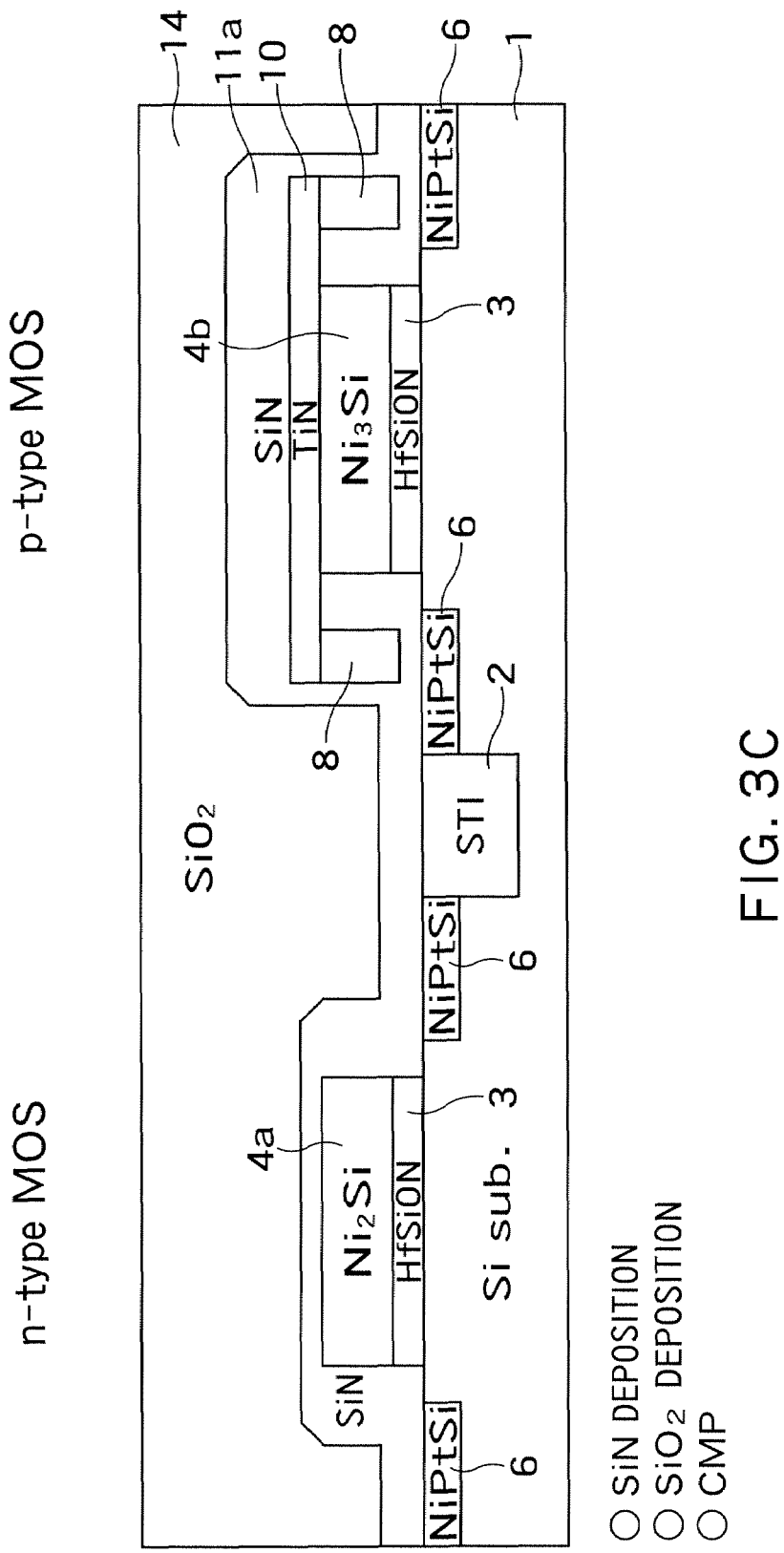
FIG. 3C is a cross-sectional view of the n-type MOSFET and the p-type MOSFET in a step of the method of manufacturing a semiconductor device according to the First embodiment of the present invention.

Then, a SiN film 11a is formed by PCVD using $SiH_4$, $NH_3$ or the like. Then, using TEOS or the like, an interlayer insulating $SiO_2$ layer 14 is deposited over the entire surface. Then, the interlayer insulating $SiO_2$ layer 14 is planarized by CMP (FIG. 3C).

Figure 3D:
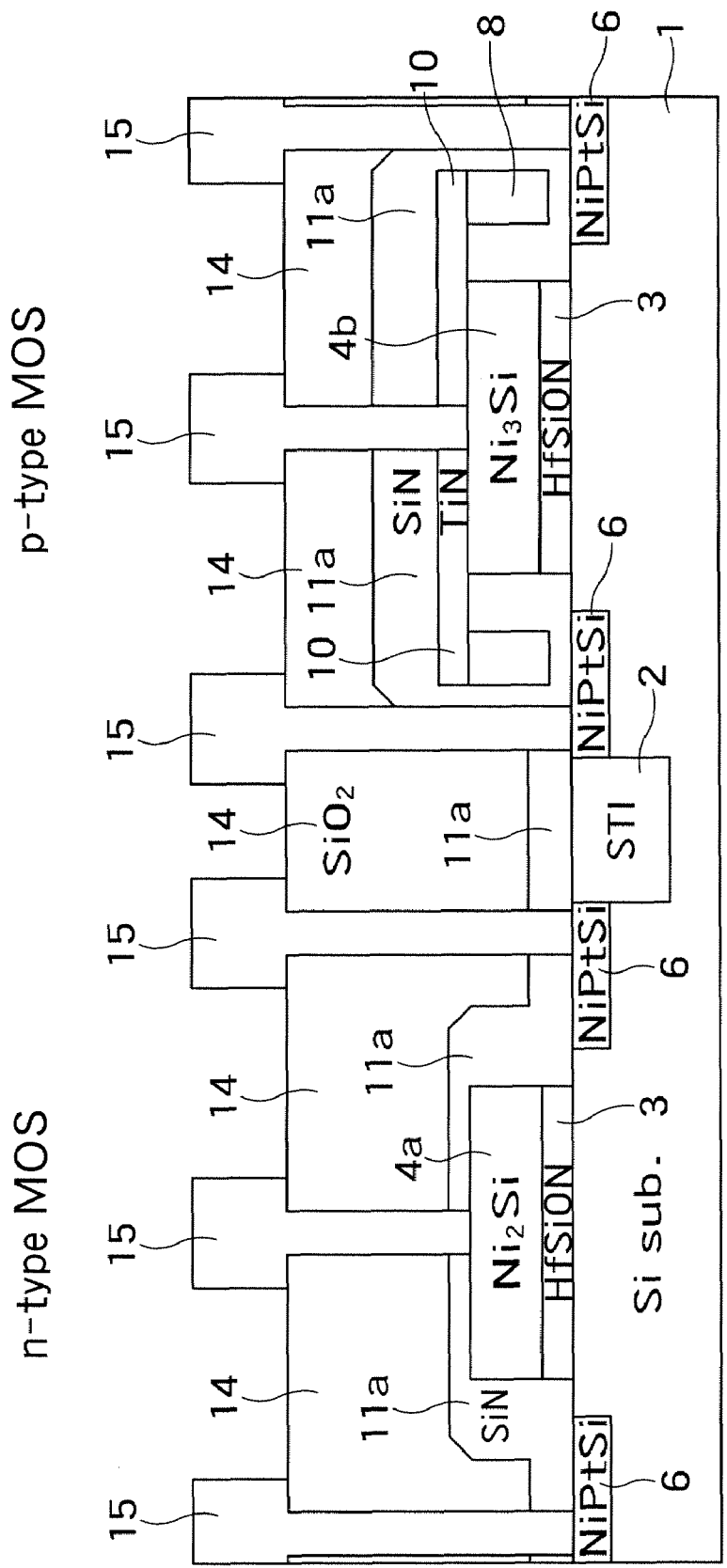
FIG. 3D is a cross-sectional view of the n-type MOSFET and the p-type MOSFET in a step of the method of manufacturing a semiconductor device according to the First embodiment of the present invention.

Then, contact holes extending to source and drain regions (NiPtSi layer 6) and the gate electrodes ($Ni_2Si$ film 4a and $Ni_3Si$ layer 4b) are formed in the interlayer insulating $SiO_2$ layer 14 and filled with a metal, such as W. In this way, a wiring layer 15 (Al/TiN/Ti layer or Cu/TiN/Ti layer, for example) that connects the source and drain regions (NiPtSi layer 6) and the gate electrodes ($Ni_2Si$ film 4a and $Ni_3Si$ layer 4b) to other circuit components is formed (FIG. 3D).

After that, second and subsequent wiring layers are formed to complete the LSI.

As described above, according to the method of manufacturing a semiconductor device according to the First embodiment, the p-type MOSFET and the n-type MOSFET can have different desired thresholds.

In the First embodiment described above, the first metal containing layer is thicker than the third metal containing layer. However, if the third metal containing layer is thicker than the first metal containing layer, the p-type MOSFET and the n-type MOSFET can have different desired thresholds.

Second Embodiment

In the First embodiment, there has been described a method of manufacturing a semiconductor device that involves converting a gate electrode layer into a silicide and ion-implanting Al into the gate electrode layer in order to shift the threshold voltage of an n-type MOSFET.

In a second embodiment, there will be described a method of manufacturing a semiconductor device that involves converting a gate electrode layer into a silicide and making an Al film formed by sputtering method diffuse into the gate electrode layer.

The method of manufacturing a semiconductor device according to the second embodiment includes the same steps as those of the method according to the First embodiment shown in FIGS. 1A to 1I.

In the following, structures of gate electrode regions of a p-type MOSFET and an n-type MOSFET will be described. FIGS. 4A to 4G are cross-sectional views of essential parts of a p-type MOSFET region and an n-type MOSFET region (gate electrode regions) in steps of the method of manufacturing a semiconductor device according to the second embodiment of the present invention. The step shown in FIG. 4A corresponds to the step shown in FIG. 1I. In the drawings, the same reference numerals as those in the First embodiment denote the same parts as those in the First embodiment.

First, a HfSiON film 3 and a polysilicon layer 4 are formed through the steps shown in FIGS. 1A to 1I (FIG. 4A), and then, a Ni film 9 and a TiN film 10 are successively formed on the polysilicon layer 4 by sputtering. That is, the Ni film 9, which is a first metal containing layer, is formed on the gate electrode layers (polysilicon layers 4) in the p-type MOSFET region and the n-type MOSFET region, and the TiN film 10, which is a second metal containing layer for preventing diffusion of the metal (Ni) contained in the first metal containing layer, is formed on the first metal containing layer.

As in the First embodiment, instead of Ni, the first metal containing layer may contain any of Co, Pt, Ti, Hf, Zr, Al and La or an alloy containing any of Ni, Co, Pt, Ti, Hf, Zr, Al and La.

As in the First embodiment, instead of TiN, the second metal containing layer may contain any of W, WN, TaN, HfN, ZrN, TaC and MoN or an alloy containing any of TiN, W, WN, TaN, HfN, ZrN, TaC and MoN.

Then, a SiN film 11 is formed on the TiN film 10 by PCVD, for example. That is, the SiN film 11, which serves as a protective film, is formed on the TiN film 10, which is the second metal containing layer.

Then, the upper surface of the SiN film 11 in the p-type MOSFET region is covered with a resist 12 by photolithography, and the upper surface of the SiN film 11 in the n-type MOSFET region is exposed (FIG. 4B).

Then, the SiN film 11 in the n-type MOSFET region is selectively removed by RIE using the resist 12 as a mask (FIG. 4C).

Instead of SiN, which is resistant to a mixture of sulfuric acid and hydrogen peroxide, the protective film may be made of SiON, GeN, GeON, a mixture thereof, or any of HfSiON, ZrSiON, SiBN, TiSiON and AlSiON, which are also resistant to a mixture of sulfuric acid and hydrogen peroxide.

Figure 4D:
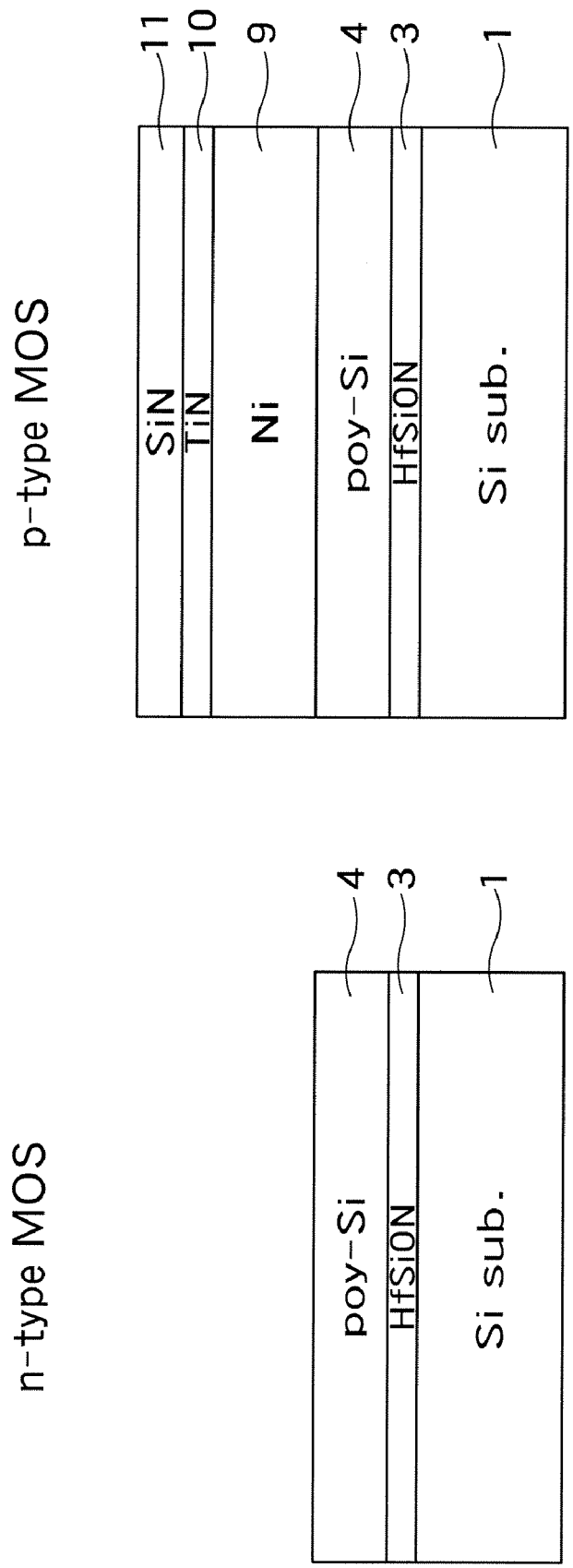
FIG. 4D is a cross-sectional view of essential parts of a p-type MOSFET region and an n-type MOSFET region (gate electrode regions) in a step of the method of manufacturing a semiconductor device according to the second embodiment of the present invention.

Then, the TiN film 10 and the Ni film 9 in the n-type MOSFET region and the resist 12 in the p-type MOSFET region are removed by a mixture of sulfuric acid and hydrogen peroxide (FIG. 4D). As a result, the upper surface of the polysilicon layer 4 in the n-type MOSFET region is exposed.

That is, using the remaining protective film (SiN film 11) as a mask, the first metal containing layer (Ni film 9) and the second metal containing layer (TiN film 10) in the region from which the protective film is selectively removed (n-type MOSFET region) are selectively removed with a mixture of sulfuric acid and hydrogen peroxide.

As in the First embodiment, since the protective film (SiN film 11) is resistant to the mixture of sulfuric acid and hydrogen peroxide, the mixture of sulfuric acid and hydrogen peroxide can be used as an etchant. Compared with a case of using a mixture of hydrochloric acid an hydrogen peroxide, for example, the first metal containing layer (Ni film 9) and the second metal containing layer (TiN film 10) can be removed easily.

Then, an Al film 16 and a Ni film 213 are formed by sputtering on the SiN film 11 in the p-type MOSFET region and the polysilicon layer 4 in the n-type MOSFET region (FIG. 4E). That is, on the gate electrode layer (polysilicon layer 4) in the n-type MOSFET region from which the first metal containing layer and the second metal containing layer are selectively removed, a third metal containing layer (Ni film 213) having a thickness differing from that of the first metal containing layer (Ni film 9) is formed with the Al film 16 interposed therebetween.

In this embodiment, the third metal containing layer is formed in such a manner that the ratio of the thickness of the first metal containing layer (Ni film 9) to the thickness of the third metal containing layer (Ni film 213) is three to two. The Al film 16 has a thickness of about 0.3 nm to 10 nm, for example. The Al film 16 is effective even if the thickness is greater than the range.

As in the First embodiment, instead of Ni, the third metal containing layer may contain any of Co, Pt, Ti, Hf, Zr, Al and La or an alloy containing any of Ni, Co, Pt, Ti, Hf, Zr, Al and La.

If the metal or alloy contained in the third metal containing layer is different from that contained in the first metal containing layer, the third metal containing layer can have a thickness equal to that of the first metal containing layer.

Furthermore, instead of the Al film 16 formed by sputtering, a film of a metal selected from among Ni, Co, Pt, Ti, Hf, Zr, Y, La, Ta, In, Ga, Tl and W can be formed on the polysilicon layer 4 by sputtering. In this case, the metal to be sputtered has to be different from the metal contained in the third metal containing layer.

Then, RTA is performed at a temperature of 500 degrees C. for 30 seconds, for example, thereby converting the polysilicon layer 4 into a silicide (alloy). As a result, a $Ni_2Si$ layer 204a is formed as a gate electrode of the n-type MOSFET region, and a $Ni_3Si$ layer 204b is formed as a gate electrode of the p-type MOSFET region. The RTA also causes segregation to make Al of the Al film 16 previously formed by sputtering method diffuse into the $Ni_2Si$ film 204a to the interface between the HfSiON film 3 and the $Ni_2Si$ film 204a (in other words, the interface between the gate insulating film and the gate electrode) (FIG. 4F).

Specifically, the thermal processing causes reaction between the metal (Ni) contained in the first metal containing layer (Ni film 9) and the gate electrode layer (polysilicon layer 4) in the p-type MOSFET region to convert the gate electrode layer into an alloy. In addition, the thermal processing causes reaction between the metal (Ni) contained in the third metal containing layer (Ni film 213) and the gate electrode layer (polysilicon layer 4) in the n-type MOSFET region to convert the gate electrode layer into an alloy and form a gate electrode of a different composition. Since the Ni film 9 and the Ni film 213 have different thicknesses as described above, the resulting silicides have different compositions.

As in the First embodiment, in this way, the gate electrode of the n-type MOSFET region and the gate electrode of the p-type MOSFET region have different compositions. Thus, at this point, the n-type MOSFET and the p-type MOSFET have different thresholds.

Compared with a case where the Al film 16 is not formed, the threshold of the n-type MOSFET can be significantly changed.

Figure 4G:
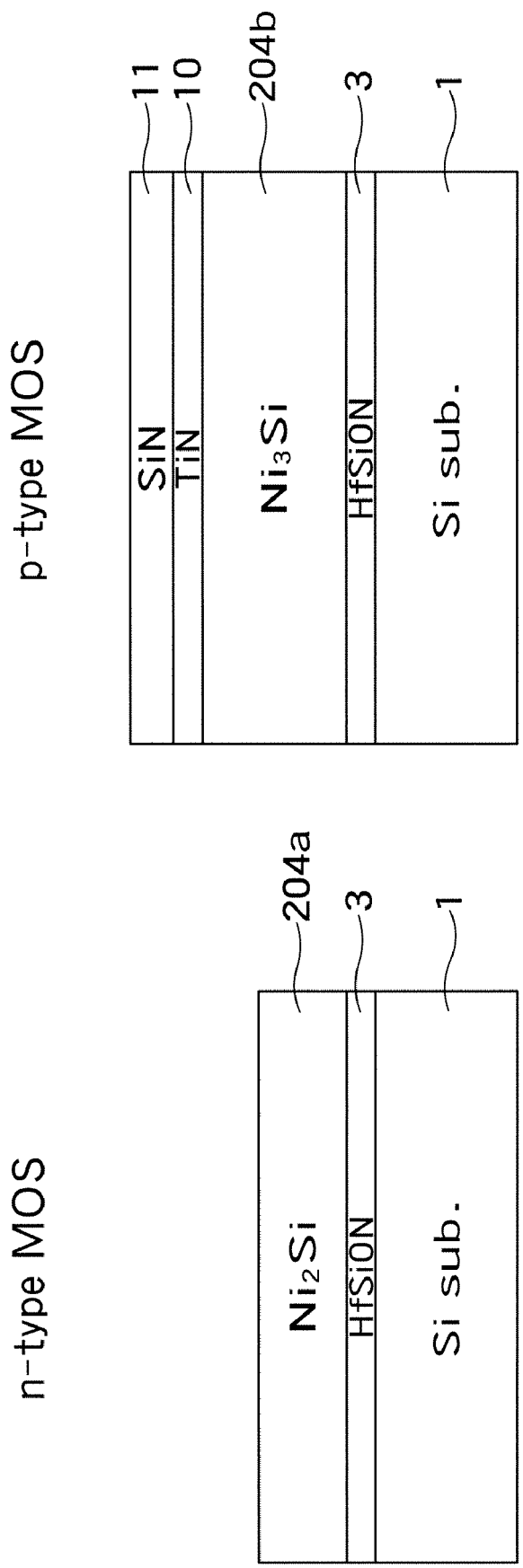
FIG. 4G is a cross-sectional view of essential parts of a p-type MOSFET region and an n-type MOSFET region (gate electrode regions) in a step of the method of manufacturing a semiconductor device according to the second embodiment of the present invention.

Then, the Ni film 213 in the p-type MOSFET region is removed by a mixture of sulfuric acid and hydrogen peroxide (FIG. 4G).

The process of installing wiring of the n-type MOSFET and the p-type MOSFET having the gate electrodes formed as described above to complete an LSI is the same as that according to the First embodiment shown in FIGS. 3A to 3D. The step shown in FIG. 3A corresponds to the step shown in FIG. 4G.

As described above, according to the method of manufacturing a semiconductor device according to this embodiment, the p-type MOSFET and the n-type MOSFET can have different desired thresholds.

Third Embodiment

In the First embodiment, there has been described a method of manufacturing a semiconductor device that involves converting a gate electrode layer into a suicide and making Al diffuse into the gate electrode layer in order to change the threshold of an n-type MOSFET.

In a third embodiment, there will be described a method of manufacturing a semiconductor device that involves converting a gate electrode layer into a silicide and making a Ti film formed by sputtering.

The method of manufacturing a semiconductor device according to the third embodiment includes the same steps as those of the method according to the First embodiment shown in FIGS. 1A to 1I.

In the following, structures of gate electrode regions of a p-type MOSFET and an n-type MOSFET will be described. FIGS. 5A to 5G are cross-sectional views of essential parts of a p-type MOSFET region and an n-type MOSFET region (gate electrode regions) in steps of the method of manufacturing a semiconductor device according to the third embodiment of the present invention. The step shown in FIG. 5A corresponds to the step shown in FIG. 1I. In the drawings, the same reference numerals as those in the embodiments 1 and 2 denote the same parts as those in the embodiments 1 and 2.

First, a HfSiON film 3 and a polysilicon layer 4 are formed through the steps shown in FIGS. 1A to 1I (FIG. 5A), and then, a Ni film 9 and a TiN film 10 are successively formed on the polysilicon layer 4 by sputtering method. That is, the Ni film 9, which is a first metal containing layer, is formed on the gate electrode layers (polysilicon layers 4) in the p-type MOSFET region and the n-type MOSFET region, and the TiN film 10, which is a second metal containing layer for preventing diffusion of the metal (Ni) contained in the first metal containing layer, is formed on the first metal containing layer.

As in the First embodiment, instead of Ni, the first metal containing layer may contain any of Co, Pt, Ti, Hf, Zr, Al and La or an alloy containing any of Ni, Co, Pt, Ti, Hf, Zr, Al and La.

As in the First embodiment, instead of TiN, the second metal containing layer may contain any of W, WN, TaN, HfN, ZrN, TaC and MoN or an alloy containing any of TiN, W, WN, TaN, HfN, ZrN, TaC and MoN.

Then, a SiN film 11 is formed on the TiN film 10 by PCVD, for example. That is, the SiN film 11, which serves as a protective film, is formed on the TiN film 10, which is the second metal containing layer.

Figure 5B:
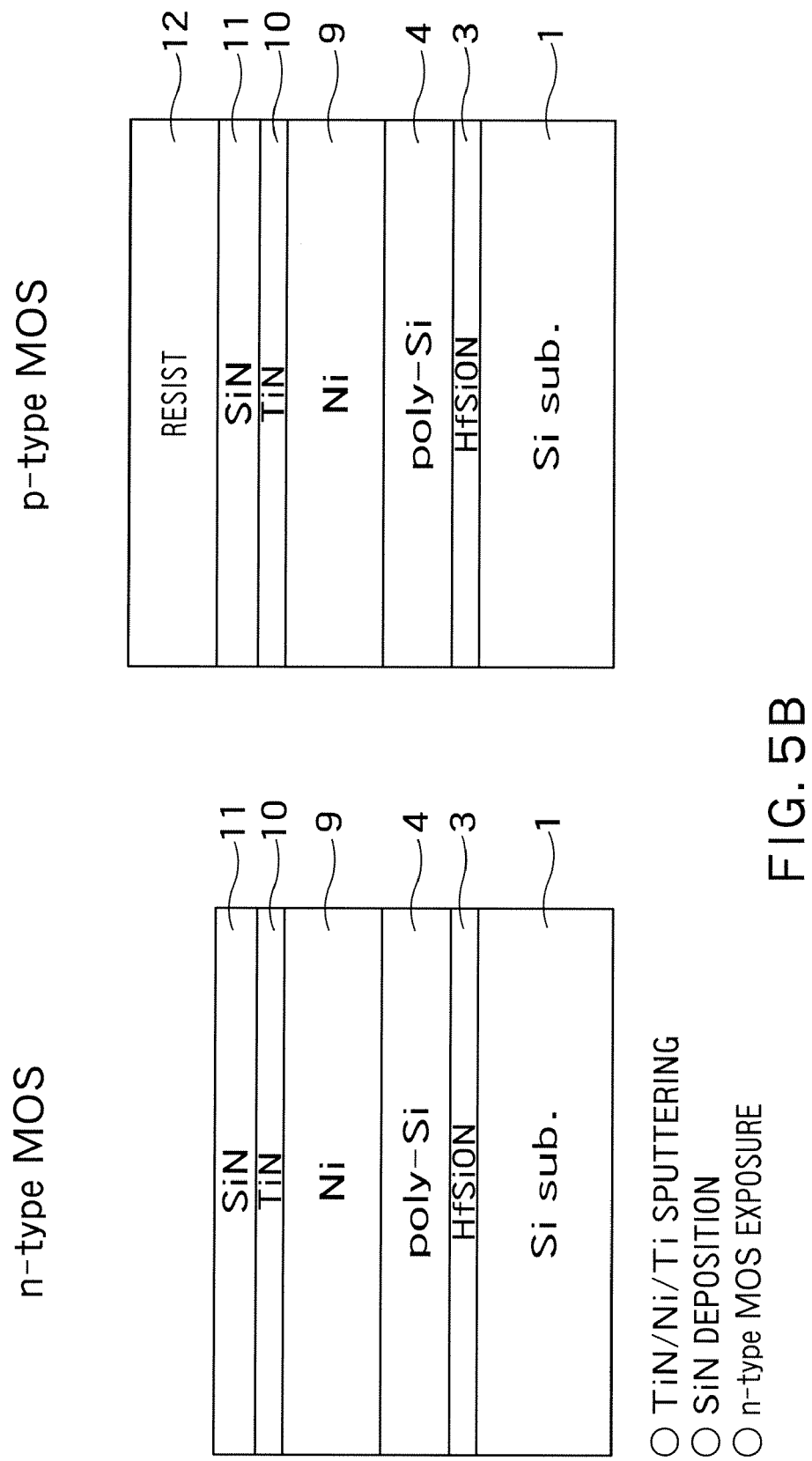
FIG. 5B is a cross-sectional view of essential parts of a p-type MOSFET region and an n-type MOSFET region (gate electrode regions) in a step of the method of manufacturing a semiconductor device according to a third embodiment of the present invention.

Then, the upper surface of the SiN film 11 in the p-type MOSFET region is covered with a resist 12 by photolithography, and the upper surface of the SiN film 11 in the n-type MOSFET region is exposed (FIG. 5B).

Then, the SiN film 11 in the n-type MOSFET region is selectively removed by RIE using the resist 12 as a mask (FIG. 5C).

That is, the protective film (SiN film 11) disposed above the gate electrode layer (polysilicon layer 4) in the n-type MOSFET region is selectively removed.

Instead of SiN, which is resistant to a mixture of sulfuric acid and hydrogen peroxide, the protective film may be made of SiON, GeN, GeON, a mixture thereof, or any of HfSiON, ZrSiON, SiBN, TiSiON and AlSiON, which are also resistant to a mixture of sulfuric acid and hydrogen peroxide.

Figure 5D:
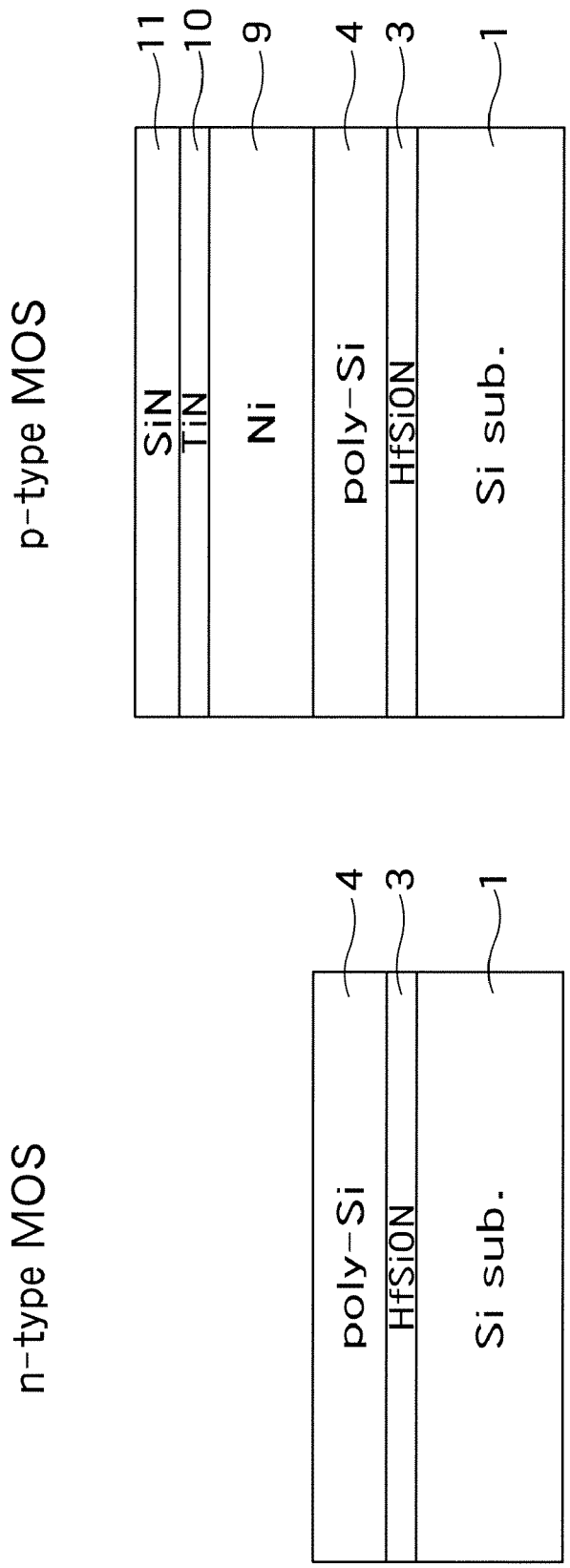
FIG. 5D is a cross-sectional view of essential parts of a p-type MOSFET region and an n-type MOSFET region (gate electrode regions) in a step of the method of manufacturing a semiconductor device according to a third embodiment of the present invention.

Then, the TiN film 10 and the Ni film 9 in the n-type MOSFET region and the resist 12 in the p-type MOSFET region are peeled off with a mixture of sulfuric acid and hydrogen peroxide (FIG. 5D). As a result, the upper surface of the polysilicon layer 4 in the n-type MOSFET region is exposed.

That is, using the remaining protective film (SiN film 11) as a mask, the first metal containing layer (Ni film 9) and the second metal containing layer (TiN film 10) in the region from which the protective film is selectively removed (n-type MOSFET region) are selectively removed with a mixture of sulfuric acid and hydrogen peroxide.

As in the First embodiment, since the protective film (SiN film 11) is resistant to the mixture of sulfuric acid and hydrogen peroxide, the mixture of sulfuric acid and hydrogen peroxide can be used as an etchant. Compared with a case of using a mixture of hydrochloric acid an hydrogen peroxide, for example, the first metal containing layer (Ni film 9) and the second metal containing layer (TiN film 10) can be removed easily.

Then, a Ti film 17 and a Ni film 313 are formed by sputtering on the SiN film 11 in the p-type MOSFET region and the polysilicon layer 4 in the n-type MOSFET region (FIG. 5E). That is, on the gate electrode layer (polysilicon layer 4) from which the first metal containing layer and the second metal containing layer are selectively removed, a third metal containing layer (Ni film 313) having a thickness differing from that of the first metal containing layer (Ni film 9) is formed with the Ti film 17 interposed therebetween.

In this embodiment, the third metal containing layer is formed in such a manner that the ratio of the thickness of the first metal containing layer (Ni film 9) to the thickness of the third metal containing layer (Ni film 313) is six to one. The Ti film 17 has a thickness of about 1 nm to 10 nm, for example. The Ti film 17 interposed between the polysilicon layer 4 and the Ni film 313 makes the speed of silicidation of the n-type MOSFET region described later lower than that of the p-type MOSFET region.

As in the First embodiment, instead of Ni, the third metal containing layer may contain any of Co, Pt, Ti, Hf, Zr, Al and La or an alloy containing any of Ni, Co, Pt, Ti, Hf, Zr, Al and La.

If the metal or alloy contained in the third metal containing layer is different from that contained in the first metal containing layer, the third metal containing layer can have a thickness equal to that of the first metal containing layer.

Figure 5F:
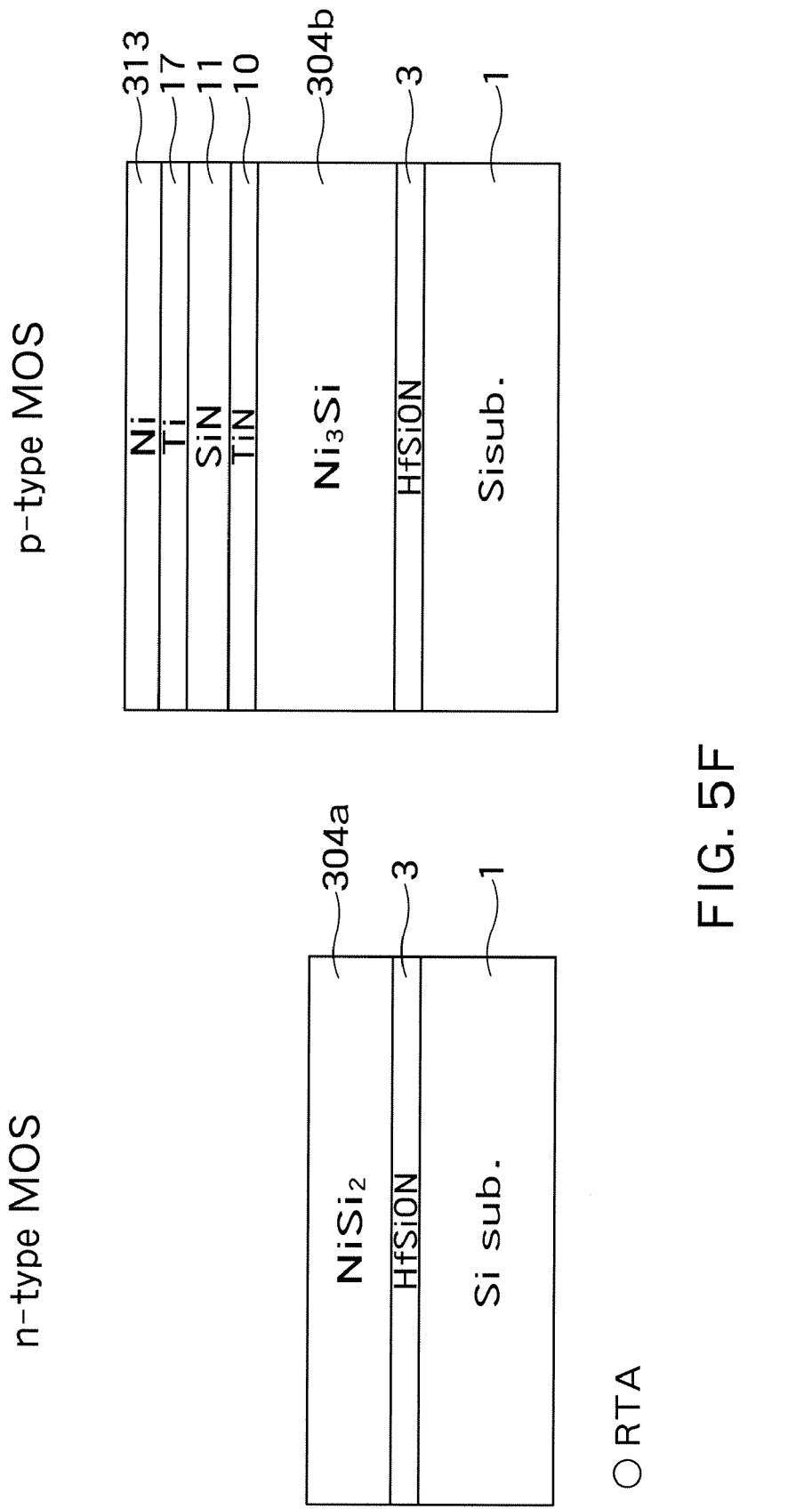
FIG. 5F is a cross-sectional view of essential parts of a p-type MOSFET region and an n-type MOSFET region (gate electrode regions) in a step of the method of manufacturing a semiconductor device according to a third embodiment of the present invention.

Then, RTA is performed at a temperature of 500 degrees C. for 30 seconds, for example, thereby converting the polysilicon layer 4 into a silicide (alloy). As a result, a $NiSi_2$ layer 304a is formed as a gate electrode of the n-type MOSFET region, and a $Ni_3Si$ layer 304b is formed as a gate electrode of the p-type MOSFET region. The RTA may make Ti, which is mostly concentrated at the surface of the $NiSi_2$ film 304a, diffuse into the $NiSi_2$ film 304a (FIG. 5F).

Specifically, the thermal processing causes reaction between the metal (Ni) contained in the first metal containing layer (Ni film 9) and the gate electrode layer (polysilicon layer 4) in the p-type MOSFET region to convert the gate electrode layer into an alloy. In addition, the thermal processing causes reaction between the metal (Ni) contained in the third metal containing layer (Ni film 313) and the gate electrode layer (polysilicon layer 4) in the n-type MOSFET region to convert the gate electrode layer into an alloy and form a gate electrode of a different composition. Since the Ni film 9 and the Ni film 313 have different thicknesses as described above, and the speed of silicidation differs between the Ni film 9 and the Ni film 313, the resulting silicides have different compositions.

As in the First embodiment, in this way, the gate electrode of the n-type MOSFET region and the gate electrode of the p-type MOSFET region have different compositions. Thus, at this point, the n-type MOSFET and the p-type MOSFET have different thresholds.

Then, the Ni film 313 in the p-type MOSFET region is removed by a mixture of sulfuric acid and hydrogen peroxide (FIG. 5G).

The process of installing wiring of the n-type MOSFET and the p-type MOSFET having the gate electrodes formed as described above to complete an LSI is the same as that according to the First embodiment shown in FIGS. 3A to 3D. The step shown in FIG. 3A corresponds to the step shown in FIG. 5G.

As described above, according to the method of manufacturing a semiconductor device according to this embodiment, the p-type MOSFET and the n-type MOSFET can have different desired thresholds.

Fourth Embodiment

In the second embodiment, there has been described a method of manufacturing a semiconductor device that involves converting a gate electrode layer into a silicide and making an Al film formed by sputtering method diffuse into the gate electrode layer in order to change the threshold of an n-type MOSFET.

In a fourth embodiment, there will be described another method of manufacturing a semiconductor device that involves converting a gate electrode layer into a silicide and making an Al film formed by sputtering method diffuse into the gate electrode layer.

The method of manufacturing a semiconductor device according to the fourth embodiment includes the same steps as those of the method according to the First embodiment shown in FIGS. 1A to 1I.

In the following, structures of gate electrode regions of a p-type MOSFET and an n-type MOSFET will be described. FIGS. 6A to 6G are cross-sectional views of essential parts of a p-type MOSFET region and an n-type MOSFET region (gate electrode regions) in steps of the method of manufacturing a semiconductor device according to the fourth embodiment of the present invention. The step shown in FIG. 6A corresponds to the step shown in FIG. 1I. In the drawings, the same reference numerals as those in the embodiments 1 and 2 denote the same parts as those in the embodiments 1 and 2.

First, a HfSiON film 3 and a polysilicon layer 4 are formed through the steps shown in FIGS. 1A to 1I (FIG. 6A), and then, an Al film 16, a Ni film 409 and a TiN film 10 are successively formed on the polysilicon layer 4 by sputtering method. That is, the Ni film 409, which is a first metal containing layer, is formed on the gate electrode layers (polysilicon layers 4) in the p-type MOSFET region and the n-type MOSFET region with the Al film 16 interposed therebetween, and the TiN film 10, which is a second metal containing layer for preventing diffusion of the metal (Ni) contained in the first metal containing layer, is formed on the first metal containing layer.

Instead of Ni, the first metal containing layer may contain any of Co, Pt, Ti, Hf, Zr and La or an alloy containing any of Ni, Co, Pt, Ti, Hf, Zr, Al and La.

As in the First embodiment, instead of TiN, the second metal containing layer may contain any of W, WN, TaN, HfN, ZrN, TaC and MoN or an alloy containing any of TiN, W, WN, TaN, HfN, ZrN, TaC and MoN.

Then, a SiN film 11 is formed on the TiN film 10 by PCVD, for example. That is, the SiN film 11, which serves as a protective film, is formed on the TiN film 10, which is the second metal containing layer.

Then, the upper surface of the SiN film 11 in the n-type MOSFET region is covered with a resist 412 by photolithography, and the upper surface of the SiN film 11 in the p-type MOSFET region is exposed (FIG. 6B).

Then, the SiN film 11 in the p-type MOSFET region is selectively removed by RIE using the resist 412 as a mask (FIG. 6C).

That is, the protective film (SiN film 11) disposed above the gate electrode layer (polysilicon layer 4) in the p-type MOSFET region is selectively removed.

As in the First embodiment, instead of SiN, which is resistant to a mixture of sulfuric acid and hydrogen peroxide, the protective film may be made of SiON, GeN, GeON, a mixture thereof, or any of HfSiON, ZrSiON, SiBN, TiSiON and AlSiON, which are also resistant to a mixture of sulfuric acid and hydrogen peroxide.

Figure 6D:
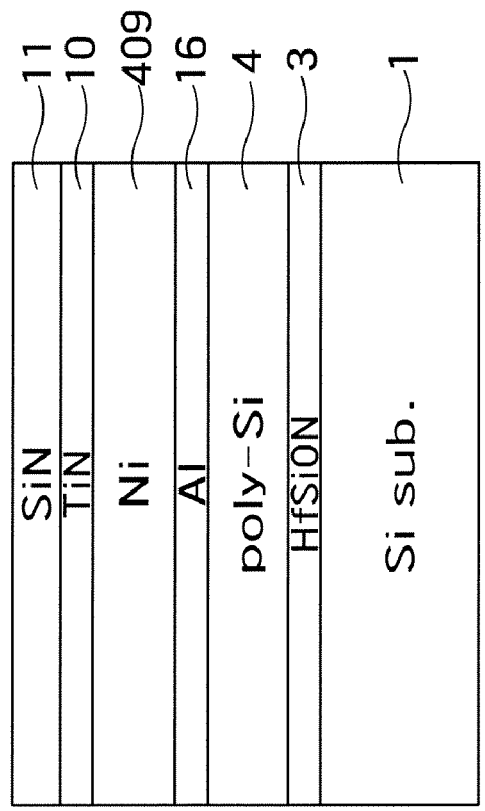
FIG. 6D is a cross-sectional view of essential parts of a p-type MOSFET region and an n-type MOSFET region (gate electrode regions) in a step of the method of manufacturing a semiconductor device according to the fourth embodiment of the present invention.

Then, the TiN film 10 and the Ni film 409 in the p-type MOSFET region and the resist 412 in the n-type MOSFET region are removed by a mixture of sulfuric acid and hydrogen peroxide (FIG. 6D). As a result, the upper surface of the polysilicon layer 4 in the p-type MOSFET region is exposed.

That is, using the remaining protective film (SiN film 11) as a mask, the first metal containing layer (Ni film 409) and the second metal containing layer (TiN film 10) in the region from which the protective film is selectively removed (p-type MOSFET region) are selectively removed with a mixture of sulfuric acid and hydrogen peroxide.

As in the First embodiment, since the protective film (SiN film 11) is resistant to the mixture of sulfuric acid and hydrogen peroxide, the mixture of sulfuric acid and hydrogen peroxide can be used as an etchant. Compared with a case of using a mixture of hydrochloric acid an hydrogen peroxide, for example, the first metal containing layer (Ni film 409) and the second metal containing layer (TiN film 10) can be removed easily.

Then, a Ni film 413 are formed by sputtering method on the SiN film 11 in the n-type MOSFET region and the polysilicon layer 4 in the p-type MOSFET region (FIG. 6E). That is, on the gate electrode layer (polysilicon layer 4) in the p-type MOSFET region from which the first metal containing layer and the second metal containing layer are selectively removed, a third metal containing layer (Ni film 413) having a thickness differing from that of the first metal containing layer (Ni film 409) is formed.

In this embodiment, the third metal containing layer is formed in such a manner that the ratio of the thickness of the first metal containing layer (Ni film 409) to the thickness of the third metal containing layer (Ni film 413) is two to three. The Al film 16 has a thickness of about 0.3 nm to 10 nm, for example.

As in the First embodiment, instead of Ni, the third metal containing layer may contain any of Co, Pt, Ti, Hf, Zr, Al and La or an alloy containing any of Ni, Co, Pt, Ti, Hf, Zr, Al and La.

If the metal or alloy contained in the third metal containing layer is different from that contained in the first metal containing layer, the third metal containing layer can have a thickness equal to that of the first metal containing layer.

Furthermore, instead of the Al film 16 formed by sputtering, a film of a metal selected from among Ni, Co, Pt, Ti, Hf, Zr, Y, La, Ta, In, Ga, Tl and W can be formed on the polysilicon layer 4 by sputtering method. In this case, the metal to be sputtered has to be different from the metal contained in the first metal containing layer.

Figure 6F:
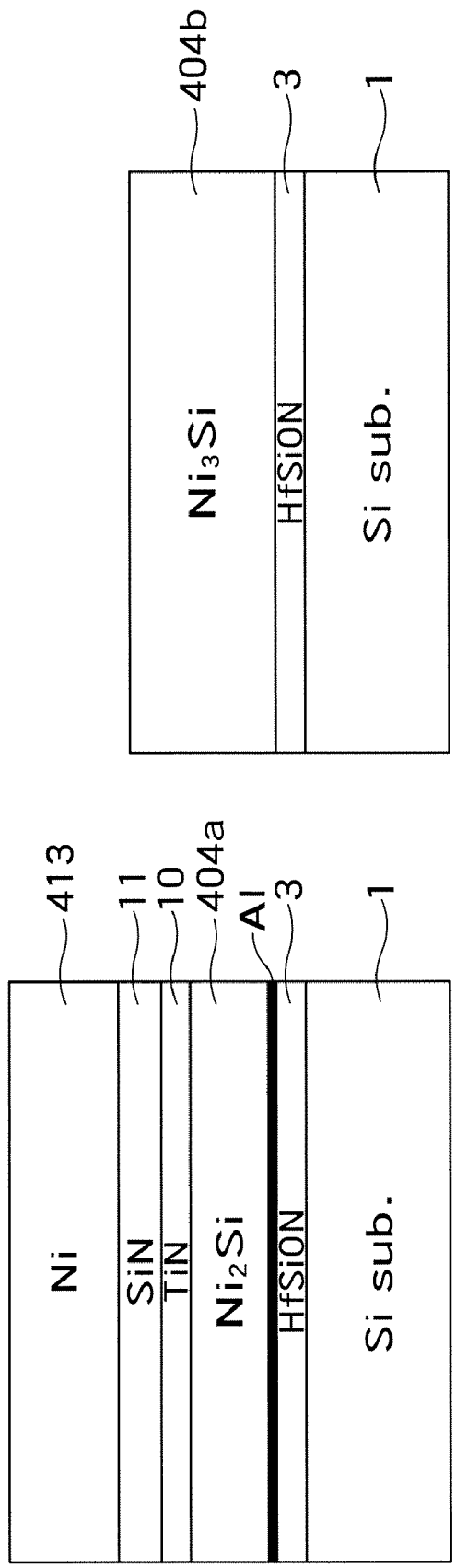
FIG. 6F is a cross-sectional view of essential parts of a p-type MOSFET region and an n-type MOSFET region (gate electrode regions) in a step of the method of manufacturing a semiconductor device according to the fourth embodiment of the present invention.

Then, RTA is performed at a temperature of 500 degrees C. for 30 seconds, for example, thereby converting the polysilicon layer 4 into a silicide (alloy). As a result, a $Ni_2Si$ layer 404a is formed as a gate electrode of the n-type MOSFET region, and a $Ni_3Si$ layer 404b is formed as a gate electrode of the p-type MOSFET region. The RTA also causes segregation to make Al of the Al film 16 previously formed by sputtering method diffuse into the $Ni_2Si$ film 404a to the interface between the HfSiON film 3 and the $Ni_2Si$ film 404a (in other words, the interface between the gate insulating film and the gate electrode) (FIG. 6F).

Since the Ni film 409 and the Ni film 413 have different thicknesses as described above, the gate electrode layers resulting from the silicidation have different compositions.

As in the First embodiment, in this way, the gate electrode of the n-type MOSFET region and the gate electrode of the p-type MOSFET region have different compositions. Thus, at this point, the n-type MOSFET and the p-type MOSFET have different thresholds.

Compared with a case where the Al film 16 is not formed, the threshold of the n-type MOSFET can be significantly changed.

Figure 6G:
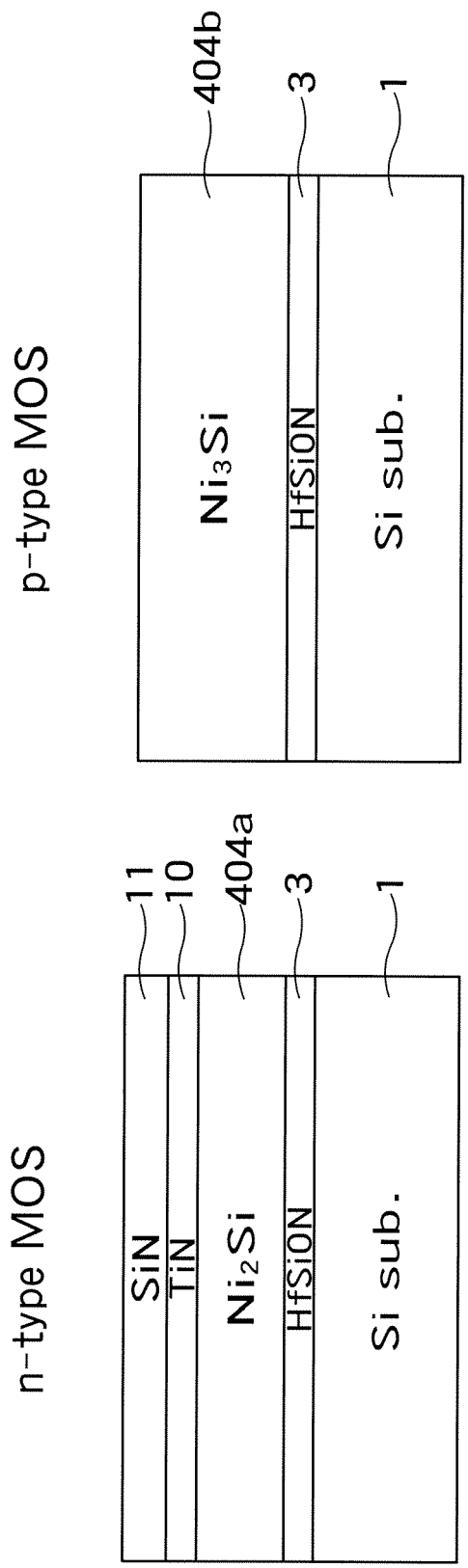
FIG. 6G is a cross-sectional view of essential parts of a p-type MOSFET region and an n-type MOSFET region (gate electrode regions) in a step of the method of manufacturing a semiconductor device according to the fourth embodiment of the present invention.

Then, the Ni film 413 in the n-type MOSFET region is removed by a mixture of sulfuric acid and hydrogen peroxide (FIG. 6G).

The process of installing wiring of the n-type MOSFET and the p-type MOSFET having the gate electrodes formed as described above to complete an LSI is the same as that according to the First embodiment shown in FIGS. 3A to 3D.

As described above, according to the method of manufacturing a semiconductor device according to this embodiment, the p-type MOSFET and the n-type MOSFET can have different desired thresholds.

Fifth Embodiment

In the third embodiment, there has been described a method of manufacturing a semiconductor device that involves converting a gate electrode layer into a silicide and making a Ti film formed by sputtering method diffuse into the gate electrode layer in order to change the threshold of an n-type MOSFET.

In a fifth embodiment, there will be described another method of manufacturing a semiconductor device that involves converting a gate electrode layer into a silicide and making a Ti film formed by sputtering method.

The method of manufacturing a semiconductor device according to the fifth embodiment includes the same steps as those of the method according to the First embodiment shown in FIGS. 1A to 1I.

In the following, structures of gate electrode regions of a p-type MOSFET and an n-type MOSFET will be described. FIGS. 7A to 7G are cross-sectional views of essential parts of a p-type MOSFET region and an n-type MOSFET region (gate electrode regions) in steps of the method of manufacturing a semiconductor device according to the fifth embodiment of the present invention. The step shown in FIG. 7A corresponds to the step shown in FIG. 1I. In the drawings, the same reference numerals as those in the embodiments 1 and 3 denote the same parts as those in the embodiments 1 and 3.

First, a HfSiON film 3 and a polysilicon layer 4 are formed through the steps shown in FIGS. 1A to 1I (FIG. 7A), and then, a Ti film 17, a Ni film 509 and a TiN film 10 are successively formed on the polysilicon layer 4 by sputtering method. That is, the Ni film 509, which is a first metal containing layer, is formed on the gate electrode layers (polysilicon layers 4) in the p-type MOSFET region and the n-type MOSFET region with the Ti film 17 interposed therebetween, and the TiN film 10, which is a second metal containing layer for preventing diffusion of the metal (Ni) contained in the first metal containing layer, is formed on the first metal containing layer.

As in the First embodiment, instead of Ni, the first metal containing layer may contain any of Co, Pt, Ti, Hf, Zr, Al and La or an alloy containing any of Ni, Co, Pt, Ti, Hf, Zr, Al and La.

As in the First embodiment, instead of TiN, the second metal containing layer may contain any of W, WN, TaN, HfN, ZrN, TaC and MoN or an alloy containing any of TiN, W, WN, TaN, HfN, ZrN, TaC and MoN.

Then, a SiN film 11 is formed on the TiN film 10 by PCVD, for example. That is, the SiN film 11, which serves as a protective film, is formed on the TiN film 10, which is the second metal containing layer.

Then, the upper surface of the SiN film 11 in the n-type MOSFET region is covered with a resist 512 by photolithography, and the upper surface of the SiN film 11 in the p-type MOSFET region is exposed (FIG. 7B).

Then, the SiN film 11 in the p-type MOSFET region is selectively removed by RIE using the resist 512 as a mask (FIG. 7C).

That is, the protective film (SiN film 11) disposed above the gate electrode layer (polysilicon layer 4) in the p-type MOSFET region is selectively removed.

Instead of SiN, which is resistant to a mixture of sulfuric acid and hydrogen peroxide, the protective film may be made of SiON, GeN, GeON, a mixture thereof, or any of HfSiON, ZrSiON, SiBN, TiSiON and AlSiON, which are also resistant to a mixture of sulfuric acid and hydrogen peroxide.

Then, the TiN film 10, the Ni film 509 and Ti film 17 in the p-type MOSFET region and the resist 512 in the n-type MOSFET region are removed by a mixture of sulfuric acid and hydrogen peroxide (FIG. 7D). As a result, the upper surface of the polysilicon layer 4 in the p-type MOSFET region is exposed.

That is, using the remaining protective film (SiN film 11) as a mask, the first metal containing layer (Ni film 509) and the second metal containing layer (TiN film 10) in the region from which the protective film is selectively removed (p-type MOSFET region) are selectively removed with a mixture of sulfuric acid and hydrogen peroxide.

As in the First embodiment, since the protective film (SiN film 11) is resistant to the mixture of sulfuric acid and hydrogen peroxide, the mixture of sulfuric acid and hydrogen peroxide can be used as an etchant. Compared with a case of using a mixture of hydrochloric acid an hydrogen peroxide, for example, the first metal containing layer (Ni film 509) and the second metal containing layer (TiN film 10) can be removed easily.

Figure 7E:
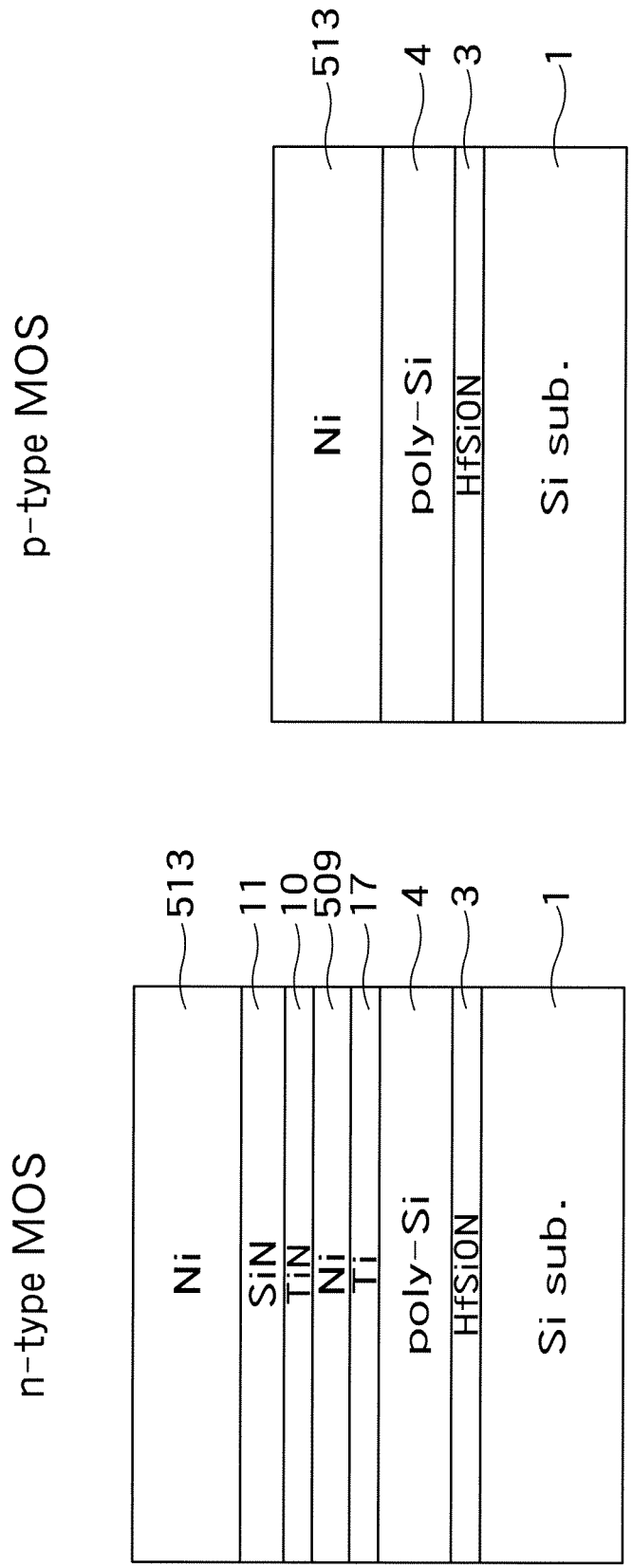
FIG. 7E is a cross-sectional view of essential parts of a p-type MOSFET region and an n-type MOSFET region (gate electrode regions) in a step of the method of manufacturing a semiconductor device according to the fifth embodiment of the present invention.

Then, a Ni film 513 is formed by sputtering method on the SiN film 11 in the p-type MOSFET region and the polysilicon layer 4 in the n-type MOSFET region (FIG. 7E). That is, on the gate electrode layer (polysilicon layer 4) in the p-type MOSFET region from which the first metal containing layer and the second metal containing layer are selectively removed, a third metal containing layer (Ni film 513) having a thickness differing from that of the first metal containing layer (Ni film 509) is formed.

In this embodiment, the third metal containing layer is formed in such a manner that the ratio of the thickness of the first metal containing layer (Ni film 509) to the thickness of the third metal containing layer (Ni film 513) is one to six. The Ti film 17 has a thickness of about 1 nm to 10 nm, for example. The Ti film 17 interposed between the polysilicon layer 4 and the Ni film 509 makes the speed of silicidation of the n-type MOSFET region described later lower than that of the p-type MOSFET region.

As in the First embodiment, instead of Ni, the third metal containing layer may contain any of Co, Pt, Ti, Hf, Zr, Al and La or an alloy containing any of Ni, Co, Pt, Ti, Hf, Zr, Al and La.

If the metal or alloy contained in the third metal containing layer is different from that contained in the first metal containing layer, the third metal containing layer can have a thickness equal to that of the first metal containing layer.

Furthermore, instead of the Ti film 17 formed by sputtering method, a film of a metal selected from among Ni, Co, Pt, Hf, Zr, Y, La, Ta, In, Ga, Tl and W can be formed on the polysilicon layer 4 by sputtering method. In this case, the metal to be sputtered has to be different from the metal contained in the first metal containing layer.

Figure 7F:
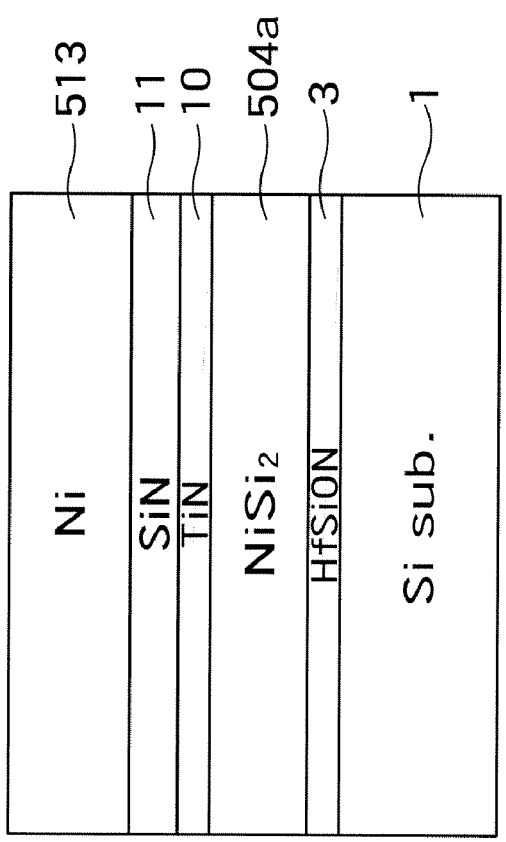
FIG. 7F is a cross-sectional view of essential parts of a p-type MOSFET region and an n-type MOSFET region (gate electrode regions) in a step of the method of manufacturing a semiconductor device according to the fifth embodiment of the present invention.

Then, RTA is performed at a temperature of 500 degrees C. for 30 seconds, for example, thereby converting the polysilicon layer 4 into a silicide (alloy). As a result, a NiSi$_2$ layer 504a is formed as a gate electrode of the n-type MOSFET region, and a Ni$_3$Si layer 504b is formed as a gate electrode of the p-type MOSFET region (FIG. 7F).

Specifically, the thermal processing causes reaction between the metal (Ni) contained in the first metal containing layer (Ni film 509) and the gate electrode layer (polysilicon layer 4) in the n-type MOSFET region to convert the gate electrode layer into an alloy. In addition, the thermal processing causes reaction between the metal (Ni) contained in the third metal containing layer (Ni film 513) and the gate electrode layer (polysilicon layer 4) in the p-type MOSFET region to convert the gate electrode layer into an alloy and form a gate electrode of a different composition. Since the Ni film 509 and the Ni film 513 have different thicknesses as described above, and the speed of silicidation differs between the Ni film 509 and the Ni film 513, the resulting silicides have different compositions.

As in the First embodiment, in this way, the gate electrode of the n-type MOSFET region and the gate electrode of the p-type MOSFET region have different compositions. Thus, at this point, the n-type MOSFET and the p-type MOSFET have different thresholds.

Figure 7G:
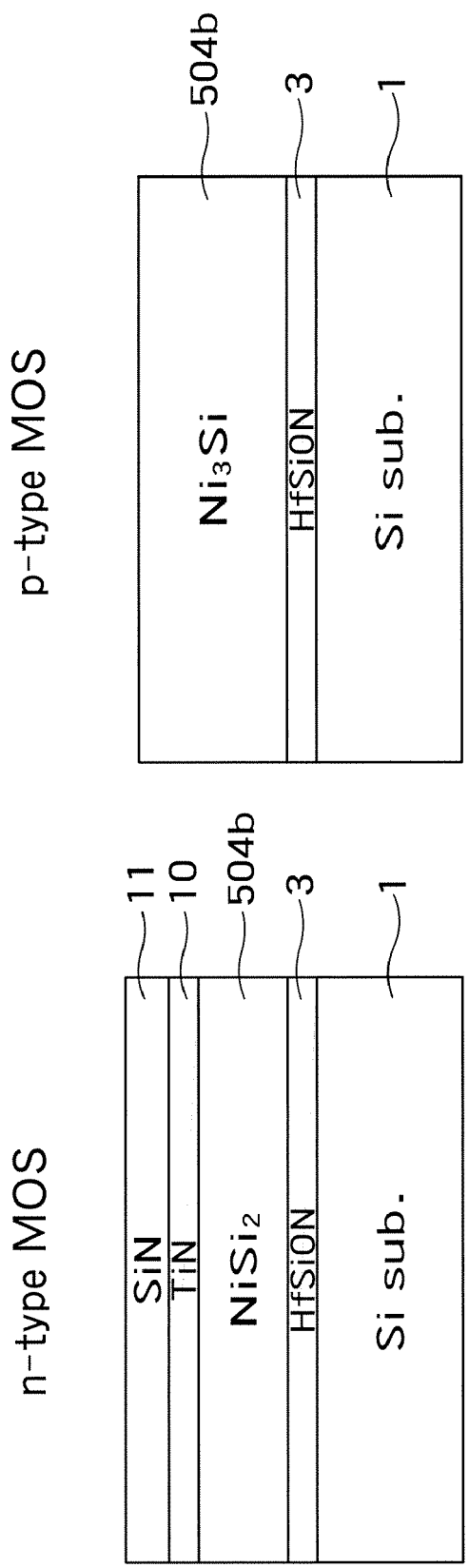
FIG. 7G is a cross-sectional view of essential parts of a p-type MOSFET region and an n-type MOSFET region (gate electrode regions) in a step of the method of manufacturing a semiconductor device according to the fifth embodiment of the present invention.

Then, the Ni film 513 in the p-type MOSFET region is removed by a mixture of sulfuric acid and hydrogen peroxide (FIG. 7G).

The process of installing wiring of the n-type MOSFET and the p-type MOSFET having the gate electrodes formed as described above to complete an LSI is the same as that according to the First embodiment shown in FIGS. 3A to 3D. The step shown in FIG. 3A corresponds to the step shown in FIG. 7G.

As described above, according to the method of manufacturing a semiconductor device according to this embodiment, the p-type MOSFET and the n-type MOSFET can have different desired thresholds.

Sixth Embodiment

In the First embodiment, there has been described a method of manufacturing a semiconductor device that involves simultaneously converting gate electrode layers into a silicide in order to change the thresholds of an n-type MOSFET and a p-type MOSFET.

In a sixth embodiment, there will be described a method of manufacturing a semiconductor device that involves separately converting a gate electrode layer of an n-type MOSFET and a gate electrode layer of a p-type MOSFET into a silicide.

The method of manufacturing a semiconductor device according to the sixth embodiment includes the same steps as those of the method according to the First embodiment shown in FIGS. 1A to 1I.

In the following, structures of gate electrode regions of a p-type MOSFET and an n-type MOSFET will be described. FIGS. 8A to 8J are cross-sectional views of essential parts of a p-type MOSFET region and an n-type MOSFET region (gate electrode regions) in steps of the method of manufacturing a semiconductor device according to the sixth embodiment of the present invention. The step shown in FIG. 8A corresponds to the step shown in FIG. 1I. In the drawings, the same reference numerals as those in the First embodiment denote the same parts as those in the First embodiment.

First, a HfSiON film 3 and a polysilicon layer 4 are formed through the steps shown in FIGS. 1A to 1I (FIG. 8A), and then, a Ni film 9 and a TiN film 10 are successively formed on the polysilicon layer 4 by sputtering method. That is, the Ni film 9, which is a first metal containing layer, is formed on the gate electrode layers (polysilicon layers 4) in the p-type MOSFET region and the n-type MOSFET region, and the TiN film 10, which is a second metal containing layer for preventing diffusion of the metal (Ni) contained in the first metal containing layer, is formed on the first metal containing layer.

As in the First embodiment, instead of Ni, the first metal containing layer may contain any of Co, Pt, Ti, Hf, Zr, Al and La or an alloy containing any of Ni, Co, Pt, Ti, Hf, Zr, Al and La.

As in the First embodiment, instead of TiN, the second metal containing layer may contain any of W, WN, TaN, HfN, ZrN, TaC and MoN or an alloy containing any of TiN, W, WN, TaN, HfN, ZrN, TaC and MoN.

Then, a SiN film 11 is formed on the TiN film 10 by PCVD, for example. That is, the SiN film 11, which serves as a protective film, is formed on the TiN film 10, which is the second metal containing layer.

Then, the upper surface of the SiN film 11 in the p-type MOSFET region is covered with a resist 12 by photolithography, and the upper surface of the SiN film 11 in the n-type MOSFET region is exposed (FIG. 8B).

Then, the SiN film 11 in the n-type MOSFET region is selectively removed by RIE using the resist 12 as a mask (FIG. 8C).

As in the First embodiment, instead of SiN, which is resistant to a mixture of sulfuric acid and hydrogen peroxide, the protective film may be made of SiON, GeN, GeON, a mixture thereof, or any of HfSiON, ZrSiON, SiBN, TiSiON and AlSiON, which are also resistant to a mixture of sulfuric acid and hydrogen peroxide.

Figure 8A:
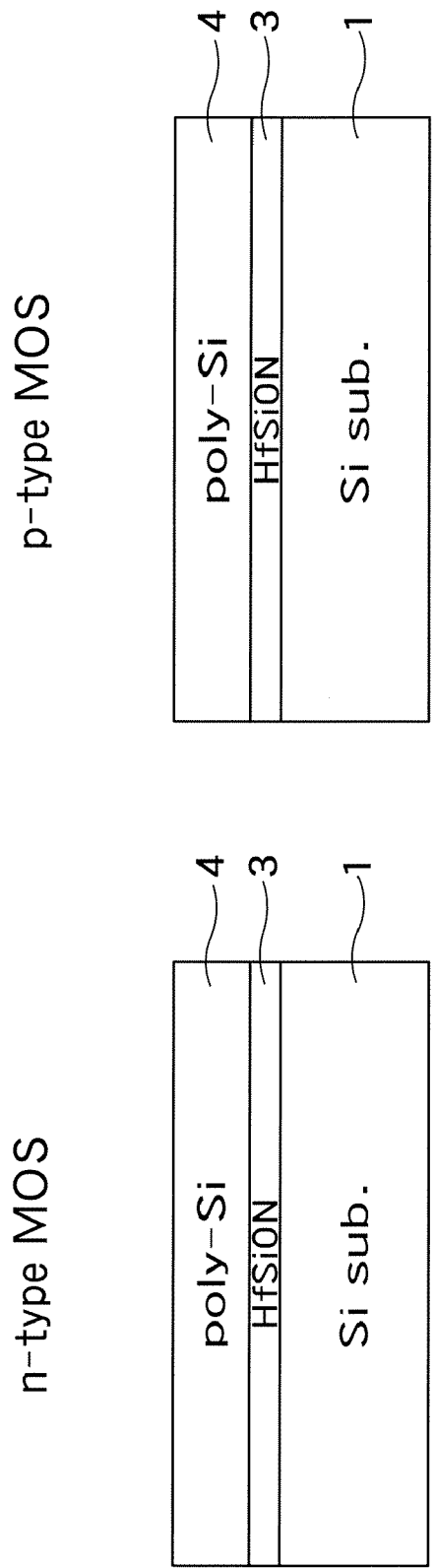
FIG. 8A is a cross-sectional view of essential parts of a p-type MOSFET region and an n-type MOSFET region (gate electrode regions) in a step of the method of manufacturing a semiconductor device according to a sixth embodiment of the present invention.
Figure 8D:
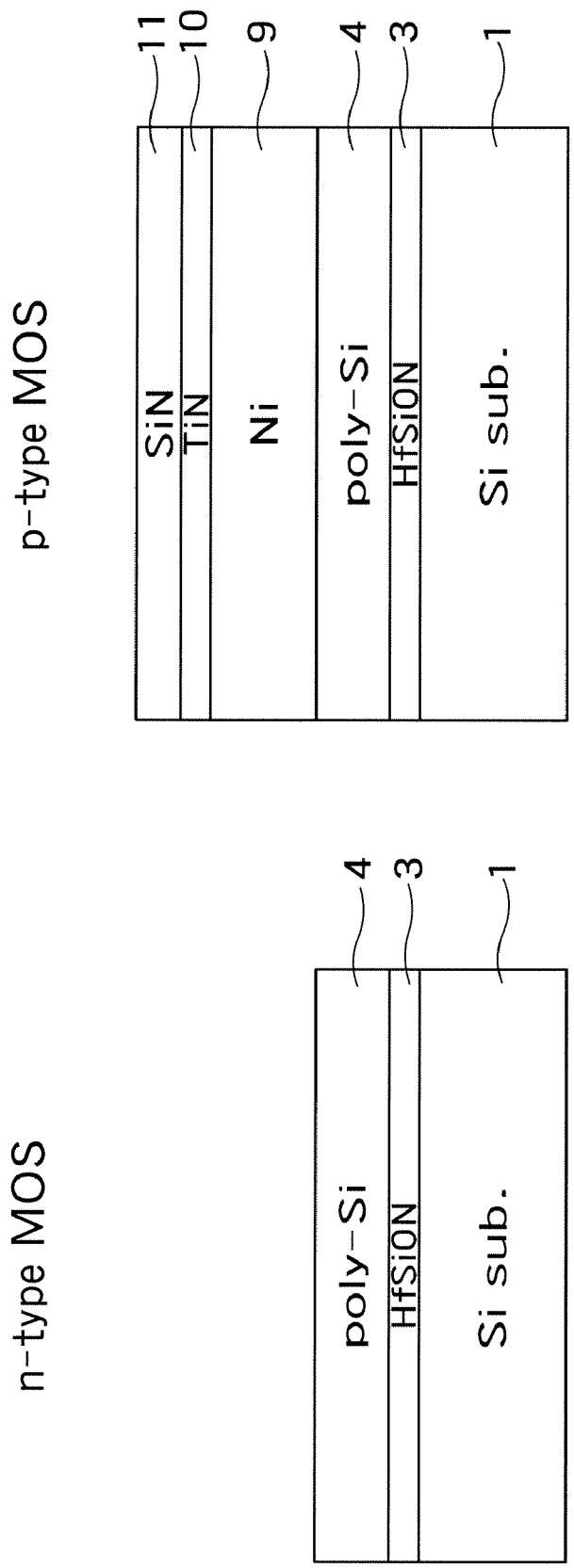
FIG. 8D is a cross-sectional view of essential parts of a p-type MOSFET region and an n-type MOSFET region (gate electrode regions) in a step of the method of manufacturing a semiconductor device according to the sixth embodiment of the present invention.

Then, the TiN film 10 and the Ni film 9 in the n-type MOSFET region and the resist 12 in the p-type MOSFET region are removed by a mixture of sulfuric acid and hydrogen peroxide (FIG. 8D). As a result, the upper surface of the polysilicon layer 4 in the n-type MOSFET region is exposed.

That is, using the remaining protective film (SiN film 11) as a mask, the first metal containing layer (Ni film 9) and the second metal containing layer (TiN film 10) in the region from which the protective film is selectively removed (n-type MOSFET region) are selectively removed with a mixture of sulfuric acid and hydrogen peroxide.

As in the First embodiment, since the protective film (SiN film 11) is resistant to the mixture of sulfuric acid and hydrogen peroxide, the mixture of sulfuric acid and hydrogen peroxide can be used as an etchant. Compared with a case of using a mixture of hydrochloric acid an hydrogen peroxide, for example, the first metal containing layer (Ni film 9) and the second metal containing layer (TiN film 10) can be removed easily.

Figure 8E:
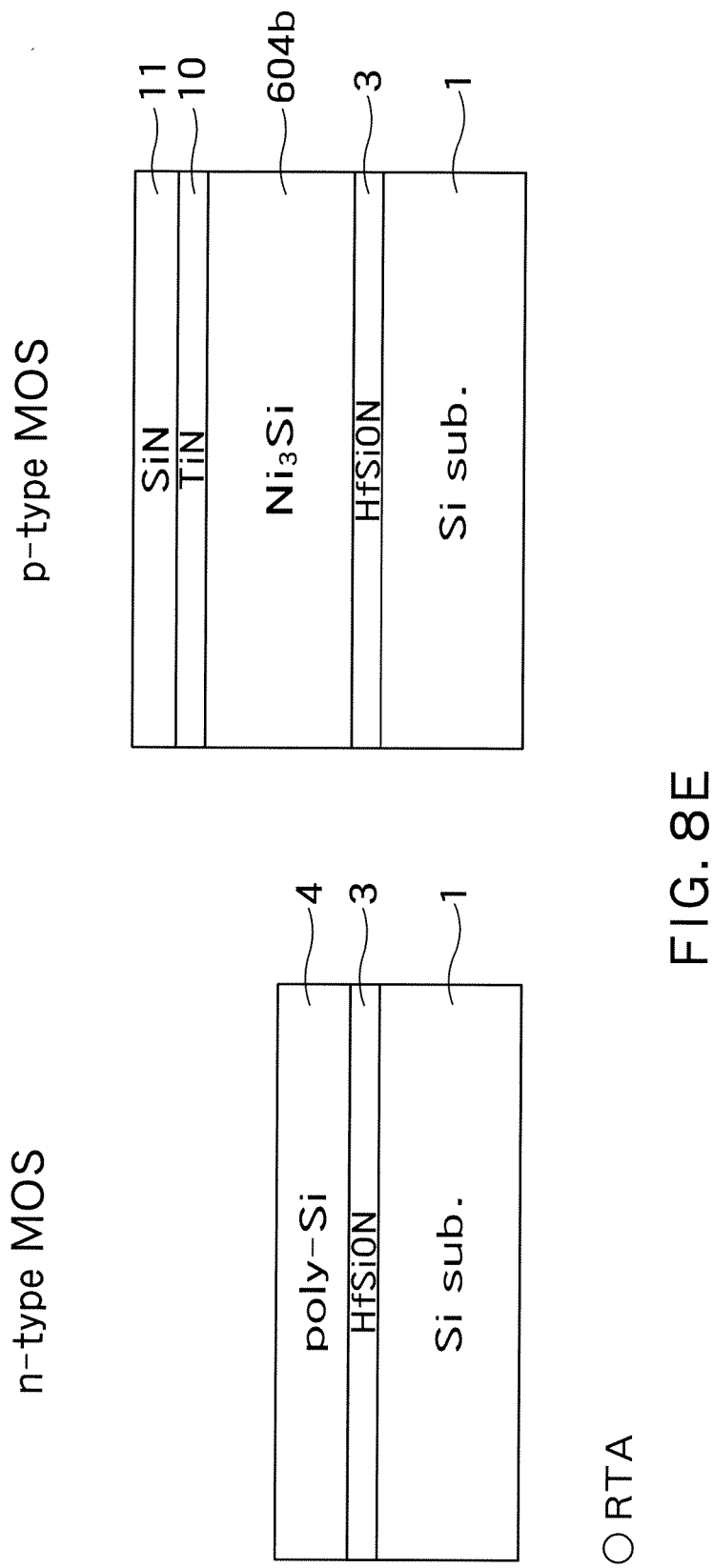
FIG. 8E is a cross-sectional view of essential parts of a p-type MOSFET region and an n-type MOSFET region (gate electrode regions) in a step of the method of manufacturing a semiconductor device according to the sixth embodiment of the present invention.

Then, a first RTA is performed at a temperature of 520 degrees C. for 30 seconds, for example, thereby converting the polysilicon layer 4 in the p-type MOSFET region into a silicide (alloy). Thus, a $Ni_3Si$ layer 604b is formed as a gate electrode of the p-type MOSFET (FIG. 8E).

Then, a Ni film 613 are formed by sputtering method on the SiN film 11 in the p-type MOSFET region and the polysilicon layer 4 in the n-type MOSFET region (FIG. 8F).

In this embodiment, a third metal containing layer (Ni film 613) is formed in such a manner that the ratio of the thickness of the first metal containing layer (Ni film 9) to the thickness of the third metal containing layer (Ni film 613) is two to three.

As in the First embodiment, instead of Ni, the third metal containing layer may contain any of Co, Pt, Ti, Hf, Zr, Al and La or an alloy containing any of Ni, Co, Pt, Ti, Hf, Zr, Al and La.

If the metal or alloy contained in the third metal containing layer is different from that contained in the first metal containing layer, the third metal containing layer can have a thickness equal to that of the first metal containing layer.

Figure 8G:
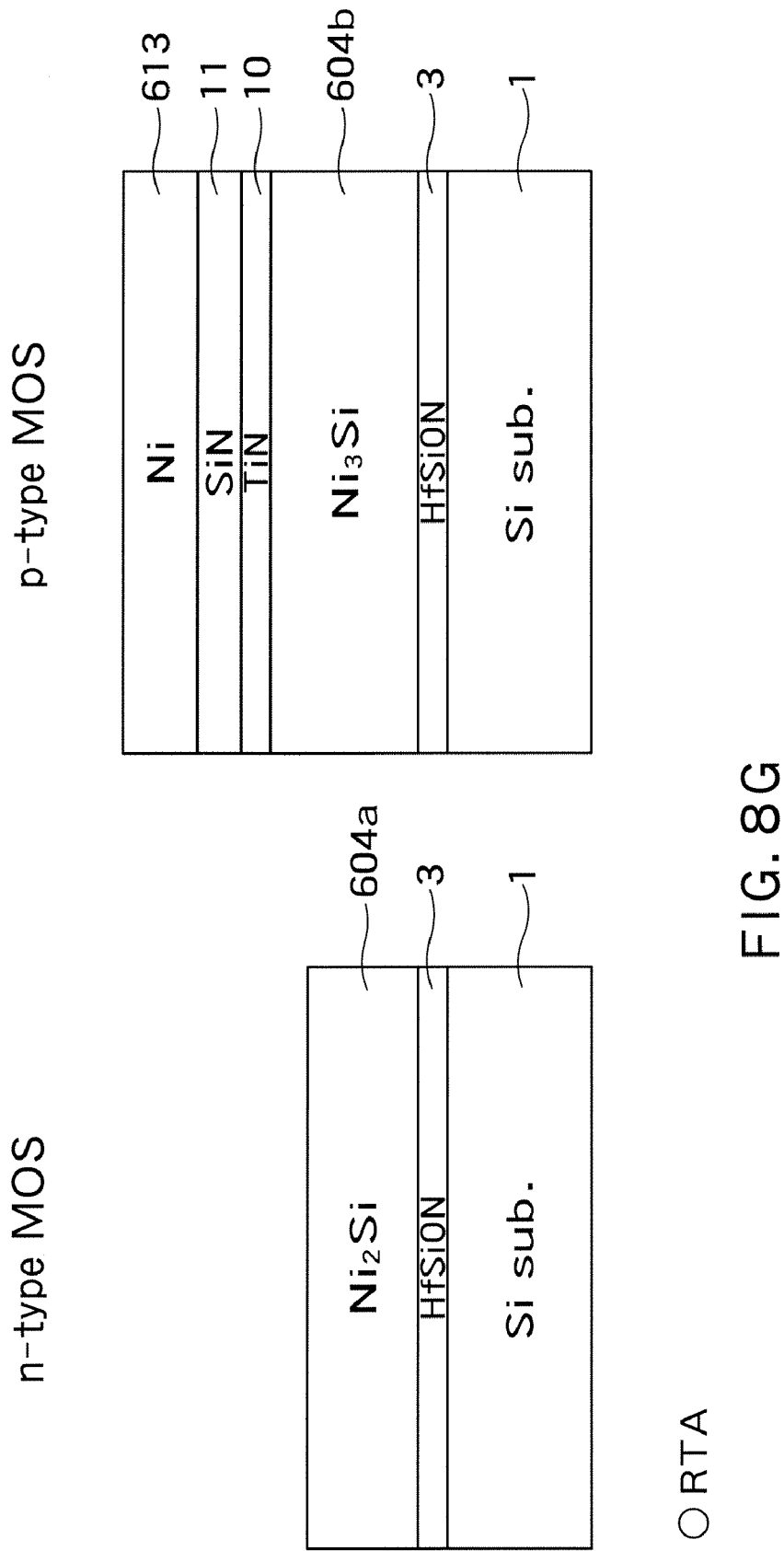
FIG. 8G is a cross-sectional view of essential parts of a p-type MOSFET region and an n-type MOSFET region (gate electrode regions) in a step of the method of manufacturing a semiconductor device according to the sixth embodiment of the present invention.

Then, a second RTA is performed at a temperature of 500 degrees C. for 30 seconds, for example, thereby converting the polysilicon layer 4 in the n-type MOSFET region into a silicide (alloy). Thus, a $Ni_2Si$ layer 604a as a gate electrode of the n-type MOSFET (FIG. 8G).

Figure 8H:
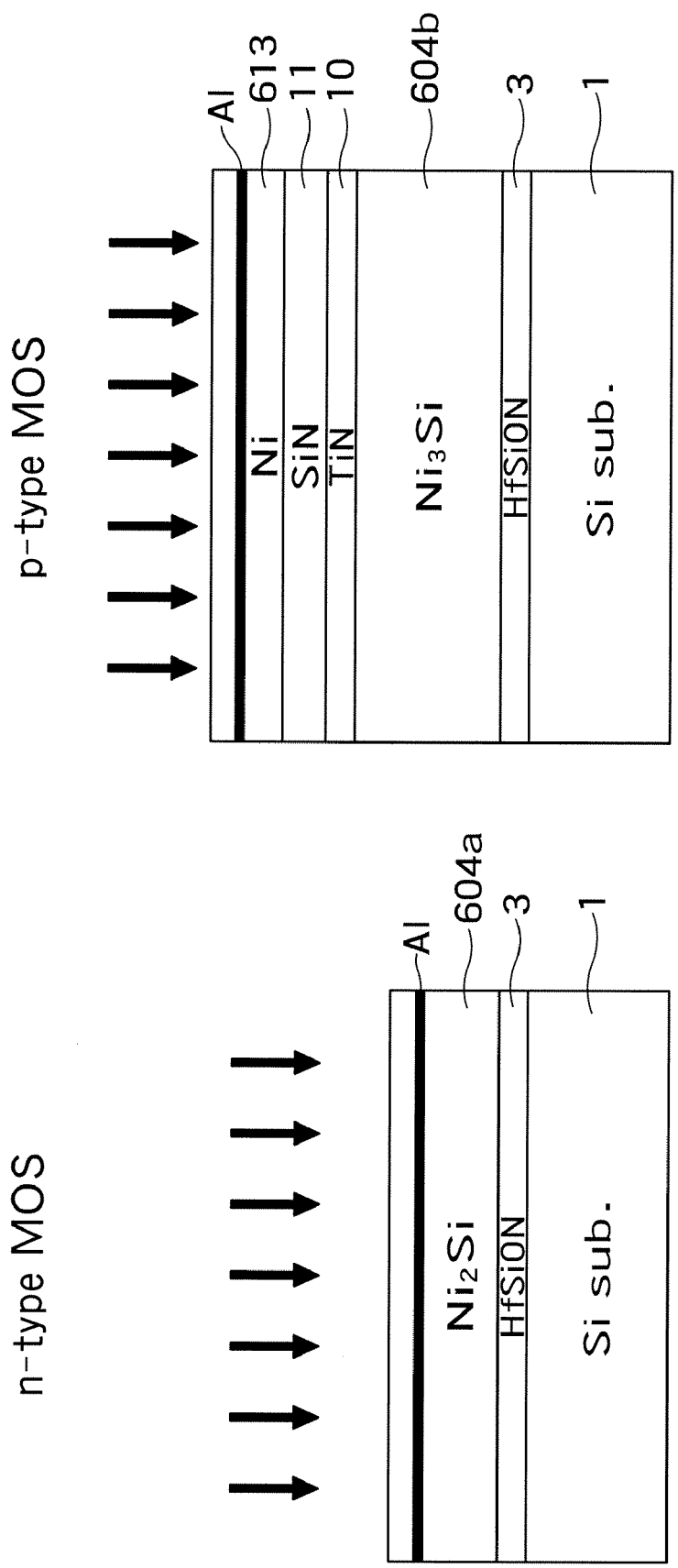
FIG. 8H is a cross-sectional view of essential parts of a p-type MOSFET region and an n-type MOSFET region (gate electrode regions) in a step of the method of manufacturing a semiconductor device according to the sixth embodiment of the present invention.

Then, Al is ion-implanted into the $Ni_2Si$ layer 604a, which is the gate electrode alloy layer of the n-type MOSFET region, with projection range (Rp) of 10 nm to 20 nm, for example (FIG. 8H). Instead of Al, a metal selected from among Ni, Co, Pt, Ti, Hf, Zr, Y, La, Ta, In, Ga, TI and W can be ion-implanted.

Then, the Ni film 613 in the p-type MOSFET region is removed by a mixture of sulfuric acid and hydrogen peroxide (FIG. 8I).

Then, a third RTA is performed at a temperature of 500 degrees C. for 30 seconds, thereby causing segregation to make Al ion-implanted into the $Ni_2Si$ layer 604a diffuse to the interface between the HfSiON film 3 and the $Ni_2Si$ film 604a (in other words, the interface between the gate insulating film and the gate electrode) (FIG. 8J). The first to third RTAs can be performed at different temperatures for different lengths of time in different kinds of atmosphere.

Since the Ni film 9 and the Ni film 613 have different thicknesses as described above, and the RTAs are performed at different temperatures, the resulting silicides have different compositions. In this way, as in the First embodiment, the gate electrode of the n-type MOSFET region and the gate electrode of the p-type MOSFET region have different compositions.

Since silicidation of the n-type MOSFET and the p-type MOSFET can be performed at different temperatures for different lengths of time in different kinds of atmosphere as described above, the silicidation can be performed under more appropriate conditions than in the First embodiment.

The process of installing wiring of the n-type MOSFET and the p-type MOSFET having the gate electrodes formed as described above to complete an LSI is the same as that according to the First embodiment shown in FIGS. 3A to 3D. The step shown in FIG. 3A corresponds to the step shown in FIG. 8J.

As described above, according to the method of manufacturing a semiconductor device according to this embodiment, the p-type MOSFET and the n-type MOSFET can have different desired thresholds.

What is claimed is:

1. A method of manufacturing a semiconductor device having a MOSFET of a first conductivity type and a MOSFET of a second conductivity type different from the first conductivity type formed on a semiconductor substrate, the method comprising:

forming a gate insulating film composed of a high dielectric insulating film on said semiconductor substrate;

forming a first gate electrode layer containing at least one of Si and Ge on said gate insulating film in a gate electrode region, in which a gate electrode of said MOSFET of said first conductivity type is to be formed, and forming a second gate electrode layer having the same composition as said first gate electrode layer on said gate insulating film in a gate electrode region, in which a gate electrode of said MOSFET of said second conductivity type is to be formed;

forming a first metal containing layer on said first gate electrode layer and said second gate electrode layer;

forming a second metal containing layer for preventing diffusion of a metal on said first metal containing layer;

forming a protective film on said second metal containing layer;

selectively removing the protective film disposed above said second gate electrode layer of said MOSFET of said second conductivity type;

selectively removing said first metal containing layer and said second metal containing layer in the region from which said protective film is selectively removed using the remaining protective film as a mask;

forming a third metal containing layer on said second gate electrode layer from which said first metal containing layer and said second metal containing layer are selectively removed, the third metal containing layer having a thickness different from the thickness of said first metal containing layer in a case where the third metal containing layer contains the same metal or alloy as the metal or alloy contained in said first metal containing layer; and performing a thermal processing, thereby causing reaction between the metal contained in said first metal containing layer and said first gate electrode layer to convert said first gate electrode layer into an alloy and causing reaction between the metal contained in said third metal containing layer and said second gate electrode layer to convert said second gate electrode layer into an alloy, thereby forming gate electrodes of different compositions.

2. The method of manufacturing a semiconductor device according to claim 1, wherein said first metal containing layer contains any of Ni, Co, Pt, Ti, Hf, Zr, Al and La or an alloy containing any of Ni, Co, Pt, Ti, Hf, Zr, Al and La, said second metal containing layer contains any of TiN, W, WN, TaN, HfN, ZrN, TaC and MoN or an alloy containing any of TiN, W, WN, TaN, HfN, ZrN, TaC and MoN, said third metal containing layer contains any of Ni, Co, Pt, Ti, Hf, Zr, Al and La or an alloy containing any of Ni, Co, Pt, Ti, Hf, Zr, Al and La, and said protective film is made of SiN, SiON, GeN or GeON, a mixture thereof, or any of HfSiON, ZrSiON, SiBN, TiSiON and AlSiON.

3. The method of manufacturing a semiconductor device according to claim 1, wherein said first metal containing layer and said second metal containing layer in the region from which said protective film is selectively removed are selectively removed with a mixture of sulfuric acid and hydrogen peroxide using the remaining protective film as a mask.

4. The method of manufacturing a semiconductor device according to claim 1, wherein at least one of Ni, Co, Pt, Ti, Hf, Zr, Al, Y, La, Ta, In, Ga, Tl and W is ion-implanted into said second gate electrode converted into an alloy, and a thermal processing is performed to make the metal diffuse into said second gate electrode layer.

5. The method of manufacturing a semiconductor device according to claim 1, wherein after a metal layer made of Ti is formed on said second gate electrode layer, said third metal containing layer made of Ni is formed, and a thermal processing is performed to cause reaction between Ni contained in said third metal containing layer and said second gate electrode layer to convert said second gate electrode layer into an alloy.

6. The method of manufacturing a semiconductor device according to claim 1, wherein said first gate electrode layer and said second gate electrode layer are made of polysilicon, said first metal containing layer is made of Ni, said second metal containing layer is made of TiN, said third metal containing layer is made of Ni and has a thickness smaller than the thickness of said first metal containing layer, silicidation of Ni in said first metal containing layer and said first gate electrode layer is caused to form $Ni_{X1}Si_{Y1}$, and silicidation of Ni in said third metal containing layer and said second gate electrode layer is caused to form $Ni_{X2}Si_{Y2}$ (the coefficients are related according to X1/Y1>X2/Y2), and Al is ion-implanted into said second gate electrode layer converted into a silicide, and a thermal processing is performed to make the Al diffuse to the interface between said gate insulating film and said second gate electrode layer.

7. The method of manufacturing a semiconductor device according to claim 2, wherein at least one of Ni, Co, Pt, Ti, Hf, Zr, Al, Y, La, Ta, In, Ga, Tl and W is ion-implanted into said second gate electrode converted into an alloy, and a thermal processing is performed to make the metal diffuse into said second gate electrode layer.

8. The method of manufacturing a semiconductor device according to claim 2, wherein said first metal containing layer and said second metal containing layer in the region from which said protective film is selectively removed are selectively removed with a mixture of sulfuric acid and hydrogen peroxide using the remaining protective film as a mask.

9. The method of manufacturing a semiconductor device according to claim 3, wherein at least one of Ni, Co, Pt, Ti, Hf, Zr, Al, Y, La, Ta, In, Ga, Tl and W is ion-implanted into said second gate electrode converted into an alloy, and a thermal processing is performed to make the metal diffuse into said second gate electrode layer.

10. The method of manufacturing a semiconductor device according to claim 8, wherein at least one of Ni, Co, Pt, Ti, Hf, Zr, Al, Y, La, Ta, In, Ga, Tl and W is ion-implanted into said second gate electrode converted into an alloy, and a thermal processing is performed to make the metal diffuse into said second gate electrode layer.

* * * * *